(12) United States Patent
Yamada et al.

(10) Patent No.: US 12,532,659 B2
(45) Date of Patent: Jan. 20, 2026

(54) ORGANIC ELECTROLUMINESCENCE DEVICE AND ELECTRONIC APPARATUS

(71) Applicant: IDEMITSU KOSAN CO., LTD., Tokyo (JP)

(72) Inventors: Keitaro Yamada, Sodegaura (JP); Masato Nakamura, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 1038 days.

(21) Appl. No.: 17/580,232

(22) Filed: Jan. 20, 2022

(65) Prior Publication Data

US 2022/0238814 A1    Jul. 28, 2022

(30) Foreign Application Priority Data

Jan. 22, 2021   (JP) .................. 2021-008533

(51) Int. Cl.
| | | |
|---|---|---|
| *H01L 51/00* | (2006.01) | |
| *H10K 85/40* | (2023.01) | |
| *H10K 85/60* | (2023.01) | |
| *H10K 50/15* | (2023.01) | |
| *H10K 50/17* | (2023.01) | |

(52) U.S. Cl.
CPC .......... *H10K 85/623* (2023.02); *H10K 85/40* (2023.02); *H10K 85/624* (2023.02); *H10K 85/626* (2023.02); *H10K 85/633* (2023.02); *H10K 85/636* (2023.02); *H10K 85/6572* (2023.02); *H10K 85/6574* (2023.02); *H10K 85/6576* (2023.02); *H10K 50/15* (2023.02); *H10K 50/17* (2023.02)

(58) Field of Classification Search
None
See application file for complete search history.

(56) References Cited

U.S. PATENT DOCUMENTS

| | | | |
|---|---|---|---|
| 2018/0337352 A1* | 11/2018 | Furno | .............. H10K 85/636 |
| 2020/0203651 A1 | 6/2020 | Duan et al. | |

FOREIGN PATENT DOCUMENTS

| | | | |
|---|---|---|---|
| CN | 108774515 A | * | 11/2018 |
| JP | 2004-14366 A | * | 1/2004 |
| JP | 2004014366 A | * | 1/2004 |
| KR | 20180082536 A | * | 7/2018 |
| WO | WO-2018/164265 A1 | | 9/2018 |

\* cited by examiner

*Primary Examiner* — Tae H Yoon
(74) *Attorney, Agent, or Firm* — Foley & Lardner LLP

(57) ABSTRACT

An organic electroluminescence device, comprising: a cathode, an anode, an emitting layer disposed between the cathode and the anode, and a hole-transporting zone disposed between the anode and the emitting layer, wherein the hole-transporting zone contains a first layer and a second layer in this order from the anode side, the first layer contains a compound represented by the following formula (1), and the first layer has a thickness of 0.10 to 3.00 nm.

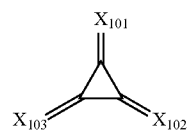

(1)

21 Claims, 1 Drawing Sheet

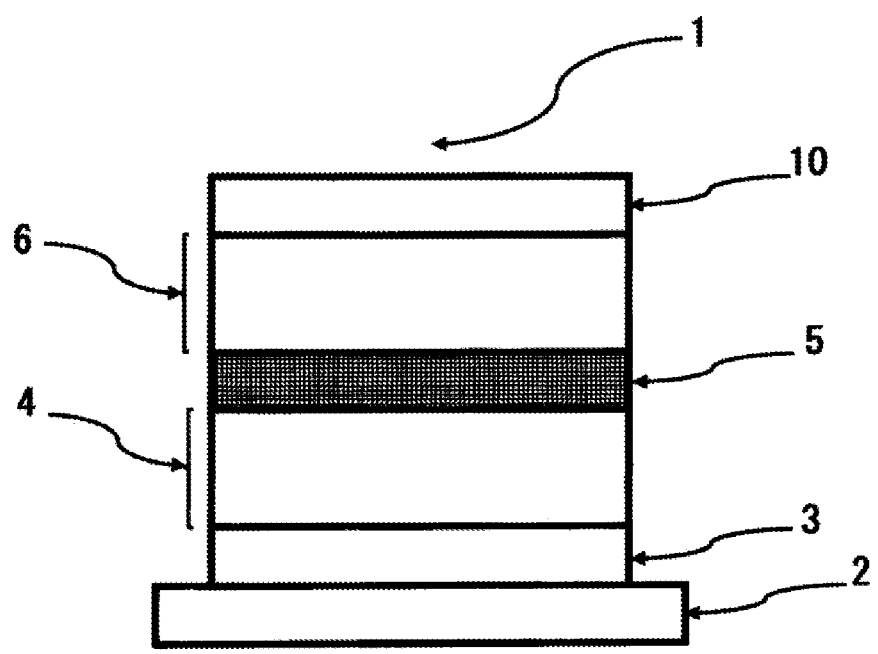

ORGANIC ELECTROLUMINESCENCE DEVICE AND ELECTRONIC APPARATUS

This application claims priority to Japanese Patent Application No. 2021-008533 filed Jan. 22, 2021.

TECHNICAL FIELD

Embodiments described herein generally relate to novel organic electroluminescence device and electronic apparatus.

BACKGROUND ART

When voltage is applied to an organic electroluminescence device (hereinafter, also referred to as an organic EL device), holes and electrons are injected into an emitting layer from an anode and a cathode, respectively. Then, thus injected holes and electrons are recombined in the emitting layer, and excitons are formed therein.

The device performance of the conventional organic EL device was still not sufficient. Although the improvement of the material used for the organic EL device is progressing gradually in order to raise the device performance, further performance enhancement is required.

In order to enhance the performance of a device, various layer configurations have been studied, and for example, Patent Documents 1 and 2 disclose organic EL devices containing a specific amine compound in a hole-transporting zone.

RELATED ART DOCUMENTS

Patent Documents

[Patent Document 1] US 2020/0203651 A1
[Patent Document 2] WO 2018/164265 A1

SUMMARY OF THE INVENTION

However, there is still room for improvement in the driving voltage and the like of the conventional organic EL device.

It is an object of the invention to provide an organic EL device having a low driving voltage and capable of suppressing lateral leakage.

According to the invention, the following organic EL device and the like are provided.

An organic electroluminescence device comprising:
a cathode,
an anode,
an emitting layer disposed between the cathode and the anode, and
a hole-transporting zone disposed between the anode and the emitting layer, wherein
the hole-transporting zone comprises a first layer and a second layer in this order from the anode side,
the first layer comprises a compound represented by the following formula (1), and
the first layer has a thickness of 0.10 to 3.00 nm:

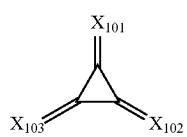

(1)

wherein in the formula (1),
$X_{101}$ to $X_{103}$ are independently a divalent group represented by the following formula (1A):

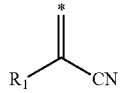

(1A)

wherein in the formula (1A), * represents a bonding site;
$R_1$ is
a substituted or unsubstituted aryl group including 6 to 50 ring carbon atoms, or
a substituted or unsubstituted monovalent heterocyclic group including 5 to 50 ring atoms; and
when two or more $R_1$'s are present, the two or more $R_1$'s may be the same as or different from each other.

According to the invention, an organic EL device having a low driving voltage and capable of suppressing lateral leakage can be provided.

BRIEF DESCRIPTION OF THE DRAWINGS

The FIGURE is a diagram showing a schematic configuration of an aspect of an organic EL device according to an aspect of the invention.

MODE FOR CARRYING OUT THE INVENTION

Definition

In this specification, a hydrogen atom includes its isotopes different in the number of neutrons, namely, a protium, a deuterium and a tritium.

In this specification, at a bondable position in a chemical formula where a symbol such as "R", or "D" representing a deuterium atom is not indicated, a hydrogen atom, that is, a protium atom, a deuterium atom or a tritium atom is bonded.

In this specification, the number of ring carbon atoms represents the number of carbon atoms forming a subject ring itself among the carbon atoms of a compound having a structure in which atoms are bonded in a ring form (for example, a monocyclic compound, a fused ring compound, a cross-linked compound, a carbocyclic compound, or a heterocyclic compound). When the subject ring is substituted by a substituent, the carbon contained in the substituent is not included in the number of ring carbon atoms. The same shall apply to "the number of ring carbon atoms" described below, unless otherwise specified. For example, a benzene ring has 6 ring carbon atoms, a naphthalene ring includes 10 ring carbon atoms, a pyridine ring includes 5 ring carbon atoms, and a furan ring includes 4 ring carbon atoms. Further, for example, a 9,9-diphenylfluorenyl group includes 13 ring carbon atoms, and a 9,9'-spirobifluorenyl group includes 25 ring carbon atoms.

When a benzene ring is substituted by, for example, an alkyl group as a substituent, the number of carbon atoms of the alkyl group is not included in the number of ring carbon atoms of the benzene ring. Therefore, the number of ring carbon atoms of the benzene ring substituted by the alkyl group is 6. When a naphthalene ring is substituted by, for example, an alkyl group as a substituent, the number of carbon atoms of the alkyl group is not included in the number of ring carbon atoms of the naphthalene ring.

Therefore, the number of ring carbon atoms of the naphthalene ring substituted by the alkyl group is 10.

In this specification, the number of ring atoms represents the number of atoms forming a subject ring itself among the atoms of a compound having a structure in which atoms are bonded in a ring form (for example, the structure includes a monocyclic ring, a fused ring and a ring assembly) (for example, a monocyclic compound, a fused ring compound, a cross-linked compound, a carbocyclic compound and a heterocyclic compound). The number of ring atoms does not include atoms which do not form the ring (for example, a hydrogen atom which terminates a bond of the atoms forming the ring), or atoms contained in a substituent when the ring is substituted by the substituent. The same shall apply to "the number of ring atoms" described below, unless otherwise specified. For example, the number of atoms of a pyridine ring is 6, the number of atoms of a quinazoline ring is 10, and the number of a furan ring is 5. For example, hydrogen atoms bonded to a pyridine ring and atoms constituting a substituent substituted on the pyridine ring are not included in the number of ring atoms of the pyridine ring. Therefore, the number of ring atoms of a pyridine ring with which a hydrogen atom or a substituent is bonded is 6. For example, hydrogen atoms and atoms constituting a substituent which are bonded with a quinazoline ring is not included in the number of ring atoms of the quinazoline ring. Therefore, the number of ring atoms of a quinazoline ring with which a hydrogen atom or a substituent is bonded is 10.

In this specification, "XX to YY carbon atoms" in the expression "a substituted or unsubstituted ZZ group including XX to YY carbon atoms" represents the number of carbon atoms in the case where the ZZ group is unsubstituted by a substituent, and does not include the number of carbon atoms of a substituent in the case where the ZZ group is substituted by the substituent. Here, "YY" is larger than "XX", and "XX" means an integer of 1 or more and "YY" means an integer of 2 or more.

In this specification, "XX to YY atoms" in the expression "a substituted or unsubstituted ZZ group including XX to YY atoms" represents the number of atoms in the case where the ZZ group is unsubstituted by a substituent, and does not include the number of atoms of a substituent in the case where the ZZ group is substituted by the substituent. Here, "YY" is larger than "XX", and "XX" means an integer of 1 or more and "YY" means an integer of 2 or more.

In this specification, the unsubstituted ZZ group represents the case where the "substituted or unsubstituted ZZ group" is a "ZZ group unsubstituted by a substituent", and the substituted ZZ group represents the case where the "substituted or unsubstituted ZZ group" is a "ZZ group substituted by a substituent".

In this specification, a term "unsubstituted" in the case of "a substituted or unsubstituted ZZ group" means that hydrogen atoms in the ZZ group are not substituted by a substituent. Hydrogen atoms in a term "unsubstituted ZZ group" are a protium atom, a deuterium atom, or a tritium atom.

In this specification, a term "substituted" in the case of "a substituted or unsubstituted ZZ group" means that one or more hydrogen atoms in the ZZ group are substituted by a substituent. Similarly, a term "substituted" in the case of "a BB group substituted by an AA group" means that one or more hydrogen atoms in the BB group are substituted by the AA group.

"Substituent as Described in this Specification"

Hereinafter, the substituent described in this specification will be explained.

The number of ring carbon atoms of the "unsubstituted aryl group" described in this specification is 6 to 50, preferably 6 to 30, and more preferably 6 to 18, unless otherwise specified.

The number of ring atoms of the "unsubstituted heterocyclic group" described in this specification is 5 to 50, preferably 5 to 30, and more preferably 5 to 18, unless otherwise specified.

The number of carbon atoms of the "unsubstituted alkyl group" described in this specification is 1 to 50, preferably 1 to 20, and more preferably 1 to 6, unless otherwise specified.

The number of carbon atoms of the "unsubstituted alkenyl group" described in this specification is 2 to 50, preferably 2 to 20, and more preferably 2 to 6, unless otherwise specified.

The number of carbon atoms of the "unsubstituted alkynyl group" described in this specification is 2 to 50, preferably 2 to 20, and more preferably 2 to 6, unless otherwise specified.

The number of ring carbon atoms of the "unsubstituted cycloalkyl group" described in this specification is 3 to 50, preferably 3 to 20, and more preferably 3 to 6, unless otherwise specified.

The number of ring carbon atoms of the "unsubstituted arylene group" described in this specification is 6 to 50, preferably 6 to 30, and more preferably 6 to 18, unless otherwise specified.

The number of ring atoms of the "unsubstituted divalent heterocyclic group" described in this specification is 5 to 50, preferably 5 to 30, and more preferably 5 to 18, unless otherwise specified.

The number of carbon atoms of the "unsubstituted alkylene group" described in this specification is 1 to 50, preferably 1 to 20, and more preferably 1 to 6, unless otherwise specified.

"Substituted or Unsubstituted Aryl Group"

Specific examples of the "substituted or unsubstituted aryl group" described in this specification (specific example group G1) include the following unsubstituted aryl groups (specific example group G1A), substituted aryl groups (specific example group G1B), and the like. (Here, the unsubstituted aryl group refers to the case where the "substituted or unsubstituted aryl group" is an "aryl group unsubstituted by a substituent", and the substituted aryl group refers to the case where the "substituted or unsubstituted aryl group" is an "aryl group substituted by a substituent"). In this specification, in the case where simply referred as an "aryl group", it includes both a "unsubstituted aryl group" and a "substituted aryl group."

The "substituted aryl group" means a group in which one or more hydrogen atoms of the "unsubstituted aryl group" are substituted by a substituent. Specific examples of the "substituted aryl group" include, for example, groups in which one or more hydrogen atoms of the "unsubstituted aryl group" of the following specific example group G1A are substituted by a substituent, the substituted aryl groups of the following specific example group G1B, and the like. It should be noted that the examples of the "unsubstituted aryl group" and the examples of the "substituted aryl group" enumerated in this specification are mere examples, and the "substituted aryl group" described in this specification also includes a group in which a hydrogen atom bonded with a carbon atom of the aryl group itself in the "substituted aryl group" of the following specific group G1B is further substituted by a substituent, and a group in which a hydrogen atom of a substituent in the "substituted aryl group" of the following specific group G1B is further substituted by a substituent.

Unsubstituted Aryl Group (Specific Example Group G1A):
a phenyl group,
a p-biphenyl group,
a m-biphenyl group,
an o-biphenyl group,
a p-terphenyl-4-yl group,
a p-terphenyl-3-yl group,
a p-terphenyl-2-yl group,
a m-terphenyl-4-yl group,
a m-terphenyl-3-yl group,
a m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group,
a perylenyl group, and
a monovalent aryl group derived by removing one hydrogen atom from the ring structures represented by any of the following general formulas (TEMP-1) to (TEMP-15).

(TEMP-1)

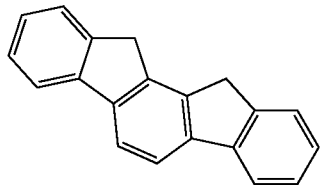

(TEMP-2)

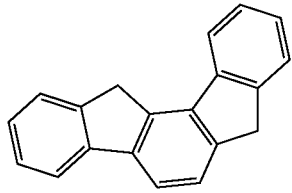

(TEMP-3)

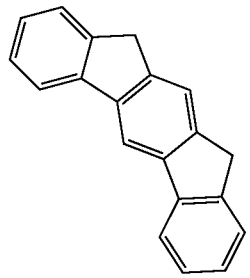

(TEMP-4)

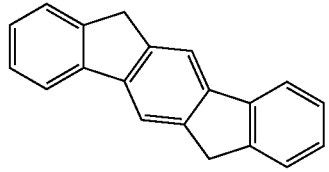

(TEMP-5)

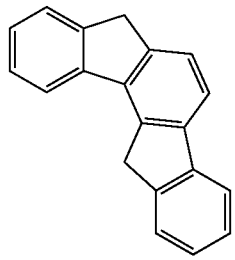

(TEMP-6)

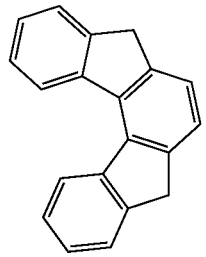

(TEMP-7)

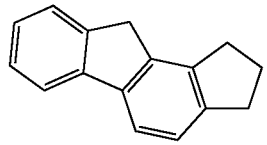

(TEMP-8)

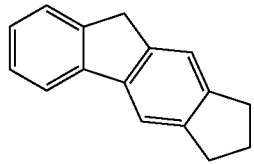

(TEMP-9)

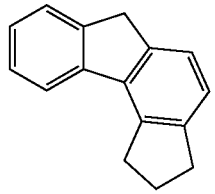

-continued

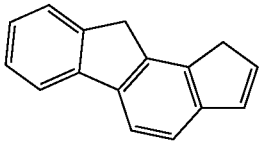
(TEMP-10)

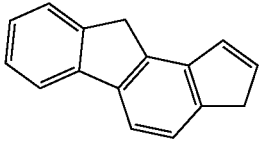
(TEMP-11)

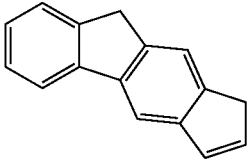
(TEMP-12)

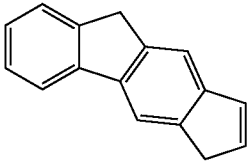
(TEMP-13)

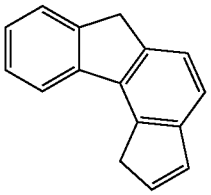
(TEMP-14)

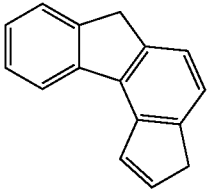
(TEMP-15)

Substituted Aryl Group (Specific Example Group G1B):
an o-tolyl group,
a m-tolyl group,
a p-tolyl group,
a p-xylyl group,
a m-xylyl group,
an o-xylyl group,
a p-isopropylphenyl group,
a m-isopropylphenyl group,
an o-isopropylphenyl group,
a p-t-butylphenyl group,
a m-t-butylphenyl group,
an o-t-butylphenyl group,
a 3,4,5-trimethylphenyl group,
a 9,9-dimethylfluorenyl group,
a 9,9-diphenylfluorenyl group,
a 9,9-bis(4-methylphenyl)fluorenyl group,
a 9,9-bis(4-isopropylphenyl)fluorenyl group,
a 9,9-bis(4-t-butylphenyl)fluorenyl group,
a cyanophenyl group,
a triphenylsilylphenyl group,
a trimethylsilylphenyl group,
a phenylnaphthyl group,
a naphthylphenyl group, and
a group in which one or more hydrogen atoms of a monovalent group derived from the ring structures represented by any of the general formulas (TEMP-1) to (TEMP-15) are substituted by a substituent.

"Substituted or Unsubstituted Heterocyclic Group"

The "heterocyclic group" described in this specification is a ring group having at least one hetero atom in the ring atom. Specific examples of the hetero atom include a nitrogen atom, an oxygen atom, a sulfur atom, a silicon atom, a phosphorus atom, and a boron atom.

The "heterocyclic group" in this specification is a monocyclic group or a fused ring group.

The "heterocyclic group" in this specification is an aromatic heterocyclic group or a non-aromatic heterocyclic group.

Specific examples of the "substituted or unsubstituted heterocyclic group" (specific example group G2) described in this specification include the following unsubstituted heterocyclic group (specific example group G2A), the following substituted heterocyclic group (specific example group G2B), and the like. (Here, the unsubstituted heterocyclic group refers to the case where the "substituted or unsubstituted heterocyclic group" is a "heterocyclic group unsubstituted by a substituent", and the substituted heterocyclic group refers to the case where the "substituted or unsubstituted heterocyclic group" is a "heterocyclic group substituted by a substituent"). In this specification, in the case where simply referred as a "heterocyclic group", it includes both the "unsubstituted heterocyclic group" and the "substituted heterocyclic group."

The "substituted heterocyclic group" means a group in which one or more hydrogen atom of the "unsubstituted heterocyclic group" are substituted by a substituent. Specific examples of the "substituted heterocyclic group" include a group in which a hydrogen atom of "unsubstituted heterocyclic group" of the following specific example group G2A is substituted by a substituent, the substituted heterocyclic groups of the following specific example group G2B, and the like. It should be noted that the examples of the "unsubstituted heterocyclic group" and the examples of the "substituted heterocyclic group" enumerated in this specification are mere examples, and the "substituted heterocyclic group" described in this specification includes groups in which hydrogen atom bonded with a ring atom of the heterocyclic group itself in the "substituted heterocyclic group" of the specific example group G2B is further substituted by a substituent, and a group in which hydrogen atom of a substituent in the "substituted heterocyclic group" of the specific example group G2B is further substituted by a substituent.

Specific example group G2A includes, for example, the following unsubstituted heterocyclic group containing a nitrogen atom (specific example group G2A1), the following unsubstituted heterocyclic group containing an oxygen atom (specific example group G2A2), the following unsubstituted heterocyclic group containing a sulfur atom (specific example group G2A3), and the monovalent heterocyclic group derived by removing one hydrogen atom from the ring structures represented by any of the following general formulas (TEMP-16) to (TEMP-33) (specific example group G2A4).

Specific example group G2B includes, for example, the following substituted heterocyclic group containing a nitrogen atom (specific example group G2B1), the following substituted heterocyclic group containing an oxygen atom (specific example group G2B2), the following substituted heterocyclic group containing a sulfur atom (specific example group G2B3), and the following group in which one or more hydrogen atoms of the monovalent heterocyclic group derived from the ring structures represented by any of the following general formulas (TEMP-16) to (TEMP-33) are substituted by a substituent (specific example group G2B4).

Unsubstituted Heterocyclic Group Containing a Nitrogen Atom (Specific Example Group G2A1):
- a pyrrolyl group,
- an imidazolyl group,
- a pyrazolyl group,
- a triazolyl group,
- a tetrazolyl group,
- an oxazolyl group,
- an isoxazolyl group,
- an oxadiazolyl group,
- a thiazolyl group,
- an isothiazolyl group,
- a thiadiazolyl group,
- a pyridyl group,
- a pyridazinyl group,
- a pyrimidinyl group,
- a pyrazinyl group,
- a triazinyl group,
- an indolyl group,
- an isoindolyl group,
- an indolizinyl group,
- a quinolizinyl group,
- a quinolyl group,
- an isoquinolyl group,
- a cinnolyl group,
- a phthalazinyl group,
- a quinazolinyl group,
- a quinoxalinyl group,
- a benzimidazolyl group,
- an indazolyl group,
- a phenanthrolinyl group,
- a phenanthridinyl group,
- an acridinyl group,
- a phenazinyl group,
- a carbazolyl group,
- a benzocarbazolyl group,
- a morpholino group,
- a phenoxazinyl group,
- a phenothiazinyl group,
- an azacarbazolyl group, and
- a diazacarbazolyl group.

Unsubstituted Heterocyclic Group Containing an Oxygen Atom (Specific Example Group G2A2):
- a furyl group,
- an oxazolyl group,
- an isoxazolyl group,
- an oxadiazolyl group,
- a xanthenyl group,
- a benzofuranyl group,
- an isobenzofuranyl group,
- a dibenzofuranyl group,
- a naphthobenzofuranyl group,
- a benzoxazolyl group,
- a benzisoxazolyl group,
- a phenoxazinyl group,
- a morpholino group,
- a dinaphthofuranyl group,
- an azadibenzofuranyl group,
- a diazadibenzofuranyl group,
- an azanaphthobenzofuranyl group, and
- a diazanaphthobenzofuranyl group.

Unsubstituted Heterocyclic Group Containing a Sulfur Atom (Specific Example Group G2A3):
- a thienyl group,
- a thiazolyl group,
- an isothiazolyl group,
- a thiadiazolyl group,
- a benzothiophenyl group (benzothienyl group),
- an isobenzothiophenyl group (isobenzothienyl group),
- a dibenzothiophenyl group (dibenzothienyl group),
- a naphthobenzothiophenyl group (naphthobenzothienyl group),
- a benzothiazolyl group,
- a benzisothiazolyl group,
- a phenothiazinyl group,
- a dinaphthothiophenyl group (dinaphthothienyl group),
- an azadibenzothiophenyl group (azadibenzothienyl group),
- a diazadibenzothiophenyl group (diazadibenzothienyl group),
- an azanaphthobenzothiophenyl group (azanaphthobenzothienyl group), and
- a diazanaphthobenzothiophenyl group (diazanaphthobenzothienyl group).

Monovalent Heterocyclic Group Derived by Removing One Hydrogen Atom from the Ring Structures Represented by any of the Following General Formulas (TEMP-16) to (TEMP-33) (Specific Example Group G2A4):

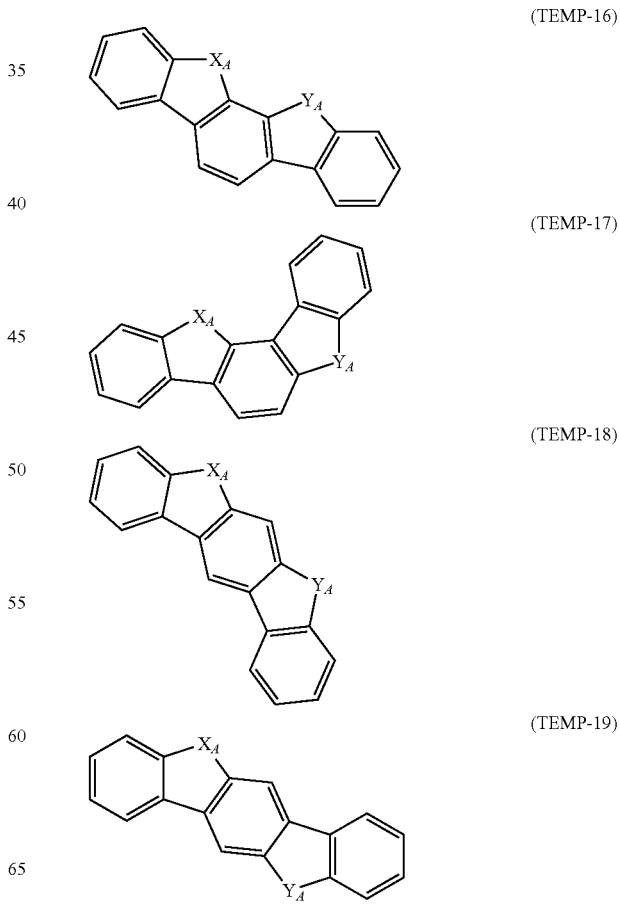

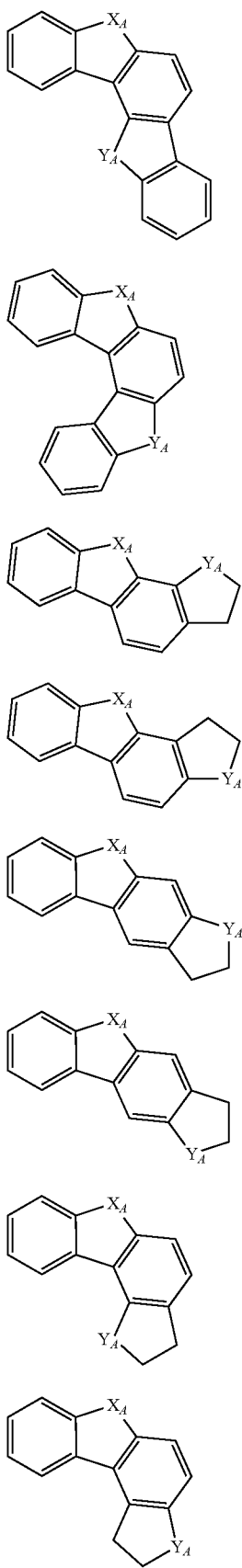
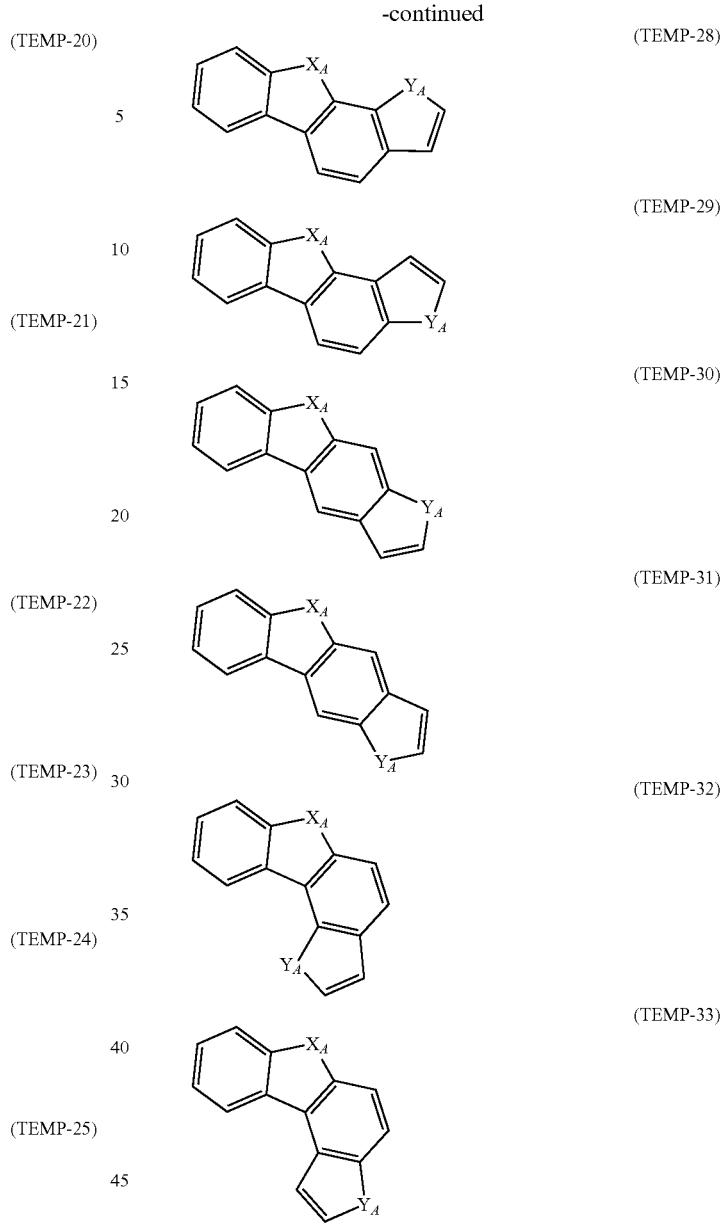

In the general formulas (TEMP-16) to (TEMP-33), $X_A$ and $Y_A$ are independently an oxygen atom, a sulfur atom, NH, or $CH_2$. Provided that at least one of $X_A$ and $Y_A$ is an oxygen atom, a sulfur atom, or NH.

In the general formulas (TEMP-16) to (TEMP-33), when at least one of $X_A$ and $Y_A$ is NH or $CH_2$, the monovalent heterocyclic group derived from the ring structures represented by any of the general formulas (TEMP-16) to (TEMP-33) includes a monovalent group derived by removing one hydrogen atom from these NH or $CH_2$.

Substituted Heterocyclic Group Containing a Nitrogen Atom (Specific Example Group G2B1):
a (9-phenyl)carbazolyl group,
a (9-biphenylyl)carbazolyl group,
a (9-phenyl)phenylcarbazolyl group,
a (9-naphthyl)carbazolyl group,
a diphenylcarbazol-9-yl group,
a phenylcarbazol-9-yl group,
a methylbenzimidazolyl group, an ethylbenzimidazolyl group,
a phenyltriazinyl group,
a biphenylyltriazinyl group,
a diphenyltriazinyl group,
a phenylquinazolinyl group, and
a biphenylylquinazolinyl group.
Substituted Heterocyclic Group Containing an Oxygen Atom (Specific Example Group G2B2):
a phenyldibenzofuranyl group,
a methyldibenzofuranyl group,
a t-butyldibenzofuranyl group, and
a monovalent residue of spiro[9H-xanthene-9,9'-[9H]fluorene].
Substituted Heterocyclic Group Containing a Sulfur Atom (Specific Example Group G2B3):
a phenyldibenzothiophenyl group,
a methyldibenzothiophenyl group,
a t-butyldibenzothiophenyl group, and
a monovalent residue of spiro[9H-thioxanthene-9,9'-[9H]fluorene].

Group in which One or More Hydrogen Atoms of the Monovalent Heterocyclic Group Derived from the Ring Structures Represented by any of the Following General Formulas (TEMP-16) to (TEMP-33) are Substituted by a Substituent (Specific Example Group G2B4):

The "one or more hydrogen atoms of the monovalent heterocyclic group" means one or more hydrogen atoms selected from hydrogen atoms bonded with ring carbon atoms of the monovalent heterocyclic group, a hydrogen atom bonded with a nitrogen atom when at least one of $X_A$ and $Y_A$ is NH, and hydrogen atoms of a methylene group when one of $X_A$ and $Y_A$ is $CH_2$.

"Substituted or Unsubstituted Alkyl Group"

Specific examples of the "substituted or unsubstituted alkyl group" (specific example group G3) described in this specification include the following unsubstituted alkyl groups (specific example group G3A) and the following substituted alkyl groups (specific example group G3B). (Here, the unsubstituted alkyl group refers to the case where the "substituted or unsubstituted alkyl group" is an "alkyl group unsubstituted by a substituent", and the substituted alkyl group refers to the case where the "substituted or unsubstituted alkyl group" is an "alkyl group substituted by a substituent"). In this specification, in the case where simply referred as an "alkyl group" includes both the "unsubstituted alkyl group" and the "substituted alkyl group."

The "substituted alkyl group" means a group in which one or more hydrogen atoms in the "unsubstituted alkyl group" are substituted by a substituent. Specific examples of the "substituted alkyl group" include groups in which one or more hydrogen atoms in the following "unsubstituted alkyl group" (specific example group G3A) are substituted by a substituent, the following substituted alkyl group (specific example group G3B), and the like. In this specification, the alkyl group in the "unsubstituted alkyl group" means a linear alkyl group. Thus, the "unsubstituted alkyl group" includes a straight-chain "unsubstituted alkyl group" and a branched-chain "unsubstituted alkyl group". It should be noted that the examples of the "unsubstituted alkyl group" and the examples of the "substituted alkyl group" enumerated in this specification are mere examples, and the "substituted alkyl group" described in this specification includes a group in which hydrogen atom of the alkyl group itself in the "substituted alkyl group" of the specific example group G3B is further substituted by a substituent, and a group in which hydrogen atom of a substituent in the "substituted alkyl group" of the specific example group G3B is further substituted by a substituent.

Unsubstituted Alkyl Group (Specific Example Group G3A):
a methyl group,
an ethyl group,
a n-propyl group,
an isopropyl group,
a n-butyl group,
an isobutyl group,
a s-butyl group, and
a t-butyl group.

Substituted Alkyl Group (Specific Example Group G3B):
a heptafluoropropyl group (including isomers),
a pentafluoroethyl group,
a 2,2,2-trifluoroethyl group, and
a trifluoromethyl group.

"Substituted or Unsubstituted Alkenyl Group"

Specific examples of the "substituted or unsubstituted alkenyl group" described in this specification (specific example group G4) include the following unsubstituted alkenyl group (specific example group G4A), the following substituted alkenyl group (specific example group G4B), and the like. (Here, the unsubstituted alkenyl group refers to the case where the "substituted or unsubstituted alkenyl group" is a "alkenyl group unsubstituted by a substituent", and the "substituted alkenyl group" refers to the case where the "substituted or unsubstituted alkenyl group" is a "alkenyl group substituted by a substituent."). In this specification, in the case where simply referred as an "alkenyl group" includes both the "unsubstituted alkenyl group" and the "substituted alkenyl group."

The "substituted alkenyl group" means a group in which one or more hydrogen atoms in the "unsubstituted alkenyl group" are substituted by a substituent. Specific examples of the "substituted alkenyl group" include a group in which the following "unsubstituted alkenyl group" (specific example group G4A) has a substituent, the following substituted alkenyl group (specific example group G4B), and the like. It should be noted that the examples of the "unsubstituted alkenyl group" and the examples of the "substituted alkenyl group" enumerated in this specification are mere examples, and the "substituted alkenyl group" described in this specification includes a group in which a hydrogen atom of the alkenyl group itself in the "substituted alkenyl group" of the specific example group G4B is further substituted by a substituent, and a group in which a hydrogen atom of a substituent in the "substituted alkenyl group" of the specific example group G4B is further substituted by a substituent.

Unsubstituted Alkenyl Group (Specific Example Group G4A):
a vinyl group,
an allyl group,
a 1-butenyl group,
a 2-butenyl group, and
a 3-butenyl group.

Substituted Alkenyl Group (Specific Example Group G4B):
a 1,3-butanedienyl group,
a 1-methylvinyl group,
a 1-methylallyl group,
a 1,1-dimethylallyl group,
a 2-methylally group, and
a 1,2-dimethylallyl group.

"Substituted or Unsubstituted Alkynyl Group"

Specific examples of the "substituted or unsubstituted alkynyl group" described in this specification (specific example group G5) include the following unsubstituted alkynyl group (specific example group G5A) and the like. (Here, the unsubstituted alkynyl group refers to the case where the "substituted or unsubstituted alkynyl group" is an "alkynyl group unsubstituted by a substituent"). In this specification, in the case where simply referred as an "alkynyl group" includes both the "unsubstituted alkynyl group" and the "substituted alkynyl group."

The "substituted alkynyl group" means a group in which one or more hydrogen atoms in the "unsubstituted alkynyl group" are substituted by a substituent. Specific examples of the "substituted alkynyl group" include a group in which one or more hydrogen atoms in the following "unsubstituted alkynyl group" (specific example group G5A) are substituted by a substituent, and the like.

Unsubstituted Alkynyl Group (Specific Example Group G5A):

an ethynyl group.

"Substituted or Unsubstituted Cycloalkyl Group"

Specific examples of the "substituted or unsubstituted cycloalkyl group" described in this specification (specific example group G6) include the following unsubstituted cycloalkyl group (specific example group G6A), the following substituted cycloalkyl group (specific example group G6B), and the like. (Here, the unsubstituted cycloalkyl group refers to the case where the "substituted or unsubstituted cycloalkyl group" is a "cycloalkyl group unsubstituted by a substituent", and the substituted cycloalkyl group refers to the case where the "substituted or unsubstituted cycloalkyl group" is a "cycloalkyl group substituted by a substituent"). In this specification, in the case where simply referred as a "cycloalkyl group" includes both the "unsubstituted cycloalkyl group" and the "substituted cycloalkyl group."

The "substituted cycloalkyl group" means a group in which one or more hydrogen atoms in the "unsubstituted cycloalkyl group" are substituted by a substituent. Specific examples of the "substituted cycloalkyl group" include a group in which one or more hydrogen atoms in the following "unsubstituted cycloalkyl group" (specific example group G6A) are substituted by a substituent, and examples of the following substituted cycloalkyl group (specific example group G6B), and the like. It should be noted that the examples of the "unsubstituted cycloalkyl group" and the examples of the "substituted cycloalkyl group" enumerated in this specification are mere examples, and the "substituted cycloalkyl group" in this specification includes a group in which one or more hydrogen atoms bonded with the carbon atom of the cycloalkyl group itself in the "substituted cycloalkyl group" of the specific example group G6B are substituted by a substituent, and a group in which a hydrogen atom of a substituent in the "substituted cycloalkyl group" of specific example group G6B is further substituted by a substituent.

Unsubstituted Cycloalkyl Group (Specific Example Group G6A):

a cyclopropyl group, a cyclobutyl group, a cyclopentyl group, a cyclohexyl group, a 1-adamantyl group, a 2-adamantyl group, a 1-norbornyl group, and a 2-norbornyl group.

Substituted Cycloalkyl Group (Specific Example Group G6B):

a 4-methylcyclohexyl group.

"Group Represented by —Si($R_{901}$)($R_{902}$)($R_{903}$)" Specific examples of the group represented by —Si($R_{901}$)($R_{902}$)($R_{903}$) described in this specification (specific example group G7) include:

—Si(G1)(G1)(G1),

—Si(G1)(G2)(G2),

—Si(G1)(G1)(G2),

—Si(G2)(G2)(G2),

—Si(G3)(G3)(G3), and

—Si(G6)(G6)(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —Si(G1)(G1)(G1) are the same or different.

Plural G2's in —Si(G1)(G2)(G2) are the same or different.

Plural G1's in —Si(G1)(G1)(G2) are the same or different.

Plural G2's in —Si(G2)(G2)(G2) are be the same or different.

Plural G3's in —Si(G3)(G3)(G3) are the same or different.

Plural G6's in —Si(G6)(G6)(G6) are be the same or different.

"Group Represented by —O—($R_{904}$)"

Specific examples of the group represented by —O—($R_{904}$) in this specification (specific example group G8) include:

—O(G1),

—O(G2),

—O(G3), and

—O(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

"Group Represented by —S—($R_{905}$)"

Specific examples of the group represented by —S—($R_{905}$) in this specification (specific example group G9) include:

—S(G1),

—S(G2),

—S(G3), and

—S(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

"Group Represented by —N($R_{906}$)($R_{907}$)"

Specific examples of the group represented by —N($R_{906}$)($R_{907}$) in this specification (specific example group G10) include:
—N(G1)(G1),
—N(G2)(G2),
—N(G1)(G2),
—N(G3)(G3), and
—N(G6)(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —N(G1)(G1) are the same or different.
Plural G2's in —N(G2)(G2) are the same or different.
Plural G3's in —N(G3)(G3) are the same or different.
Plural G6's in —N(G6)(G6) are the same or different.

"Halogen Atom"

Specific examples of the "halogen atom" described in this specification (specific example group G11) include a fluorine atom, a chlorine atom, a bromine atom, an iodine atom, and the like.

"Substituted or Unsubstituted Fluoroalkyl Group"

The "substituted or unsubstituted fluoroalkyl group" described in this specification is a group in which at least one hydrogen atom bonded with a carbon atom constituting the alkyl group in the "substituted or unsubstituted alkyl group" is substituted by a fluorine atom, and includes a group in which all hydrogen atoms bonded with a carbon atom constituting the alkyl group in the "substituted or unsubstituted alkyl group" are substituted by a fluorine atom (a perfluoro group). The number of carbon atoms of the "unsubstituted fluoroalkyl group" is 1 to 50, preferably 1 to 30, more preferably 1 to 18, unless otherwise specified in this specification. The "substituted fluoroalkyl group" means a group in which one or more hydrogen atoms of the "fluoroalkyl group" are substituted by a substituent. The "substituted fluoroalkyl group" described in this specification also includes a group in which one or more hydrogen atoms bonded with a carbon atom of the alkyl chains in the "substituted fluoroalkyl group" are further substituted by a substituent, and a group in which one or more hydrogen atom of a substituent in the "substituted fluoroalkyl group" are further substituted by a substituent. Specific examples of the "unsubstituted fluoroalkyl group" include a group in which one or more hydrogen atoms in the "alkyl group" (specific group G3) are substituted by a fluorine atom, and the like.

"Substituted or Unsubstituted Haloalkyl Group"

The "substituted or unsubstituted haloalkyl group" described in this specification is a group in which at least one hydrogen atom bonded with a carbon atom constituting the alkyl group in the "substituted or unsubstituted alkyl group" is substituted by a halogen atom, and also includes a group in which all hydrogen atoms bonded with a carbon atom constituting the alkyl group in the "substituted or unsubstituted alkyl group" are substituted by a halogen atom. The number of carbon atoms of the "unsubstituted haloalkyl group" is 1 to 50, preferably 1 to 30, more preferably 1 to 18, unless otherwise specified in this specification. The "substituted haloalkyl group" means a group in which one or more hydrogen atoms of the "haloalkyl group" are substituted by a substituent. The "substituted haloalkyl group" described in this specification also includes a group in which one or more hydrogen atoms bonded with a carbon atom of the alkyl chain in the "substituted haloalkyl group" are further substituted by a substituent, and a group in which one or more hydrogen atoms of a substituent in the "substituted haloalkyl group" are further substituted by a substituent. Specific examples of the "unsubstituted haloalkyl group" include a group in which one or more hydrogen atoms in the "alkyl group" (specific example group G3) are substituted by a halogen atom, and the like. A haloalkyl group is sometimes referred to as an alkyl halide group.

"Substituted or Unsubstituted Alkoxy Group"

Specific examples of the "substituted or unsubstituted alkoxy group" described in this specification include a group represented by —O(G3), wherein G3 is the "substituted or unsubstituted alkyl group" described in the specific example group G3. The number of carbon atoms of the "unsubstituted alkoxy group" is 1 to 50, preferably 1 to 30, more preferably 1 to 18, unless otherwise specified in this specification.

"Substituted or Unsubstituted Alkylthio Group"

Specific examples of the "substituted or unsubstituted alkylthio group" described in this specification include a group represented by —S(G3), wherein G3 is the "substituted or unsubstituted alkyl group" described in the specific example group G3. The number of carbon atoms of the "unsubstituted alkylthio group" is 1 to 50, preferably 1 to 30, more preferably 1 to 18, unless otherwise specified in this specification.

"Substituted or Unsubstituted Aryloxy Group"

Specific examples of the "substituted or unsubstituted aryloxy group" described in this specification include a group represented by —O(G1), wherein G1 is the "substituted or unsubstituted aryl group" described in the specific example group G1. The number of ring carbon atoms of the "unsubstituted aryloxy group" is 6 to 50, preferably 6 to 30, more preferably 6 to 18, unless otherwise specified in this specification.

"Substituted or Unsubstituted Arylthio Group"

Specific examples of the "substituted or unsubstituted arylthio group" described in this specification include a group represented by —S(G1), wherein G1 is a "substituted or unsubstituted aryl group" described in the specific example group G1. The number of ring carbon atoms of the "unsubstituted arylthio group" is 6 to 50, preferably 6 to 30, more preferably 6 to 18, unless otherwise specified in this specification.

"Substituted or Unsubstituted Trialkylsilyl Group"

Specific examples of the "trialkylsilyl group" described in this specification include a group represented by —Si(G3)(G3)(G3), where G3 is the "substituted or unsubstituted alkyl group" described in the specific example group G3. Plural G3's in —Si(G3)(G3)(G3) are the same or different. The number of carbon atoms in each alkyl group of the "trialkylsilyl group" is 1 to 50, preferably 1 to 20, more preferably 1 to 6, unless otherwise specified in this specification.

"Substituted or Unsubstituted Aralkyl Group"

Specific examples of the "substituted or unsubstituted aralkyl group" described in this specification is a group represented by -(G3)-(G1), wherein G3 is the "substituted or unsubstituted alkyl group" described in the specific example group G3, and G1 is the "substituted or unsubstituted aryl group" described in the specific example group G1. Therefore, the "aralkyl group" is a group in which a hydrogen atom of the "alkyl group" is substituted by an "aryl group" as a substituent, and is one form of the "substituted alkyl group." The "unsubstituted aralkyl group" is the "unsubstituted alkyl group" substituted by the "unsubstituted aryl group", and the number of carbon atoms of the "unsubstituted aralkyl group" is 7 to 50, preferably 7 to 30, more preferably 7 to 18, unless otherwise specified in this specification.

Specific examples of the "substituted or unsubstituted aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, and the like.

Unless otherwise specified in this specification, examples of the substituted or unsubstituted aryl group described in this specification preferably include a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, 9,9-dimethylfluorenyl group, 9,9-diphenylfluorenyl group, and the like.

Unless otherwise specified in this specification, examples of the substituted or unsubstituted heterocyclic groups described in this specification preferably include a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl)carbazolyl group, a (9-phenyl)phenylcarbazolyl group, a diphenylcarbazol-9-yl group, a phenylcarbazol-9-yl group, a phenyltriazinyl group, a biphenylyltriazinyl group, a diphenyltriazinyl group, a phenyldibenzofuranyl group, a phenyldibenzothiophenyl group, and the like.

In this specification, the carbazolyl group is specifically any of the following groups, unless otherwise specified in this specification.

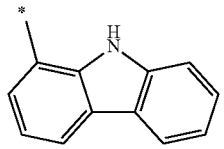

(TEMP-Cz1)

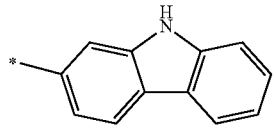

(TEMP-Cz2)

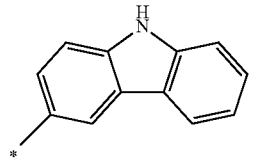

(TEMP-Cz3)

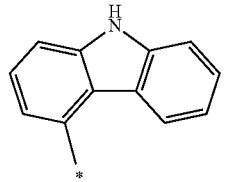

(TEMP-Cz4)

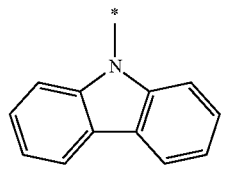

(TEMP-Cz5)

In this specification, the (9-phenyl)carbazolyl group is specifically any of the following groups, unless otherwise specified in this specification.

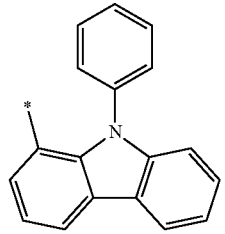

(TEMP-Cz6)

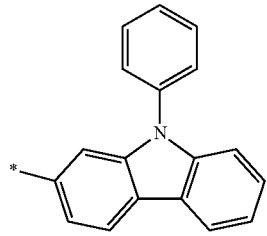

(TEMP-Cz7)

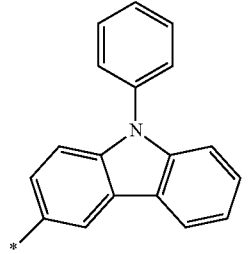

(TEMP-Cz8)

-continued (TEMP-Cz9)

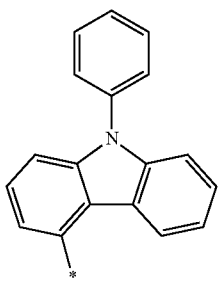

In the general formulas (TEMP-Cz1) to (TEMP-Cz9), * represents a bonding site.

In this specification, the dibenzofuranyl group and the dibenzothiophenyl group are specifically any of the following groups, unless otherwise specified in this specification.

(TEMP-Cz34)

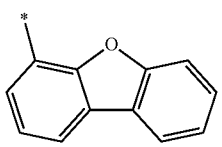

(TEMP-Cz35)

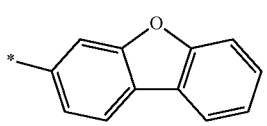

(TEMP-Cz36)

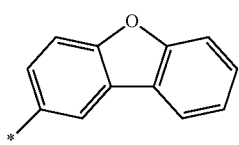

(TEMP-Cz37)

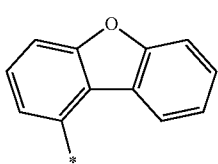

(TEMP-Cz38)

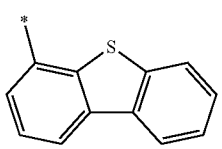

(TEMP-Cz39)

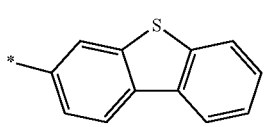

(TEMP-Cz40)

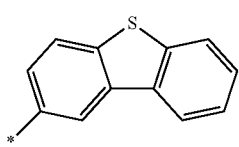

-continued (TEMP-Cz41)

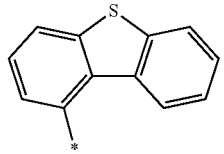

In the general formulas (TEMP-34) to (TEMP-41), * represents a bonding site.

The substituted or unsubstituted alkyl group described in this specification is preferably a methyl group, an ethyl group, a propyl group, an isopropyl group, a n-butyl group, an isobutyl group, a t-butyl group, or the like, unless otherwise specified in this specification.

"Substituted or Unsubstituted Arylene Group"

The "substituted or unsubstituted arylene group" described in this specification is a divalent group derived by removing one hydrogen atom on the aryl ring of the "substituted or unsubstituted aryl group", unless otherwise specified. Specific examples of the "substituted or unsubstituted arylene group" (specific example group G12) include a divalent group derived by removing one hydrogen atom on the aryl ring of the "substituted or unsubstituted aryl group" described in the specific example group G1, and the like.

"Substituted or Unsubstituted Divalent Heterocyclic Group"

The "substituted or unsubstituted divalent heterocyclic group" described in this specification is a divalent group derived by removing one hydrogen atom on the heterocyclic ring of the "substituted or unsubstituted heterocyclic group", unless otherwise specified. Specific examples of the "substituted or unsubstituted divalent heterocyclic group" (specific example group G13) include a divalent group derived by removing one hydrogen atom on the heterocyclic ring of the "substituted or unsubstituted heterocyclic group" described in the specific example group G2, and the like.

"Substituted or Unsubstituted Alkylene Group"

The "substituted or unsubstituted alkylene group" described in this specification is a divalent group derived by removing one hydrogen atom on the alkyl chain of the "substituted or unsubstituted alkyl group", unless otherwise specified. Specific examples of the "substituted or unsubstituted alkylene group" (specific example group G14) include a divalent group derived by removing one hydrogen atom on the alkyl chain of the "substituted or unsubstituted alkyl group" described in the specific example group G3, and the like.

The substituted or unsubstituted arylene group described in this specification is preferably any group of the following general formulas (TEMP-42) to (TEMP-68), unless otherwise specified in this specification.

(TEMP-42)

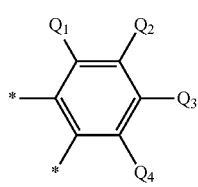

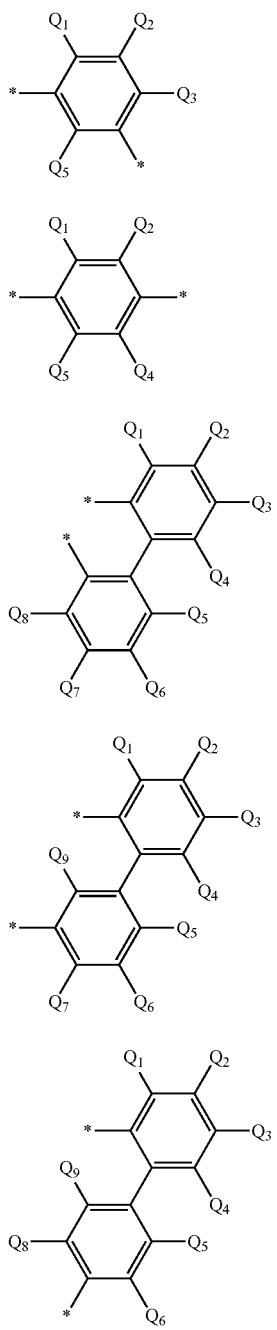
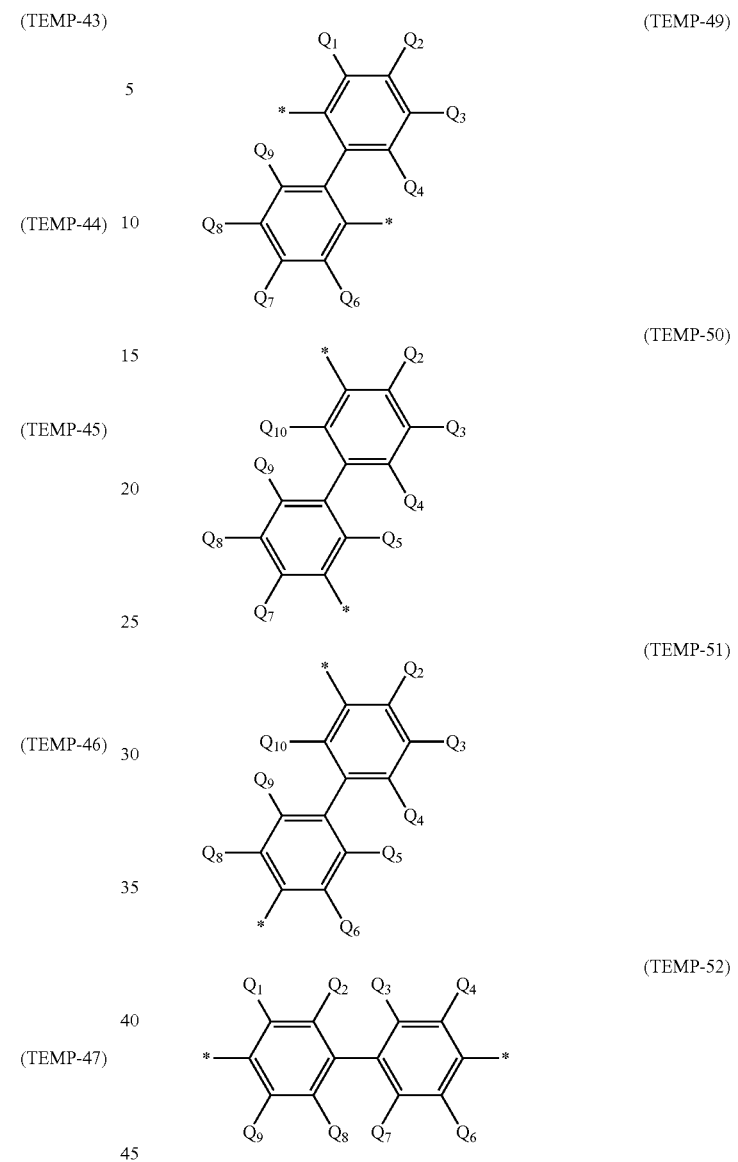
In the general formulas (TEMP-42) to (TEMP-52), $Q_1$ to $Q_{10}$ are independently a hydrogen atom or a substituent.
In the general formulas (TEMP-42) to (TEMP-52), * represents a bonding site.
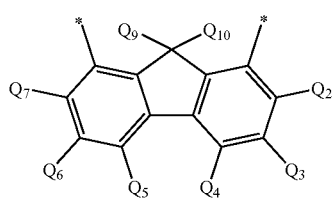

-continued
(TEMP-54)
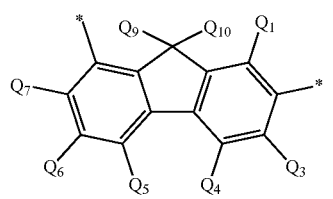
(TEMP-55)
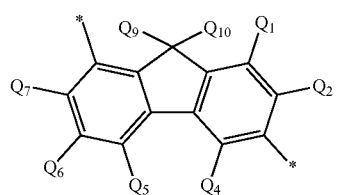
(TEMP-56)
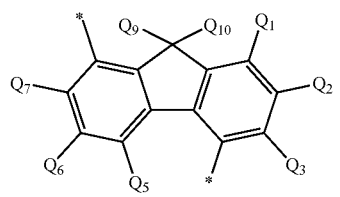
(TEMP-57)
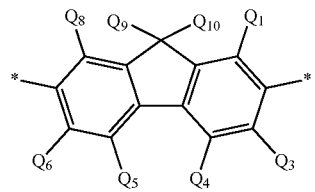
(TEMP-58)
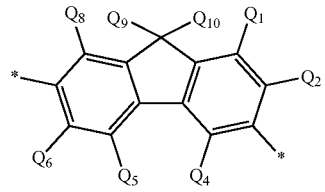
(TEMP-59)
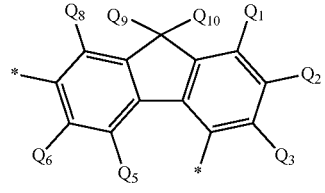
(TEMP-60)
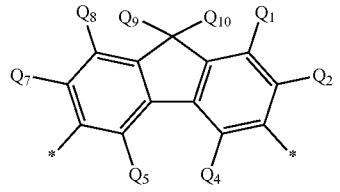
(TEMP-61)
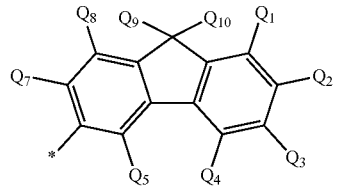
-continued
(TEMP-62)
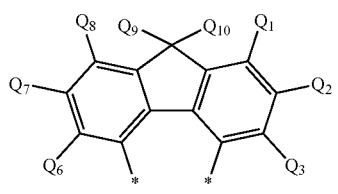
In the general formulas (TEMP-53) to (TEMP-62), $Q_1$ to $Q_{10}$ are independently a hydrogen atom or a substituent.
$Q_9$ and $Q_{10}$ may be bonded with each other via a single bond to form a ring.
In the general formulas (TEMP-53) to (TEMP-62), * represents a bonding site.
(TEMP-63)
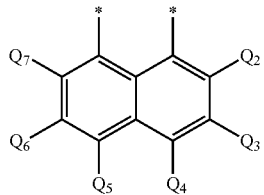
(TEMP-64)
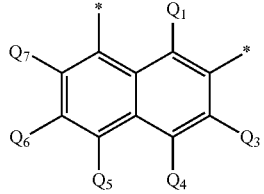
(TEMP-65)
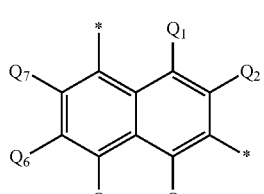
(TEMP-66)
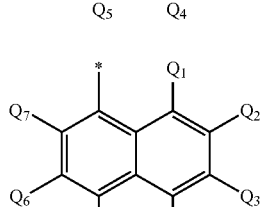
(TEMP-67)
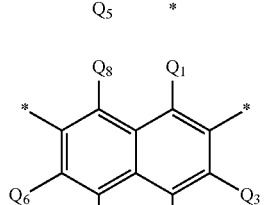

(TEMP-68)
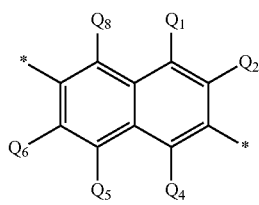

In the general formulas (TEMP-63) to (TEMP-68), $Q_1$ to $Q_8$ are independently a hydrogen atom or a substituent.

In the general formulas (TEMP-63) to (TEMP-68), * represents a bonding site.

The substituted or unsubstituted divalent heterocyclic group described in this specification is preferably any group of the following general formulas (TEMP-69) to (TEMP-102), unless otherwise specified in this specification.

(TEMP-69)
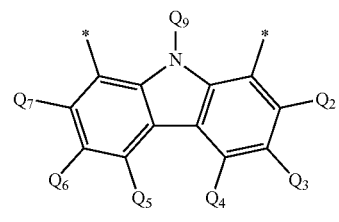

(TEMP-70)
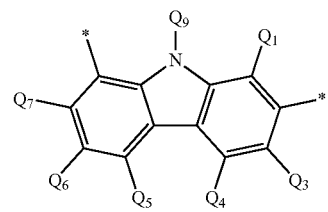

(TEMP-71)
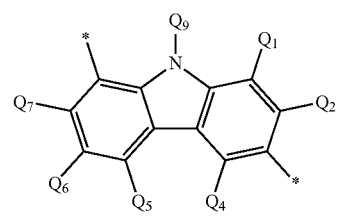

(TEMP-72)
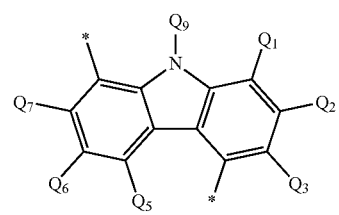

(TEMP-73)
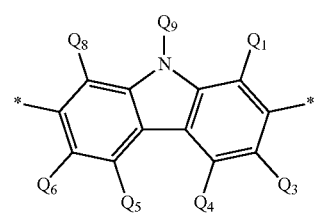

(TEMP-74)
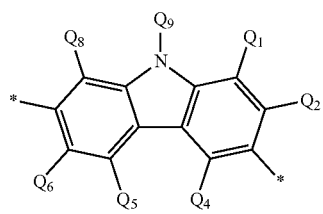

(TEMP-75)
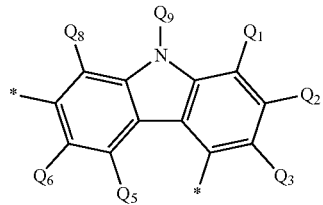

(TEMP-76)
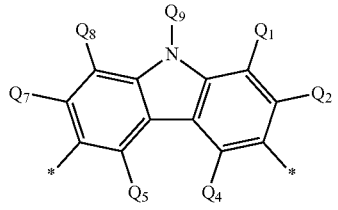

(TEMP-77)

(TEMP-78)
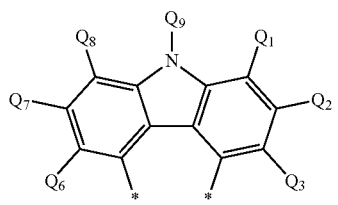

(TEMP-79)

(TEMP-80)
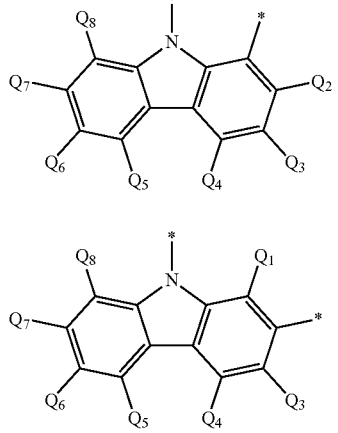

(TEMP-81)
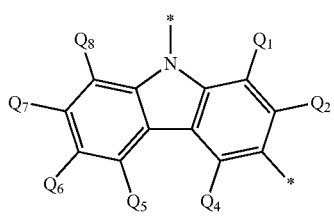
(TEMP-82)
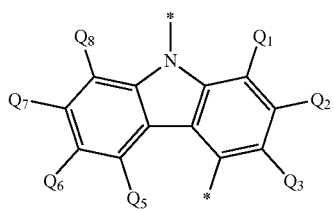
In the general formulas (TEMP-69) to (TEMP-82), $Q_1$ to $Q_9$ are independently a hydrogen atom or a substituent.

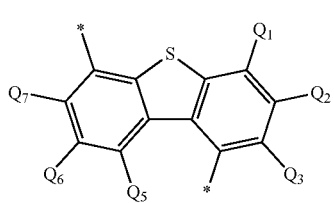
(TEMP-96)

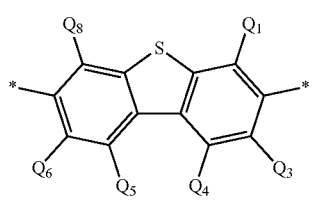
(TEMP-97)

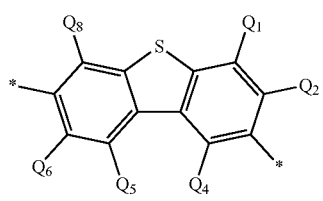
(TEMP-98)

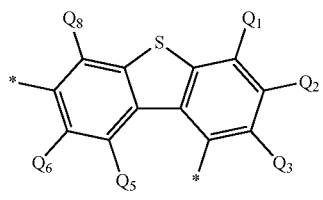
(TEMP-99)

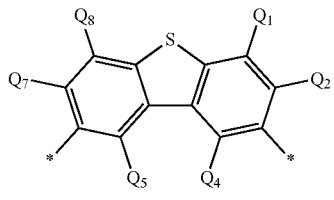
(TEMP-100)

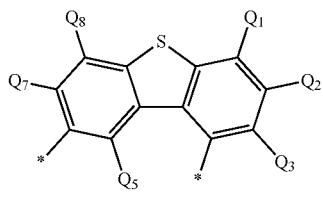
(TEMP-101)

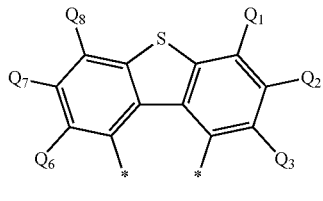
(TEMP-102)

In the general formulas (TEMP-83) to (TEMP-102), $Q_1$ to $Q_8$ are independently a hydrogen atom or a substituent.

The above is the explanation of the "Substituent described in this specification."

"The Case where Bonded with Each Other to Form a Ring"

In this specification, the case where "one or more sets of adjacent two or more form a substituted or unsubstituted monocycle by bonding with each other, form a substituted or unsubstituted fused ring by bonding with each other, or do not bond with each other" means the case where "one or more sets of adjacent two or more form a substituted or unsubstituted monocycle by bonding with each other"; the case where "one or more sets of adjacent two or more form a substituted or unsubstituted fused ring by bonding with each other"; and the case where "one or more sets of adjacent two or more do not bond with each other."

The case where "one or more sets of adjacent two or more form a substituted or unsubstituted monocycle by bonding with each other" and the case where "one or more sets of adjacent two or more form a substituted or unsubstituted fused ring by bonding with each other" in this specification (these cases may be collectively referred to as "the case where forming a ring by bonding with each other") will be described below. The case of an anthracene compound represented by the following general formula (TEMP-103) in which the mother skeleton is an anthracene ring will be described as an example.

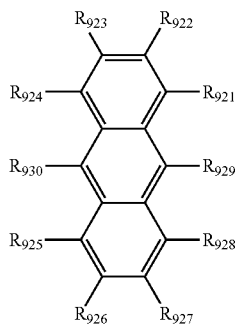
(TEMP-103)

For example, in the case where "one or more sets of adjacent two or more among $R_{921}$ to $R_{930}$ form a ring by bonding with each other", the one set of adjacent two includes a pair of $R_{921}$ and $R_{922}$, a pair of $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, and a pair of $R_{929}$ and $R_{921}$.

The "one or more sets" means that two or more sets of the adjacent two or more sets may form a ring at the same time. For example, $R_{921}$ and $R_{922}$ form a ring $Q_A$ by bonding with each other, and at the same, time $R_{925}$ and $R_{926}$ form a ring $Q_B$ by bonding with each other, the anthracene compound represented by the general formula (TEMP-103) is represented by the following general formula (TEMP-104).

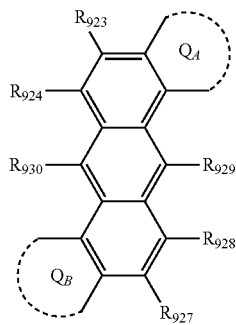
(TEMP-104)

The case where the "set of adjacent two or more" form a ring includes not only the case where the set (pair) of adjacent "two" is bonded with as in the above-mentioned examples, but also the case where the set of adjacent "three or more" are bonded with each other. For example, it means the case where $R_{921}$ and $R_{922}$ form a ring $Q_A$ by bonding with each other, and $R_{922}$ and $R_{923}$ form a ring Qc by bonding with each other, and adjacent three ($R_{921}$, $R_{922}$ and $R_{923}$) form rings by bonding with each other and together fused to the anthracene mother skeleton. In this case, the anthracene compound represented by the general formula (TEMP-103) is represented by the following general formula (TEMP-105). In the following general formula (TEMP-105), the ring $Q_A$ and the ring Qc share $R_{922}$.

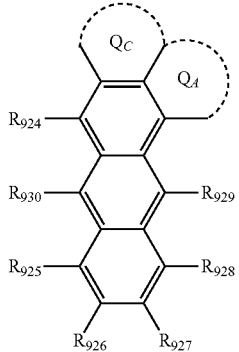

(TEMP-105)

The "monocycle" or "fused ring" formed may be a saturated ring or an unsaturated ring, as a structure of the formed ring alone. Even when the "one pair of adjacent two" forms a "monocycle" or a "fused ring", the "monocycle" or the "fused ring" may form a saturated ring or an unsaturated ring. For example, the ring $Q_A$ and the ring $Q_B$ formed in the general formula (TEMP-104) are independently a "monocycle" or a "fused ring." The ring $Q_A$ and the ring Qc formed in the general formula (TEMP-105) are "fused ring." The ring $Q_A$ and ring Qc of the general formula (TEMP-105) are fused ring by fusing the ring $Q_A$ and the ring Qc together. When the ring $Q_A$ of the general formula (TMEP-104) is a benzene ring, the ring $Q_A$ is a monocycle. When the ring $Q_A$ of the general formula (TMEP-104) is a naphthalene ring, the ring $Q_A$ is a fused ring.

The "unsaturated ring" includes, in addition to an aromatic hydrocarbon ring and aromatic heterocyclic ring, an aliphatic hydrocarbon ring with an unsaturated bond, i.e., double and/or triple bonds in the ring structure (e.g., cyclohexene, cyclohexadiene, etc.), and a non-aromatic heterocyclic ring with an unsaturated bond (e.g., dihydropyran, imidazoline, pyrazoline, quinolidine, indoline, isoindoline, etc.). The "saturated ring" includes an aliphatic hydrocarbon ring without unsaturated bonds or a non-aromatic heterocyclic ring without unsaturated bonds.

Specific examples of the aromatic hydrocarbon ring include a structure in which the group listed as a specific example in the specific example group G1 is terminated by a hydrogen atom.

Specific examples of the aromatic heterocyclic ring include a structure in which the aromatic heterocyclic group listed as a specific example in the example group G2 is terminated by a hydrogen atom.

Specific examples of the aliphatic hydrocarbon ring include a structure in which the group listed as a specific example in the specific example group G6 is terminated by a hydrogen atom.

The term "to form a ring" means forming a ring only with plural atoms of the mother skeleton, or with plural atoms of the mother skeleton and one or more arbitrary atoms in addition. For example, the ring $Q_A$ shown in the general formula (TEMP-104), which is formed by bonding $R_{921}$ and $R_{922}$ with each other, is a ring formed from the carbon atom of the anthracene skeleton with which $R_{921}$ is bonded, the carbon atom of the anthracene skeleton with which $R_{922}$ is bonded, and one or more arbitrary atoms. For example, in the case where the ring $Q_A$ is formed with $R_{921}$ and $R_{922}$, when a monocyclic unsaturated ring is formed with the carbon atom of the anthracene skeleton with which $R_{921}$ is bonded, the carbon atom of the anthracene skeleton with which $R_{922}$ is bonded, and four carbon atoms, the ring formed with $R_{921}$ and $R_{922}$ is a benzene ring.

Here, the "arbitrary atom" is preferably at least one atom selected from the group consisting of a carbon atom, a nitrogen atom, an oxygen atom, and a sulfur atom, unless otherwise specified in this specification. In the arbitrary atom (for example, a carbon atom or a nitrogen atom), a bond which does not form a ring may be terminated with a hydrogen atom or the like, or may be substituted with "arbitrary substituent" described below. When an arbitrary atom other than a carbon atom is contained, the ring formed is a heterocyclic ring.

The number of "one or more arbitrary atom(s)" constituting a monocycle or a fused ring is preferably 2 or more and 15 or less, more preferably 3 or more and 12 or less, and still more preferably 3 or more and 5 or less, unless otherwise specified in this specification.

The "monocycle" is preferable among the "monocycle" and the "fused ring", unless otherwise specified in this specification.

The "unsaturated ring" is preferable among the "saturated ring" and the "unsaturated ring", unless otherwise specified in this specification.

Unless otherwise specified in this specification, the "monocycle" is preferably a benzene ring.

Unless otherwise specified in this specification, the "unsaturated ring" is preferably a benzene ring.

Unless otherwise specified in this specification, when "one or more sets of adjacent two or more" are "bonded with each other to form a substituted or unsubstituted monocycle" or "bonded with each other to form a substituted or unsubstituted fused ring", this specification, one or more sets of adjacent two or more are preferably bonded with each other to form a substituted or unsubstituted "unsaturated ring" from plural atoms of the mother skeleton and one or more and 15 or less atoms which is at least one kind selected from a carbon atom, a nitrogen atom, an oxygen atom, and a sulfur atom.

The substituent in the case where the above-mentioned "monocycle" or "fused ring" has a substituent is, for example, an "arbitrary substituent" described below. Specific examples of the substituent which the above-mentioned "monocycle" or "fused ring" has include the substituent described above in the "Substituent described in this specification" section.

The substituent in the case where the above-mentioned "saturated ring" or "unsaturated ring" has a substituent is, for example, an "arbitrary substituent" described below. Specific examples of the substituent which the above-mentioned "monocycle" or "fused ring" has include the substituent described above in the "Substituent described in this specification" section.

The foregoing describes the case where "one or more sets of adjacent two or more form a substituted or unsubstituted monocycle by bonding with each other" and the case where "one or more sets of adjacent two or more form a substituted or unsubstituted fused ring by bonding with each other" (the case where "forming a ring by bonding with each other").

Substituent in the Case of "Substituted or Unsubstituted"

In one embodiment in this specification, the substituent (in this specification, sometimes referred to as an "arbitrary substituent") in the case of "substituted or unsubstituted" is, for example, a group selected from the group consisting of:

an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
an unsubstituted aryl group including 6 to 50 ring carbon atoms, and
an unsubstituted heterocyclic group including 5 to 50 ring atoms,
wherein, $R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted heterocyclic group including 5 to 50 ring atoms.

When two or more $R_{901}$'s are present, the two or more $R_{901}$'s may be the same or different.
When two or more $R_{902}$'s are present, the two or more $R_{902}$'s may be the same or different.
When two or more $R_{903}$'s are present, the two or more $R_{903}$'s may be the same or different.
When two or more $R_{904}$'s are present, the two or more $R_{904}$'s may be the same or different.
When two or more $R_{905}$'s are present, the two or more $R_{905}$'s may be the same or different.
When two or more $R_{906}$'s are present, the two or more $R_{906}$'s may be the same or different.
When two or more $R_{907}$'s are present, the two or more $R_{907}$'s may be the same or different.

In one embodiment, the substituent in the case of "substituted or unsubstituted" is a group selected from the group consisting of:
an alkyl group including 1 to 50 carbon atoms,
an aryl group including 6 to 50 ring carbon atoms, and
a heterocyclic group including 5 to 50 ring atoms.

In one embodiment, the substituent in the case of "substituted or unsubstituted" is a group selected from the group consisting of:
an alkyl group including 1 to 18 carbon atoms,
an aryl group including 6 to 18 ring carbon atoms, and
a heterocyclic group including 5 to 18 ring atoms.

Specific examples of each of the arbitrary substituents include specific examples of substituent described in the section "Substituent described in this specification" above.

Unless otherwise specified in this specification, adjacent arbitrary substituents may form a "saturated ring" or an "unsaturated ring", preferably form a substituted or unsubstituted saturated 5-membered ring, a substituted or unsubstituted saturated 6-membered ring, a substituted or unsubstituted unsaturated 5-membered ring, or a substituted or unsubstituted unsaturated 6-membered ring, more preferably form a benzene ring.

Unless otherwise specified in this specification, the arbitrary substituent may further have a substituent. The substituent which the arbitrary substituent further has is the same as that of the above-mentioned arbitrary substituent.

In this specification, the numerical range represented by "AA to BB" means the range including the numerical value AA described on the front side of "AA to BB" as the lower limit and the numerical value BB described on the rear side of "AA to BB" as the upper limit.

[First Organic Electroluminescence Device]

The first organic EL device according to an aspect of the invention contains a cathode, an anode, an emitting layer disposed between the cathode and the anode, and a hole-transporting zone disposed between the anode and the emitting layer. The hole-transporting zone contains a first layer and a second layer in this order from the anode side, the first layer contains a compound represented by the following formula (1), and the first layer has a thickness of 0.10 to 3.00 nm.

In conventional organic EL devices, it has been common to use an electron-donating (donor) compound as a matrix material and to dope an electron-withdrawing (acceptor) compound to secure hole-injecting property and to lower the drive voltage. However, although the lowering of the driving voltage is possible by increasing the doping amount of the acceptor compound to ensure hole injection from the anode, there has been a problem that the sheet resistance is lowered by the increase of the doping amount, and the lateral leakage tends to occur.

By having the above-described configuration, the first organic EL device according to an aspect of the invention can be driven at a low voltage, and suppress lateral leakage of current for the direction of the layer plane in the electron-injecting layer by using a thin film or an island-like film containing an acceptor compound alone, which was conventionally doped, as the hole-injecting layer to ensure sufficient hole-injecting property from the anode into the hole-transporting layer.

In the first organic EL device according to an aspect of the invention, the second layer contains a second compound.

[Second Organic Electroluminescence Device]

The second organic EL device according to an aspect of the invention contains a cathode, an anode, an emitting layer disposed between the cathode and the anode, and a hole-transporting zone disposed between the anode and the emitting layer, the hole-transporting zone contains a first layer and a second layer in this order from the anode side, the first layer contains a first compound, the first compound contains one or more selected from the group consisting of a first ring structure represented by the formula (11) described later and a second ring structure represented by the formula (12) described later, the first layer has a thickness of 0.10 to 3.00 nm, the second layer contains a second compound, and the second compound is a monoamine compound having an ionization potential of 5.6 eV or more.

In order to increase the hole-injecting property into an electron-blocking layer and enhance the performance of the device, a material having a deep ionization potential has been expected as a material used for the hole-transporting layer. However, when a material having a deep ionization potential to the hole-injecting layer is used, there has been a problem that hole injection from the anode becomes difficult and the driving voltage of the device is increased.

By having the above-described configuration, the second organic EL device according to an aspect of the invention can be driven at a low voltage, and suppress lateral leakage of current for the direction of the layer plane in the hole-injecting layer by using a thin film or an island-like film containing an acceptor compound alone, which was conventionally doped, as the hole-injecting layer to ensure sufficient hole-injecting property from the anode into the hole-transporting layer, and using a material having a deep ionization potential in the hole-transporting layer to increase the hole-injecting property into the electron-blocking layer.

Hereinafter, each configuration of the organic EL device according to an aspect of the invention will be described.

(Hole-Transporting Zone)

The hole-transporting zone is a generic term for one or two or more layers disposed between the anode and the emitting layer. The hole-transporting zone is composed of, for example, each layer called an electron-blocking layer, a hole-transporting layer, and a hole-injecting layer from the emitting layer side, and may be a stacked structure containing all of these layers, or may be a layer configuration of only some of these layers. In addition, for each of the above layers, two or more kinds of layers may be used, and for example, two kinds of hole-transporting layers having different compositions may be stacked.

Each layer may be formed using one kind of material alone, or two or more kinds of materials may be used in combination.

A stacked structure of the hole-transporting zone in an aspect of the invention is exemplified below.

(a) (anode/)first layer (hole-injecting layer)/second layer (hole-transporting layer)(/emitting layer)
(b) (anode/)first layer (hole-injecting layer)/second layer (hole-transporting layer)/third layer (electron-blocking layer)/(emitting layer)
(c) (anode/)first layer (hole-injecting layer)/second layer (first hole-transporting layer)/fourth layer (second hole-transporting layer)/third layer (electron-blocking layer)/(emitting layer)
(d) (anode/)first layer (first hole-injecting layer)/second layer (first hole-transporting layer)/fourth layer (second hole-transporting layer)/fifth layer (second hole-injecting layer)/third layer (electron-blocking layer)/(emitting layer)

The thickness of the first layer is preferably 0.10 nm or more, more preferably 0.30 nm or more.

The thickness of the first layer is preferably 3.00 nm or less, more preferably 1.50 nm or less, still more preferably 0.9 nm or less, and particularly preferably 0.5 nm or less.

In the organic EL device according to an aspect of the invention, a thickness of the first layer is 0.10 to 1.50 nm.

Hereinafter, details of each compound will be described.

[Compound Represented by Formula (1)]

The compound represented by the formula (1) is as follows.

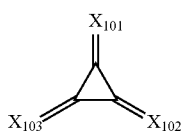
(1)

In the formula (1), $X_{101}$ to $X_{103}$ are independently a divalent group represented by the following formula (1A):

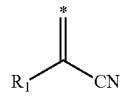
(1A)

wherein in the formula (1A), * represents a bonding site; $R_1$ is
a substituted or unsubstituted aryl group including 6 to 50 ring carbon atoms, or
a substituted or unsubstituted monovalent heterocyclic group including 5 to 50 ring atoms; and
when two or more $R_1$'s are present, the two or more $R_1$'s may be the same as or different from each other.

In one embodiment, the compound represented by the formula (1) is a compound represented by the following formula (1-1):

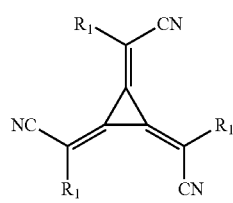
(1-1)

wherein in the formula (1-1), $R_1$ is as defined in the formula (1).

In one embodiment, the substituent in the case of "substituted or unsubstituted" in the formula (1A) is selected from the group consisting of
an alkyl group including 1 to 50 carbon atoms,
a haloalkyl group including 1 to 50 carbon atoms,
an alkenyl group including 2 to 50 carbon atoms,
an alkynyl group including 2 to 50 carbon atoms,
a cycloalkyl group including 3 to 50 ring carbon atoms,
an alkoxy group including 1 to 50 carbon atoms,
an alkylthio group including 1 to 50 carbon atoms,
an aryloxy group including 6 to 50 ring carbon atoms,
an arylthio group including 6 to 50 ring carbon atoms,
an aralkyl group including 7 to 50 carbon atoms,
—Si($R_{41}$)($R_{42}$)($R_{43}$),
—C(=O)$R_{44}$, —COO$R_{45}$,
—S(=O)$_2R_{46}$,
—P(=O)($R_{47}$)($R_{48}$),
—Ge($R_{49}$)($R_{50}$)($R_{51}$),
—N($R_{52}$)($R_{53}$), wherein $R_{41}$ to $R_{53}$ are independently a hydrogen atom, an alkyl group including 1 to 50 carbon atoms, an aryl group including 6 to 50 ring carbon atoms, or a monovalent heterocyclic group including 5 to 50 ring atoms, when two or more of each of $R_{41}$ to $R_{53}$ are present, the two or more of each of $R_{41}$ to $R_{53}$ may be the same as or different from each other,
a hydroxy group,
a halogen atom,
a cyano group,
a nitro group,
an aryl group including 6 to 50 ring carbon atoms, and
a monovalent heterocyclic group including 5 to 50 ring atoms.

In one embodiment, the substituent in the case of "substituted or unsubstituted" in the formula (1A) is selected from the group consisting of
a haloalkyl group including 1 to 18 carbon atoms,
a halogen atom, and
a cyano group.

In one embodiment, $R_1$ in the formula (1A) is selected from the group consisting of
a perfluoropyridin-4-yl group,
a tetrafluoro-4-(trifluoromethyl)phenyl group,
a 4-cyanoperfluorophenyl group,
a dichloro-3,5-difluoro-4-(trifluoromethyl)phenyl group, and
a perfluorophenyl group.

In one embodiment, the compound represented by the formula (1) is selected from the group consisting of (2E,2'E,2"E)-2,2',2"-(cyclopropane-1,2,3-triylidene)tris(2-(perfluorophenyl)-acetonitrile), (2E,2'E,2"E)-2,2',2"-(cyclopropane-1,2,3-triylidene)tris(2-(perfluoropyridin-4-yl)-acetonitrile), (2E,2'E,2"E)-2,2',2"-(cyclopropane-1,2,3-triylidene)tris(2-(4-cyanoperfluorophenyl)-acetonitrile), (2E,2'E,2"E)-2,2',2"-(cyclopropane-1,2,3-triylidene)tris(2-(2,3,5,6-tetrafluoro-4-(trifluoromethyl)phenyl)-acetonitrile), and (2E,2'E,2"E)-2,2',2"-(cyclopropane-1,2,3-triylidene)tris(2-(2,6-dichloro-3,5-difluoro-4-(trifluoromethyl)phenyl)-acetonitrile), The compound represented by the formula (1) can be synthesized by using known alternative reactions or raw materials tailored to the target compound.

Specific examples of the compound represented by the formula (1) will be described below, but these are merely examples, and the compound represented by the formula (1) is not limited to the following specific examples.

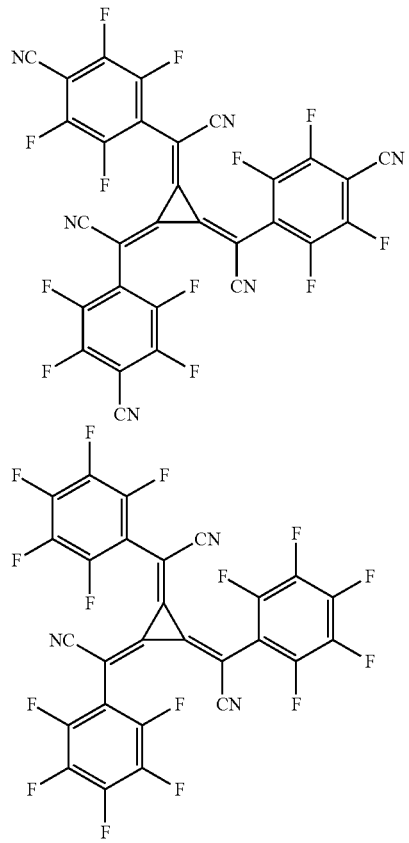

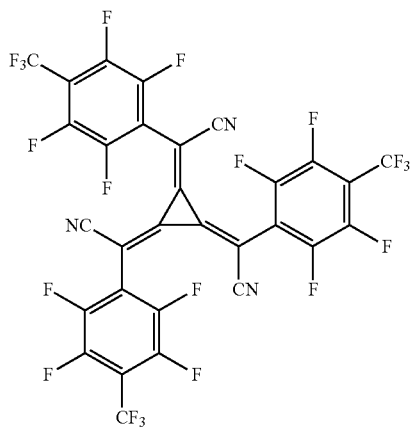

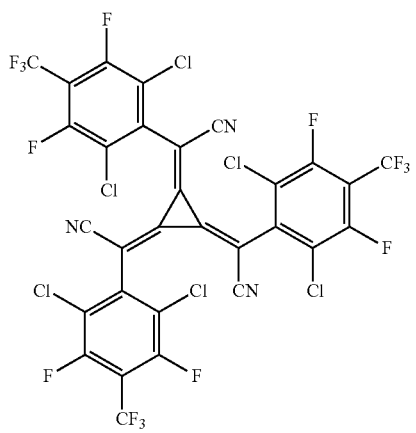

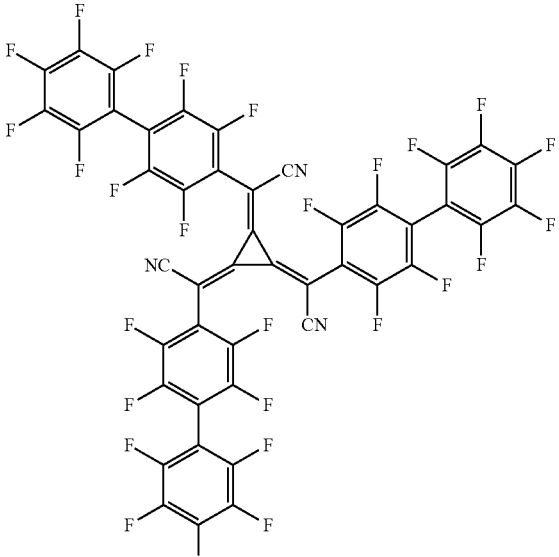

-continued

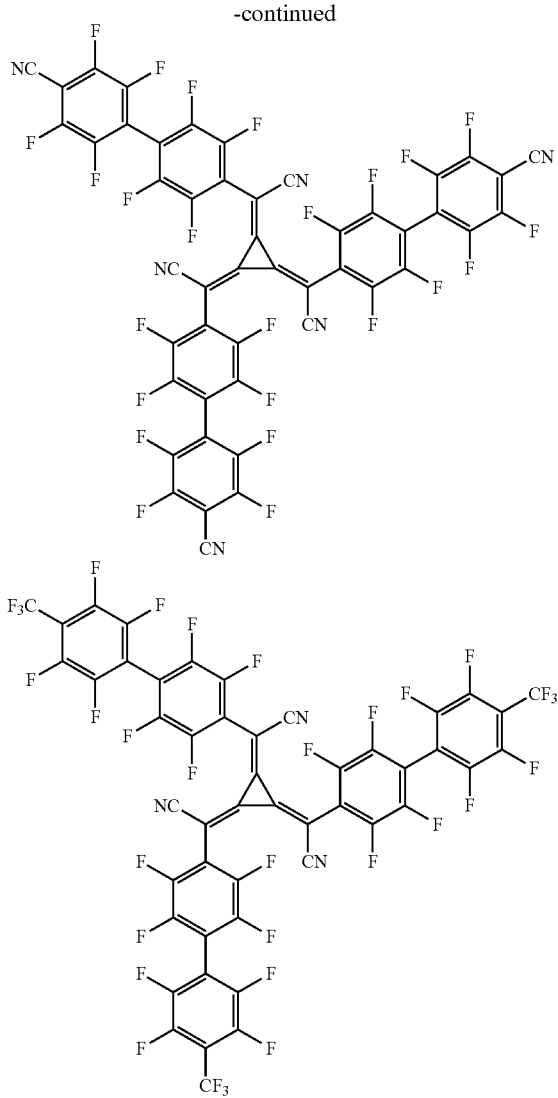

(First Compound)

The first compound contains one or more selected from the group consisting of a first ring structure represented by the following formula (11) and a second ring structure represented by the following formula (12):

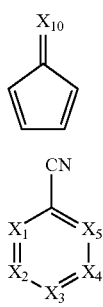

wherein in the first compound, the first ring structure represented by the formula (11) is fused with one or more ring structures selected from the group consisting of a substituted or unsubstituted aromatic hydrocarbon ring including 6 to 50 ring carbon atoms and a substituted or unsubstituted heterocycle including 5 to 50 ring atoms in the molecule of the first compound;

in the formula (11), $X_{10}$ is a divalent group represented by the following formulas (11a), (11b), (11c), (11d), (11e), (11f), (11g), (11h), (11i), (11j), (11k), or (11m):

(11a)

(11b)

(11c)

(11d)

(11e)

(11f)

(11g)

(11h)

(11i)

(11j)

(11k)

-continued

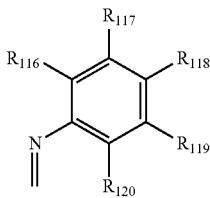
(11m)

wherein in the formulas (11a) to (11m),
$R_{11}$ to $R_{14}$ and $R_{111}$ to $R_{120}$ are independently a hydrogen atom or a substituent R;
the substituent R is
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$), wherein $R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms, and
when two or more of each of $R_{901}$ to $R_{907}$ are present, the two or more of each of $R_{901}$ to $R_{907}$ may be the same as or different from each other,
a halogen atom, a cyano group, a nitro group,
a substituted or unsubstituted aryl group including 6 to 50 ring carbon atoms, and
a substituted or unsubstituted monovalent heterocyclic group including 5 to 50 ring atoms;
when two or more substituents R are present, the two or more substituents R may be the same as or different from each other;
when two or more $X_{10}$'s are present, the two or more $X_{10}$'s may be the same as or different from each other;
wherein in the formula (12),
$X_1$ to $X_5$ are independently N, $CR_{15}$, or a carbon atom bonding with another atom in the molecule of the first compound; provided that at least one of $X_1$ to $X_5$ is a carbon atom bonding with another atom in the molecule of the first compound;
when two or more of each of $X_1$ to $X_5$ are present, the two or more of each of $X_1$ to $X_5$ may be the same as or different from each other;
$R_{15}$ is a hydrogen atom or a substituent R;
when two or more $R_{15}$'s are present, the two or more $R_{15}$'s may be the same as or different from each other; and
the substituent R is as defined in the formula (11).
In one embodiment, the first compound is a compound formed by the fusing two or three structures represented by the following formula (13) into a third ring structure selected from the group consisting of
a substituted or unsubstituted aromatic hydrocarbon ring including 6 to 50 ring carbon atoms, and
a substituted or unsubstituted heterocycle including 5 to 50 ring atoms.

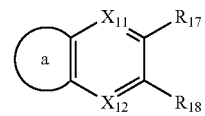
(13)

In the formula (13),
ring a is the first ring structure represented by the formula (11), and fuses with the third ring structure;
$X_{11}$ and $X_{12}$ are independently N or $CR_{16}$;
$R_{16}$, $R_{17}$, and $R_{18}$ are independently a hydrogen atom or a substituent R;
when two or more of each of $R_{16}$, $R_{17}$, and $R_{18}$ are present, the two or more of each of $R_{16}$, $R_{17}$, and $R_{18}$ may be the same as or different from each other;
the substituent R is as defined in the formula (11).
In one embodiment, at least one of $R_{17}$ and $R_{18}$ in the formula (13) is
a fluorine atom,
a fluoroalkyl group,
a fluoroalkoxy group, or
a cyano group.
In one embodiment, the first compound is a compound represented by the following formula (14) or (15):

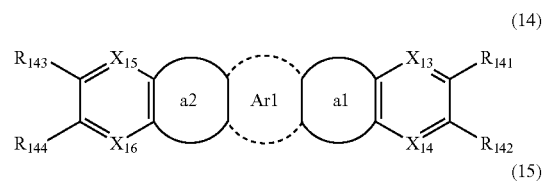
(14)

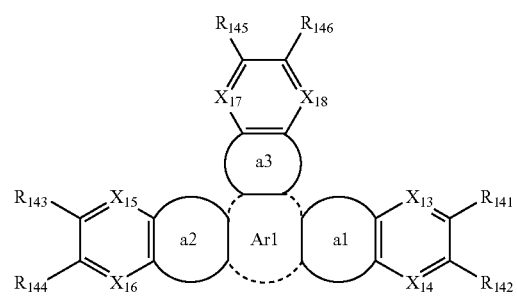
(15)

wherein in the formulas (14) and (15),
ring Ar1 is
a substituted or unsubstituted aromatic hydrocarbon ring including 6 to 50 ring carbon atoms, or
a substituted or unsubstituted heterocycle including 5 to 50 ring atoms;
ring a1, ring a2, and ring a3 are independently the first ring structure represented by the formula (11);
$X_{13}$ to $X_{18}$ are independently N or $CR_{147}$;
$R_{141}$ to $R_{147}$ are independently a hydrogen atom or a substituent R;
when two or more $R_{147}$'s are present, the two or more $R_{147}$'s may be the same as or different from each other;

the substituent R is as defined in the formula (11).

In one embodiment, the first compound is a compound represented by the following formula (14A) or (15A):

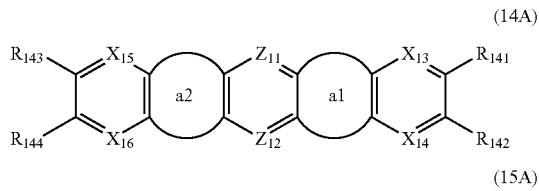
(14A)

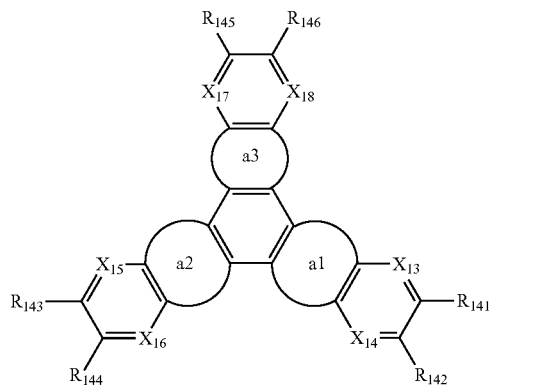
(15A)

wherein in the formulas (14A) and (15 A), ring a1, ring a2, ring a3, $X_{13}$ to $X_{18}$, and $R_{141}$ to $R_{146}$ are as defined in the formulas (14) and (15);

in the formula (14A), $Z_{11}$ and $Z_{12}$ are independently N or CH.

In one embodiment, the first ring structure represented by the formula (11) is a ring structure represented by the following formula (11A):

(11A)

In one embodiment, the first compound is a compound represented by any one of the following formulas (141) to (144) and (151):

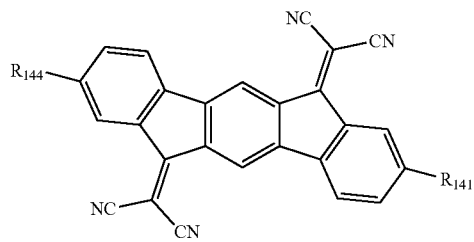
(141)

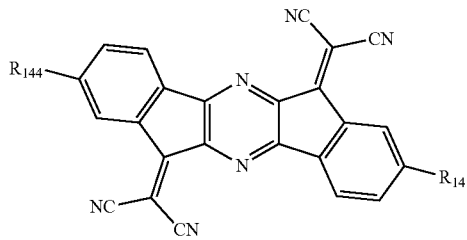
(142)

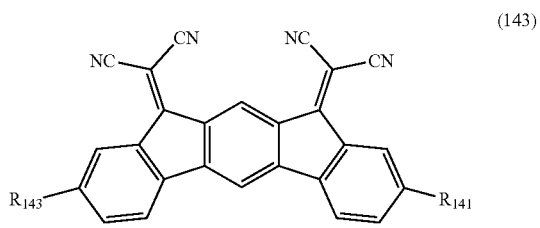
(143)

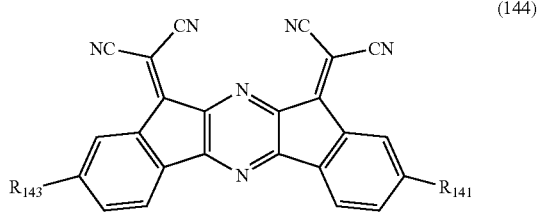
(144)

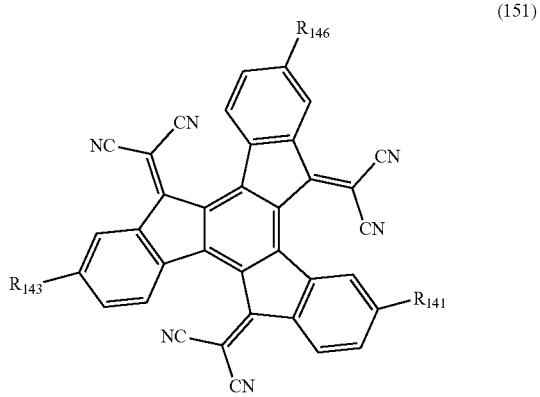
(151)

wherein in the formulas (141) to (144) and (151), $R_{141}$, $R_{143}$, $R_{144}$, and $R_{146}$ are independently a fluorine atom, a fluoroalkyl group, a fluoroalkoxy group, or a cyano group.

In one embodiment, the first compound is a compound represented by the formula (143).

In one embodiment, the first compound is a compound represented by any one of the following formulas (145) to (148):

(145)

(146)

(147)

(148)

wherein in the formulas (145) to (148),
Ar$_{141}$, Ar$_{143}$, and Ar$_{144}$ are independently
an aromatic hydrocarbon ring group including 6 to 30 ring carbon atoms having at least one substituent selected from the group consisting of a fluorine atom, a fluoroalkyl group, a fluoroalkoxy group, and a cyano group, or
a monovalent heterocyclic group including 5 to 30 ring atoms having at least one substituent selected from the group consisting of a fluorine atom, a fluoroalkyl group, a fluoroalkoxy group, and a cyano group.

In one embodiment, the first compound is a compound represented by the following formula (1451):

(1451)

wherein in the formula (41,
R$_{1451}$ to R$_{1460}$ are independently a hydrogen atom, a fluorine atom, a fluoroalkyl group, a fluoroalkoxy group, or a cyano group;
provided that at least one of R$_{1451}$ to R$_{1460}$ is a fluorine atom, a fluoroalkyl group, a fluoroalkoxy group, or a cyano group.

In one embodiment, the first compound is a compound represented by the following formula (1461):

(1461)

wherein in the formula (1461),
R$_{1461}$ to R$_{1470}$ are independently a hydrogen atom, a fluorine atom, a fluoroalkyl group, a fluoroalkoxy group, or a cyano group;
provided that at least one or more of R$_{1461}$ to R$_{1470}$ is a fluorine atom, a fluoroalkyl group, a fluoroalkoxy group, or a cyano group.

In one embodiment, the first compound is a compound represented by the following formula (16) or (17):

(16)

(17)

wherein in the formulas (16) and (17),
ring a1 and ring a2 are first ring structures represented by the formula (11); X$_{13}$ to X$_{16}$ and R$_{141}$ to R$_{144}$ are as defined in the formula (13);
ring b1 is a ring structure represented by the following formula (171):

(171)

wherein in the formula (171), X$_{19}$ is O or S.
In one embodiment, at least one of R$_{141}$ to R$_{144}$ in the formula (16) or (17) is
an aromatic hydrocarbon ring group including 6 to 30 ring carbon atoms having at least one substituent selected from the group consisting of a fluorine atom, a fluoroalkyl group, and a cyano group; or
a monovalent heterocyclic group including 5 to 30 ring atoms having at least one substituent selected from the group consisting of a fluorine atom, a fluoroalkyl group, a fluoroalkoxy group, and a cyano group.

In one embodiment, the second ring structure represented by the formula (12) is a ring structure represented by the following formula (121) or (122):

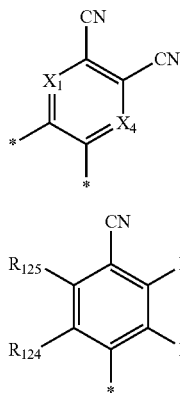

(121)

(122)

wherein in the formulas (121) and (122), *'s respectively represent a bonding site of the first compound with another atom in the molecule;
in the formula (121),
$X_1$ and $X_4$ are as defined in the formula (12);
in the formula (122),
$R_{122}$ to $R_{125}$ are independently a hydrogen atom or a substituent R; and
the substituent R is as defined in the formula (11).

In one embodiment, the first compound is a compound represented by the following formula (121A):

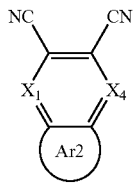

(121A)

wherein in the formula (121A), $X_1$ and $X_4$ are as defined in the formula (12); and
ring $Ar_2$ is
a substituted or unsubstituted aromatic hydrocarbon ring including 6 to 50 ring carbon atoms, or
a substituted or unsubstituted heterocycle including 5 to 50 ring atoms.

In one embodiment, the second ring structure represented by the formula (12) is a ring structure represented by the following formula (122B):

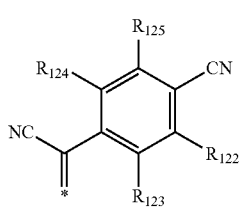

(122B)

wherein in the formula (122B), * represents a bonding site of the first compound with another atom in the molecule;
$R_{122}$ to $R_{125}$ are independently a hydrogen atom or a substituent R; and
the substituent R is as defined in the formula (11).

In one embodiment, the first compound is a compound represented by the following formula (122C):

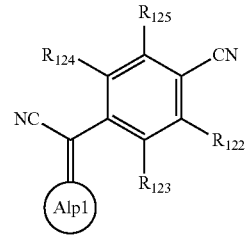

(122C)

wherein in the formula (122C),
$R_{122}$ to $R_{125}$ are independently a hydrogen atom or a substituent R;
ring Alp1 is a substituted or unsubstituted aliphatic hydrocarbon ring including 3 to 6 ring carbon atoms; and
the substituent R is as defined in the formula (11).

In one embodiment, the first compound is a compound represented by the following formula (122D):

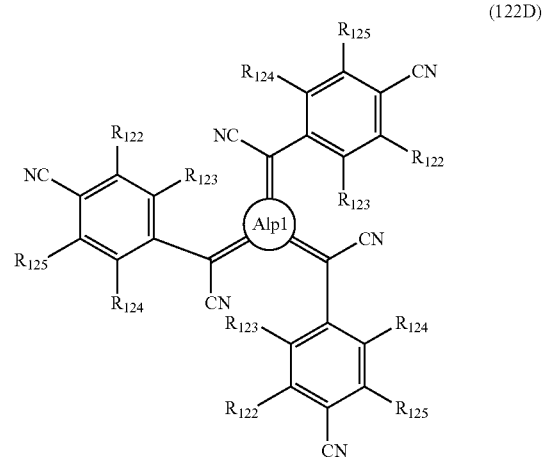

(122D)

wherein in the formula (122D),
$R_{122}$ to $R_{125}$ are independently a hydrogen atom or a substituent R;
two or more of each of $R_{122}$ to $R_{125}$ may be the same as or different from each other;
Alp1 is a substituted or unsubstituted aliphatic hydrocarbon ring including 3 to 6 ring carbon atoms; and
the substituent R is as defined in the formula (11).

In one embodiment, the first compound is a compound represented by the following formula (122E):

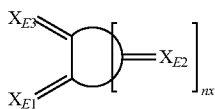
(122E)

wherein in the formula (122E),
nx is an integer of 1 to 4;
$X_{E1}$, $X_{E2}$, and $X_{E3}$ are independently a divalent group represented by the following formula (E1), (E2), (E3) or (E4): when two or more $X_{E2}$'s are present, the two or more $X_{E2}$'s may be the same as or different from each other;

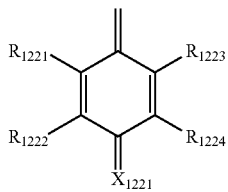
(E1)

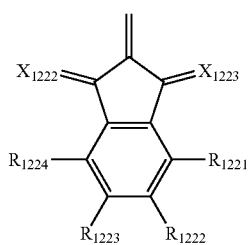
(E2)

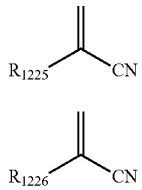
(E3)

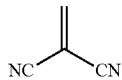
(E4)

wherein in the formulas (E1), (E2), (E3), and (E4),
$X_{1221}$, $X_{1222}$, and $X_{1223}$ are independently O or a divalent group represented by the following formula (E1A):

(E1A)

$R_{1221}$ to $R_{1224}$ are independently
a hydrogen atom,
a halogen atom,
a cyano group,
a substituted or unsubstituted alkyl group including 1 to 50 carbon atoms,
a substituted or unsubstituted aryl group including 6 to 50 ring carbon atoms, or
a substituted or unsubstituted monovalent heterocyclic group including 5 to 50 ring atoms;
$R_{1225}$ is a substituted or unsubstituted aryl group including 6 to 50 ring carbon atoms; and
$R_{1226}$ is a substituted or unsubstituted monovalent heterocyclic group including 5 to 50 ring atoms.

The first compound can be synthesized by using known alternative reactions or raw materials tailored to the target compound.

Specific examples of the first compound will be described below, but these are merely examples, and the first compound is not limited to the following specific examples. Specific examples of the first compound also include specific examples of the compound represented by the formula (1) described above.

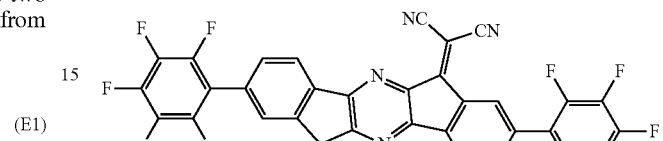

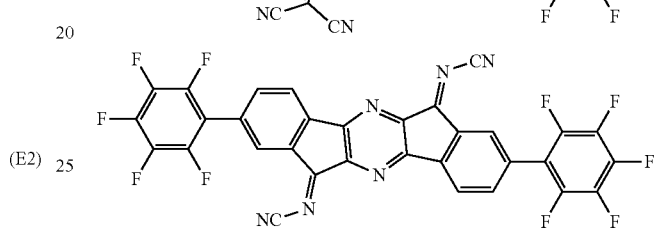

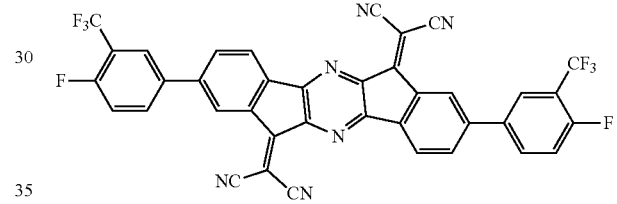

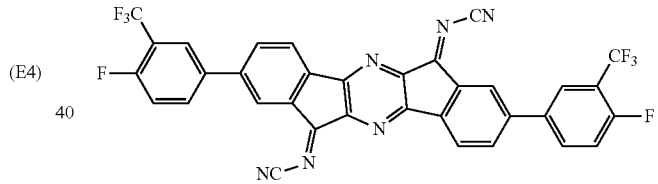

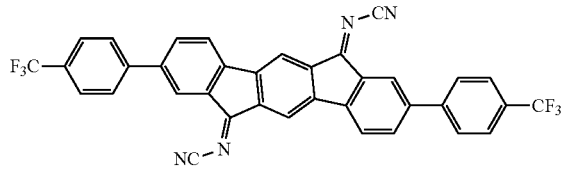

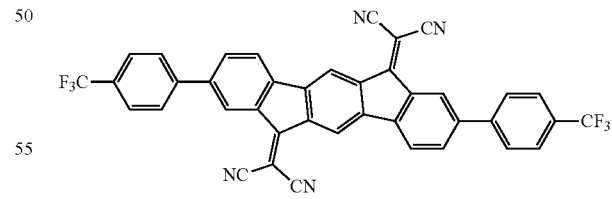

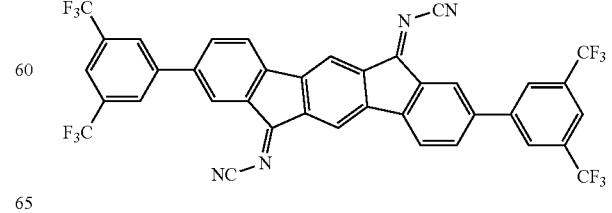

-continued
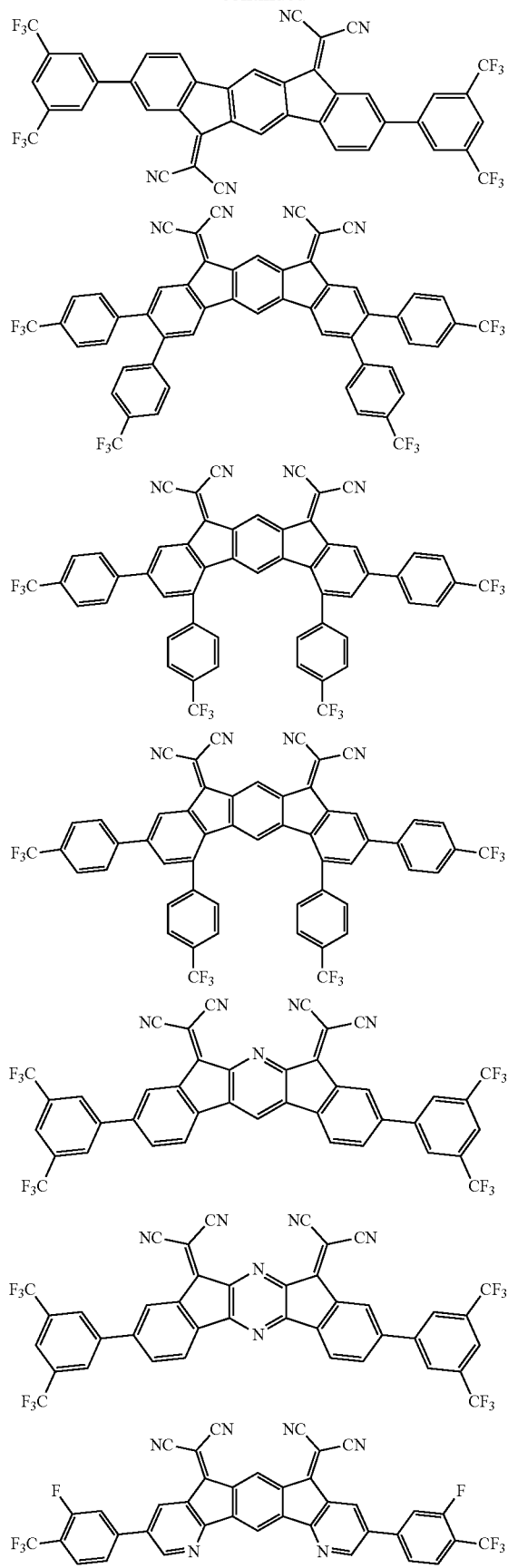
-continued
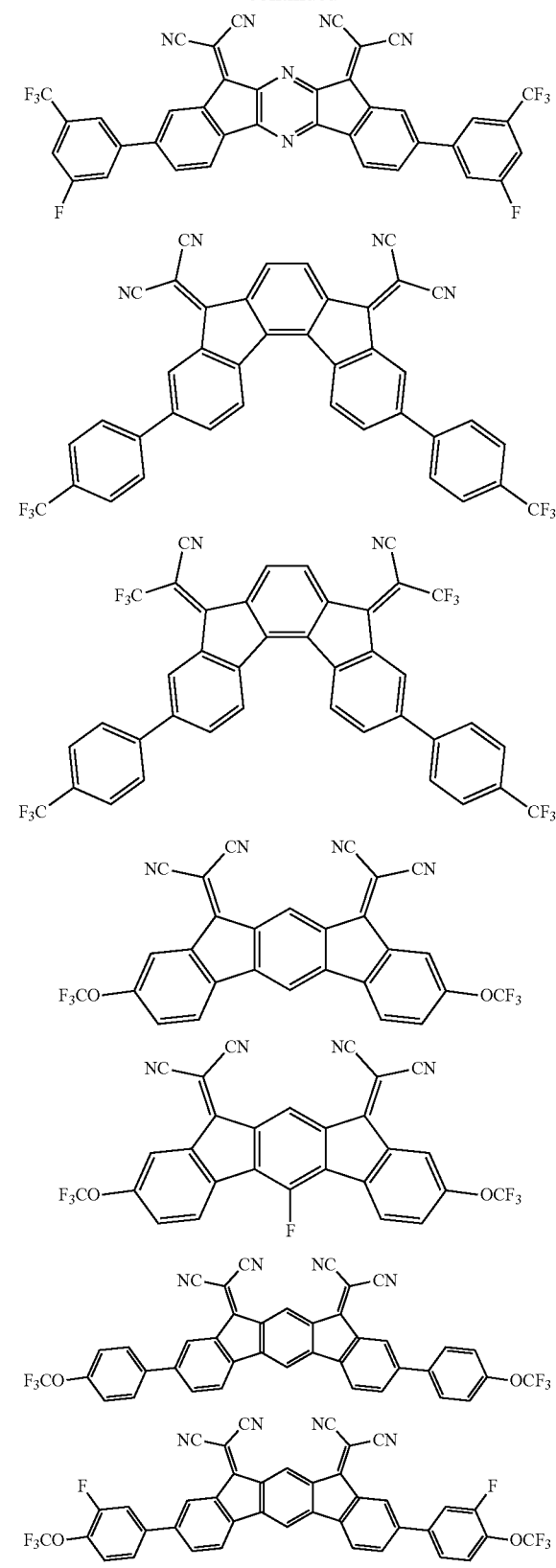

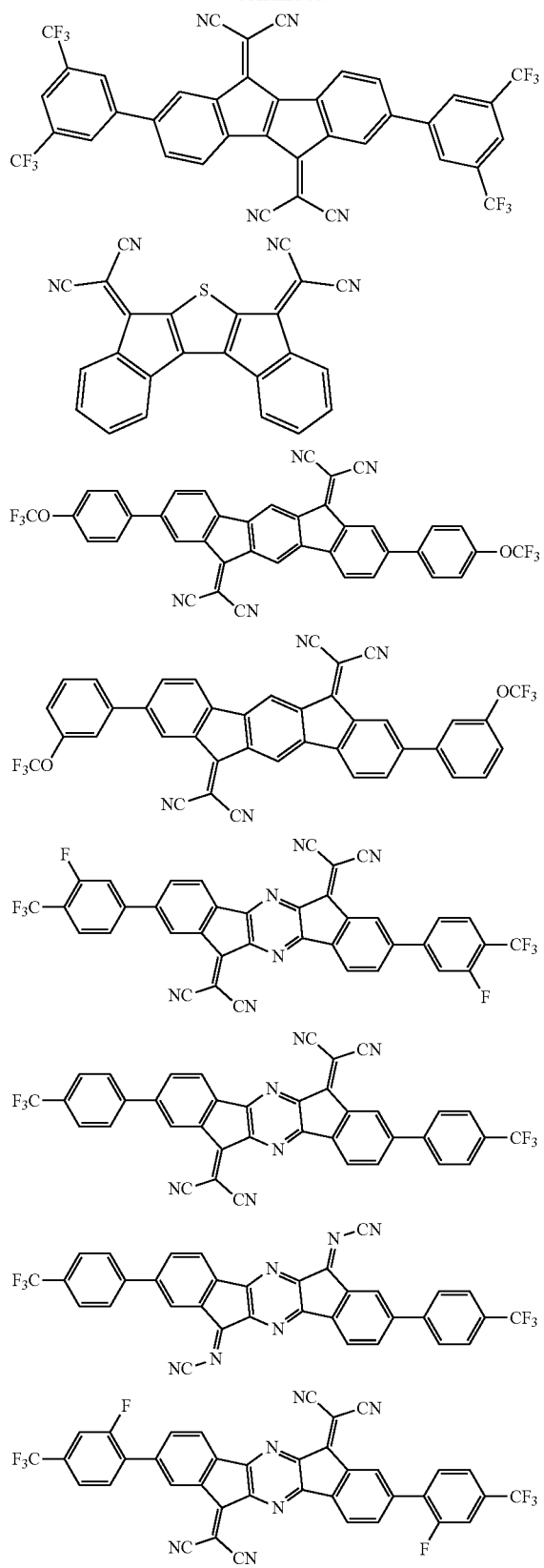
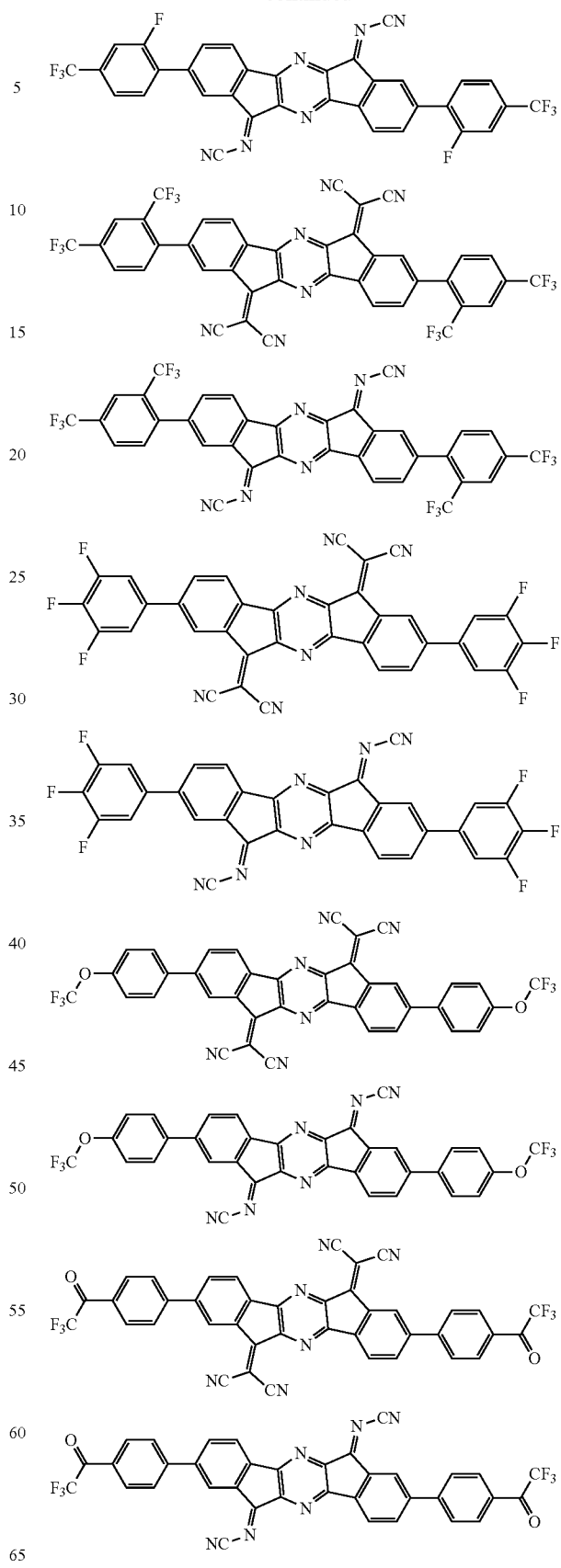

-continued
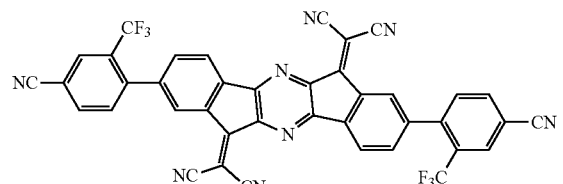
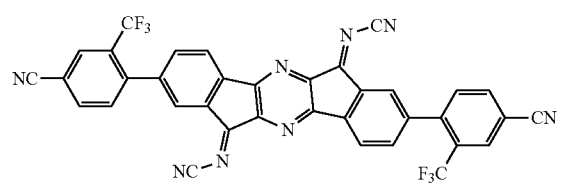
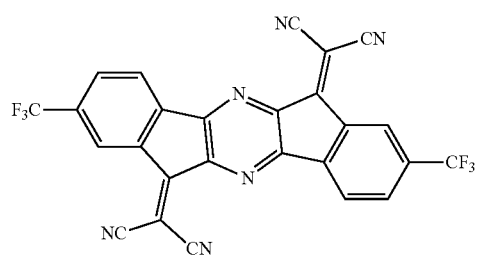
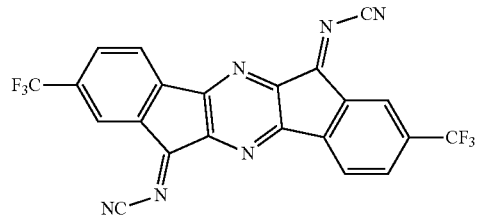
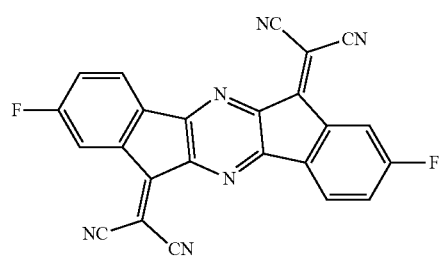
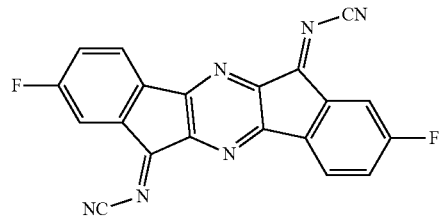
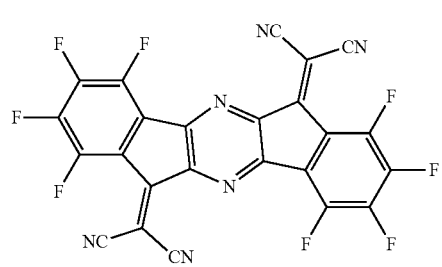
-continued
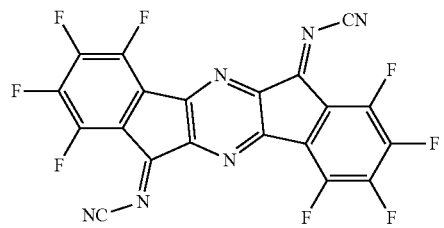
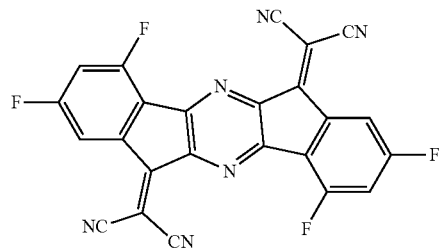
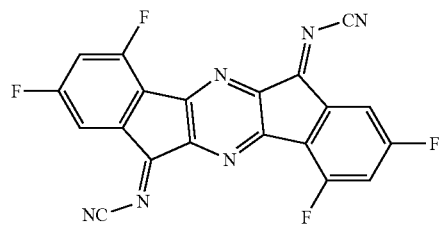
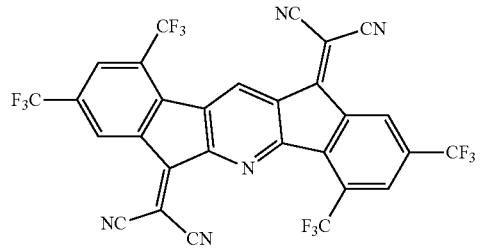
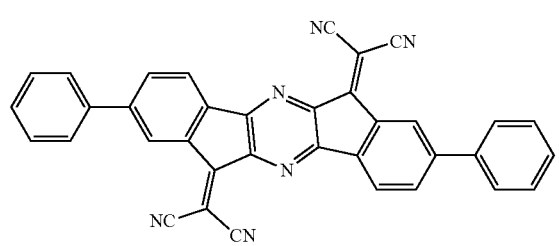
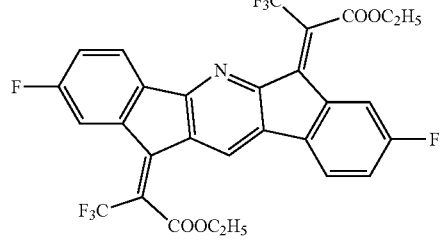

-continued
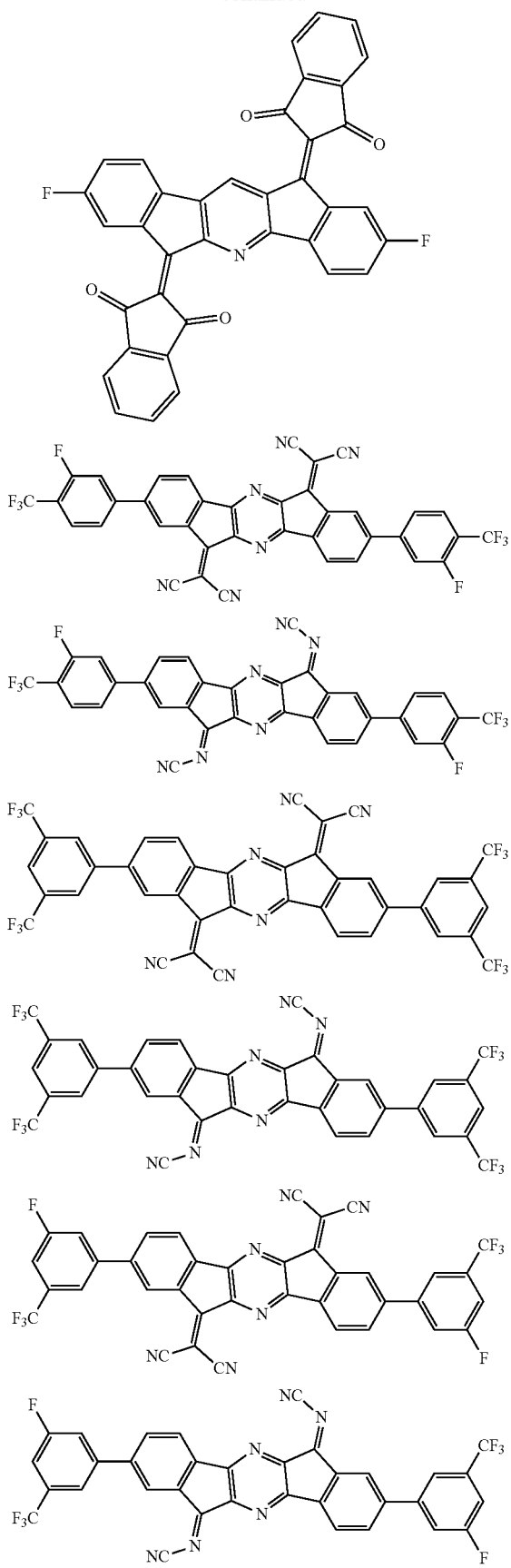
-continued
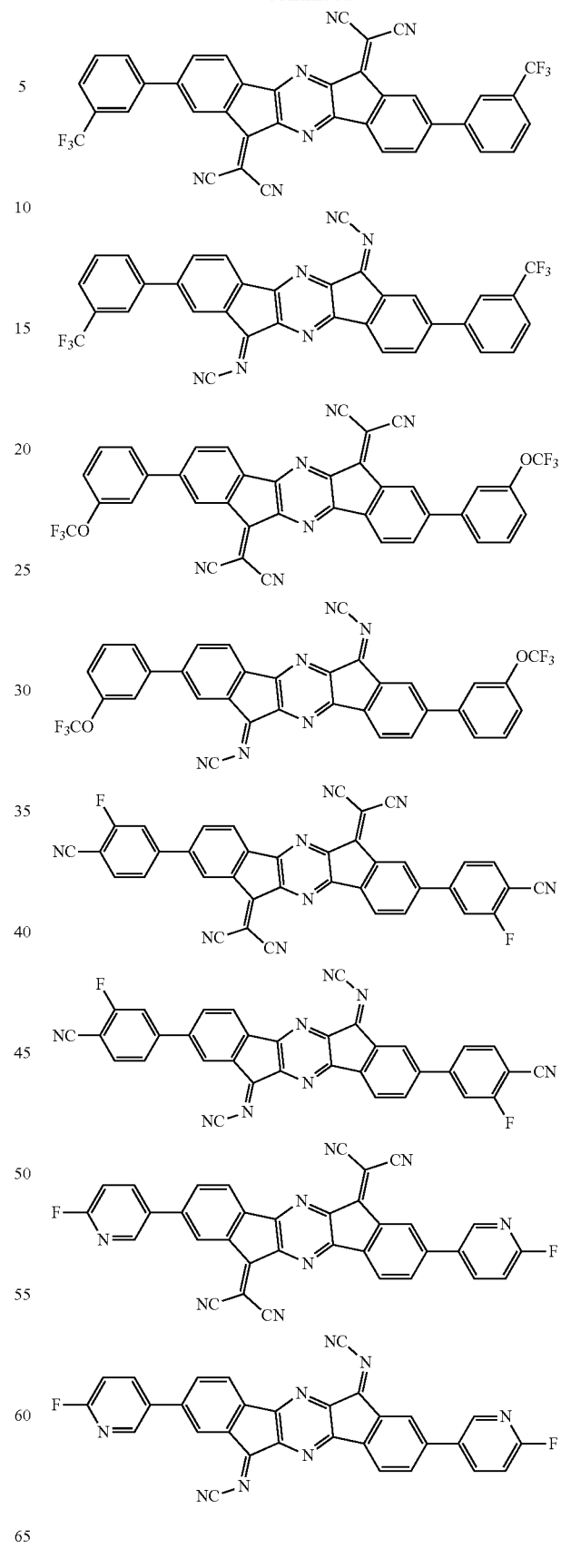

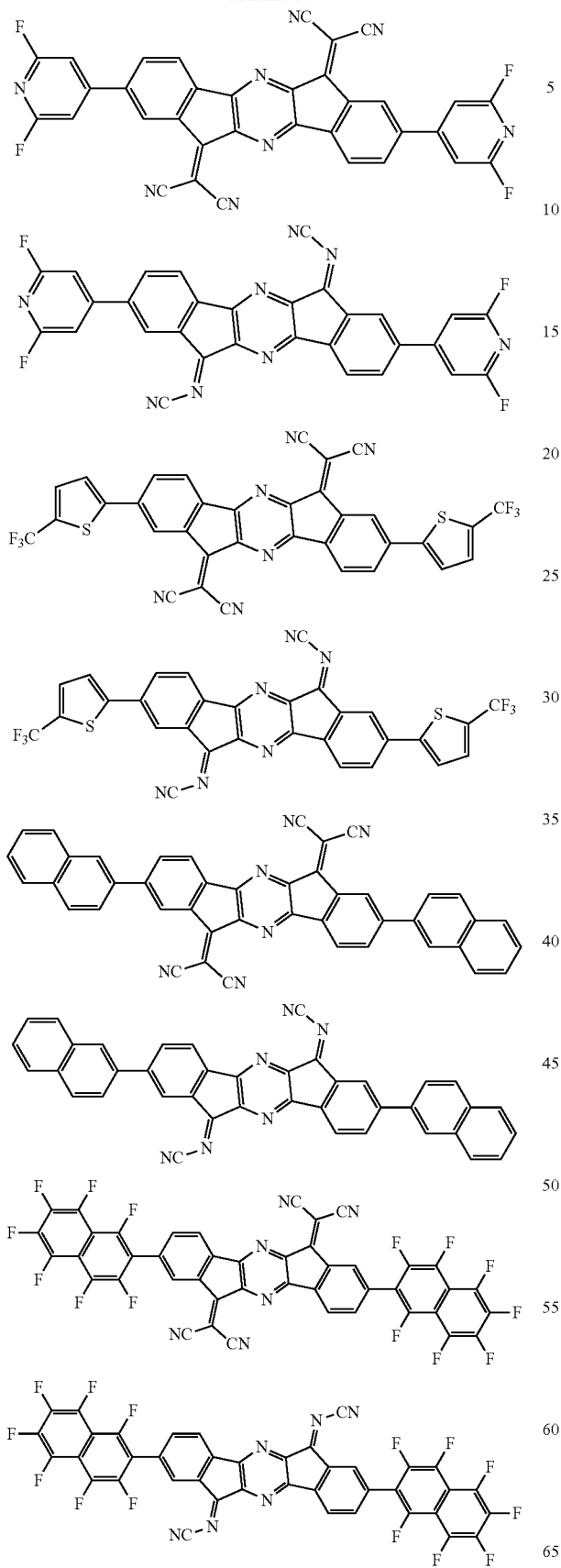
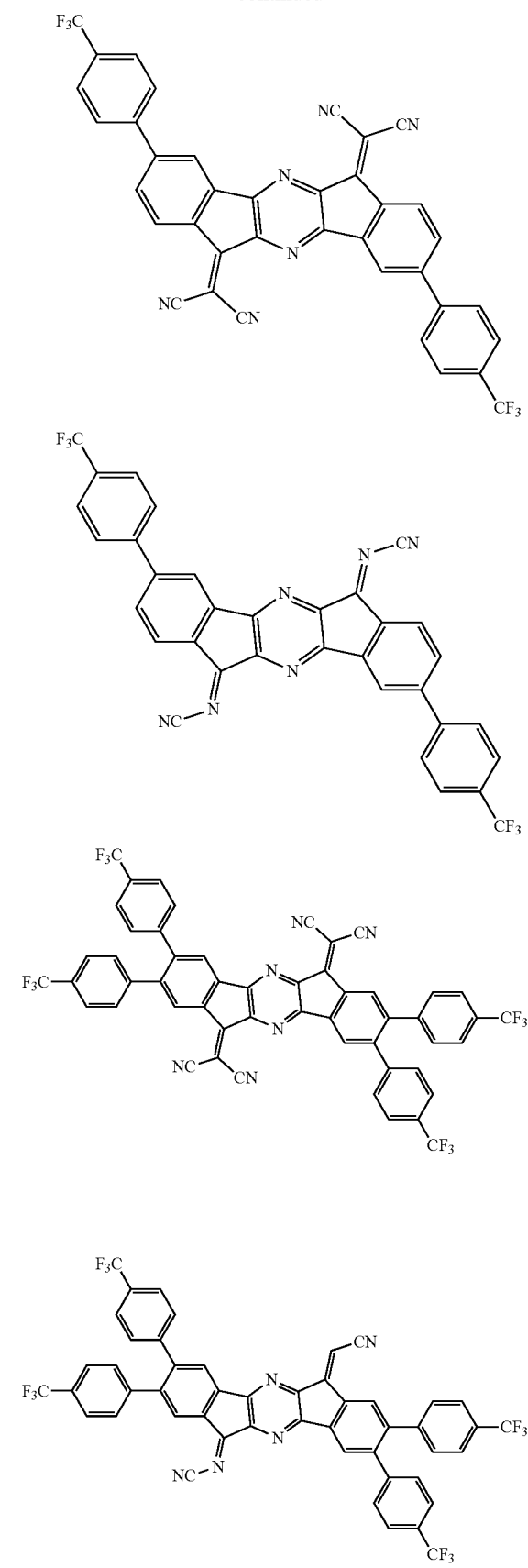

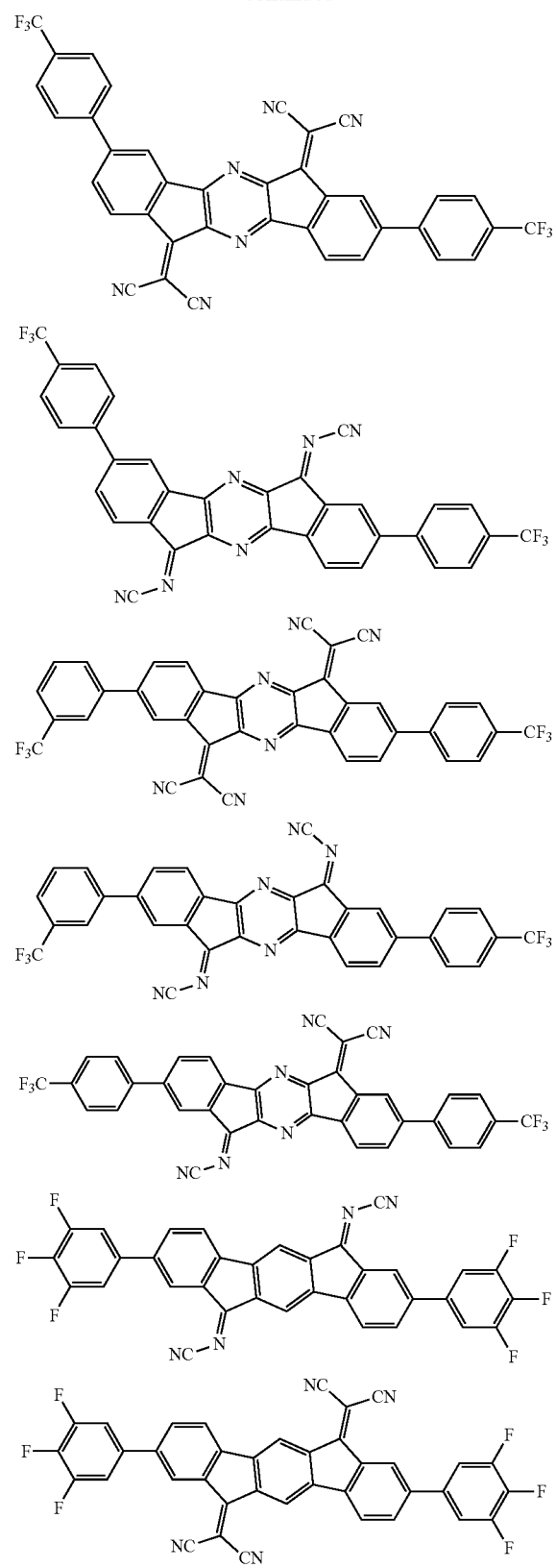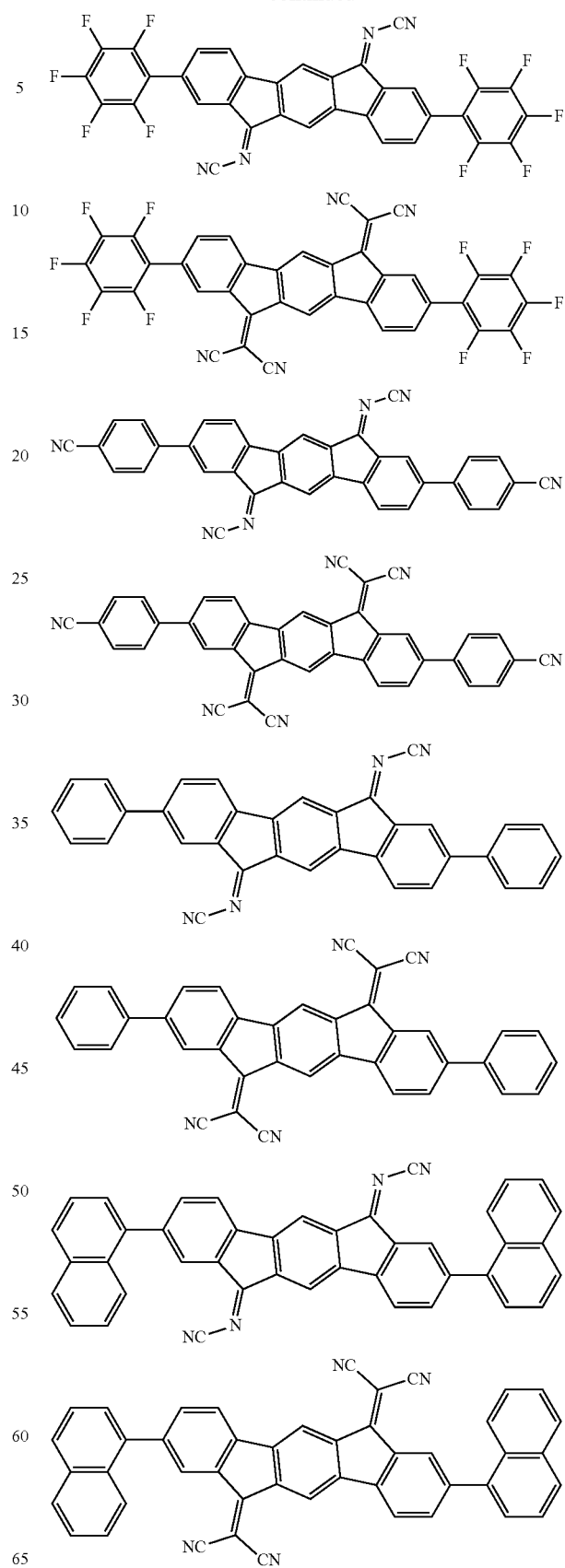

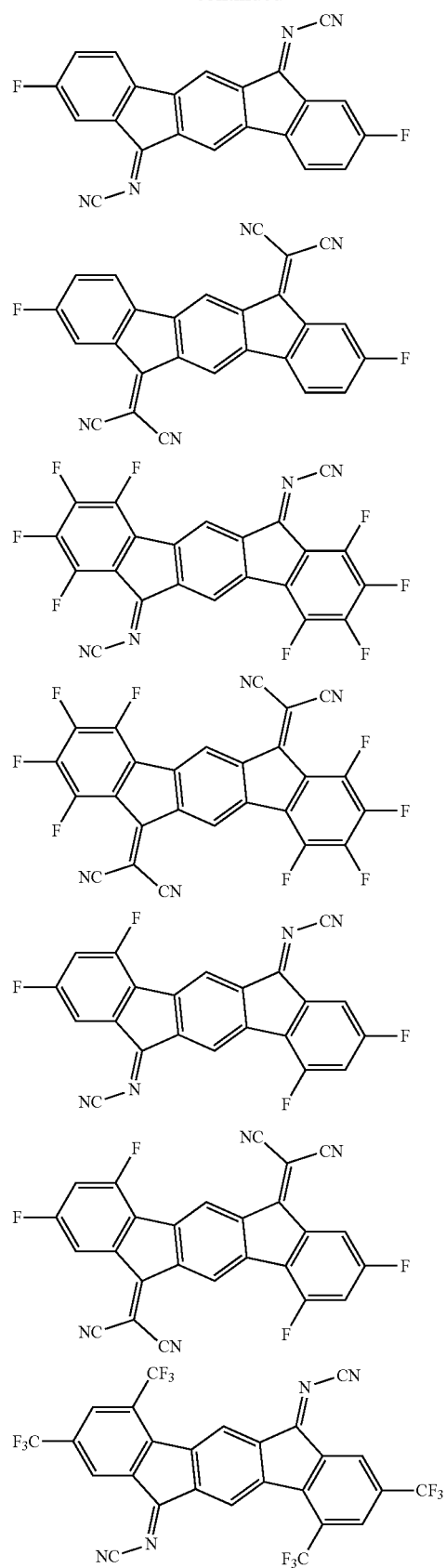
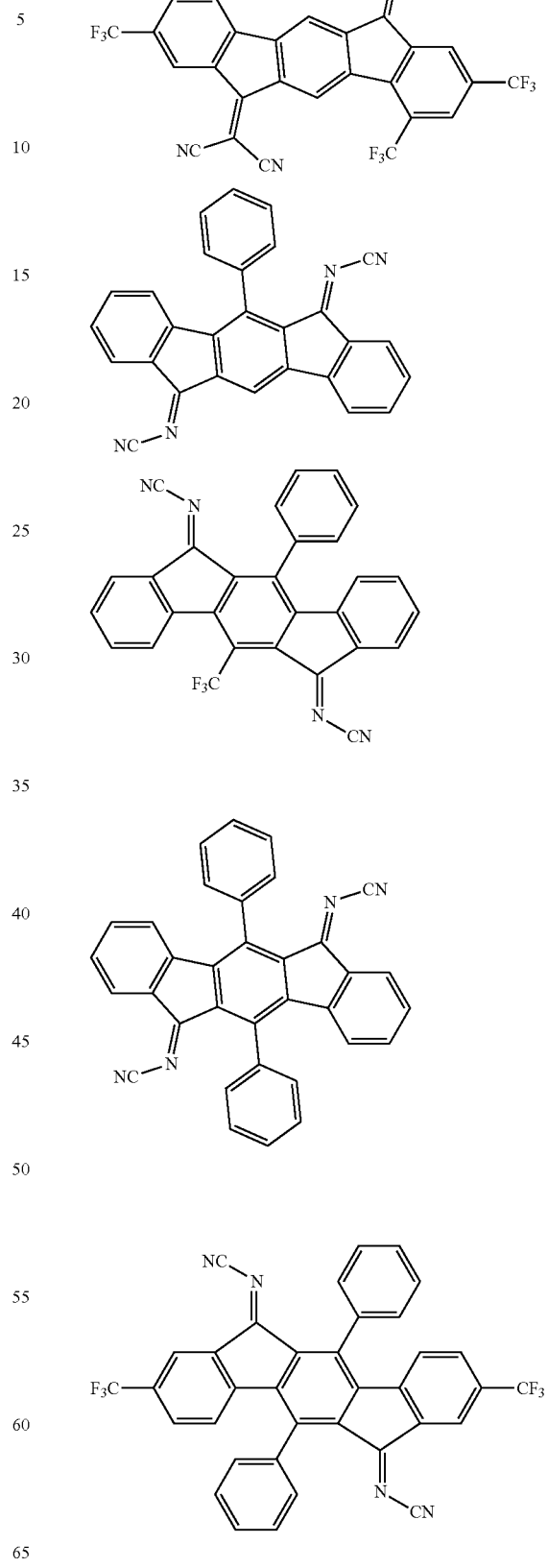

67
-continued
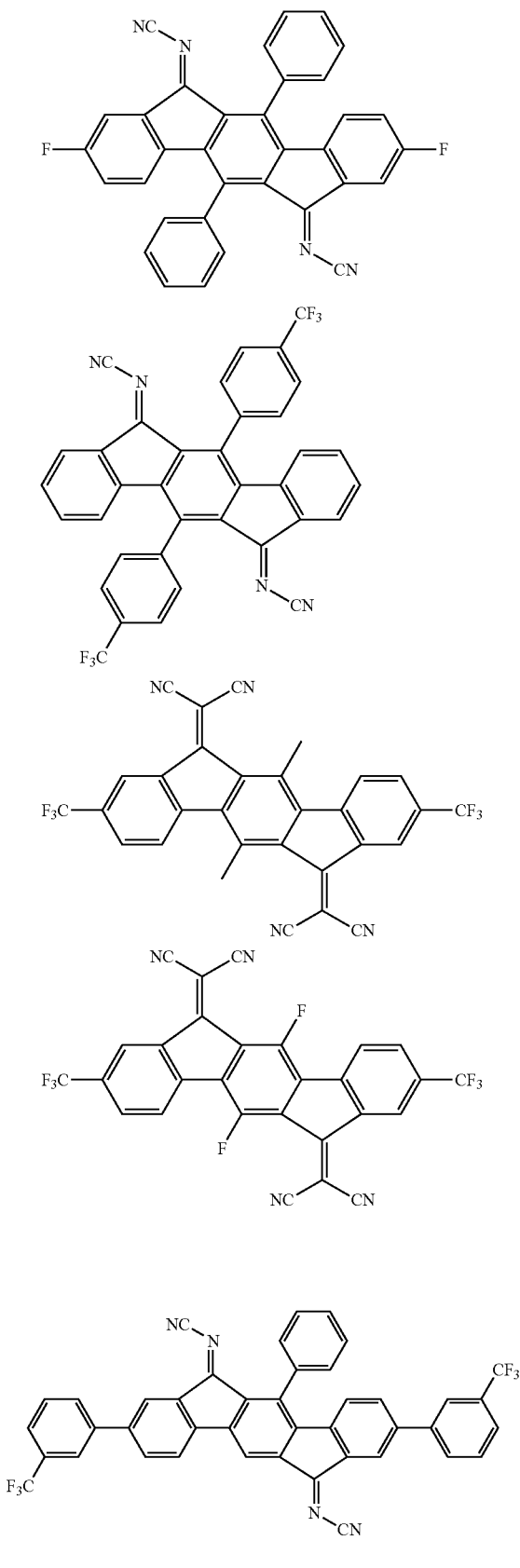
68
-continued
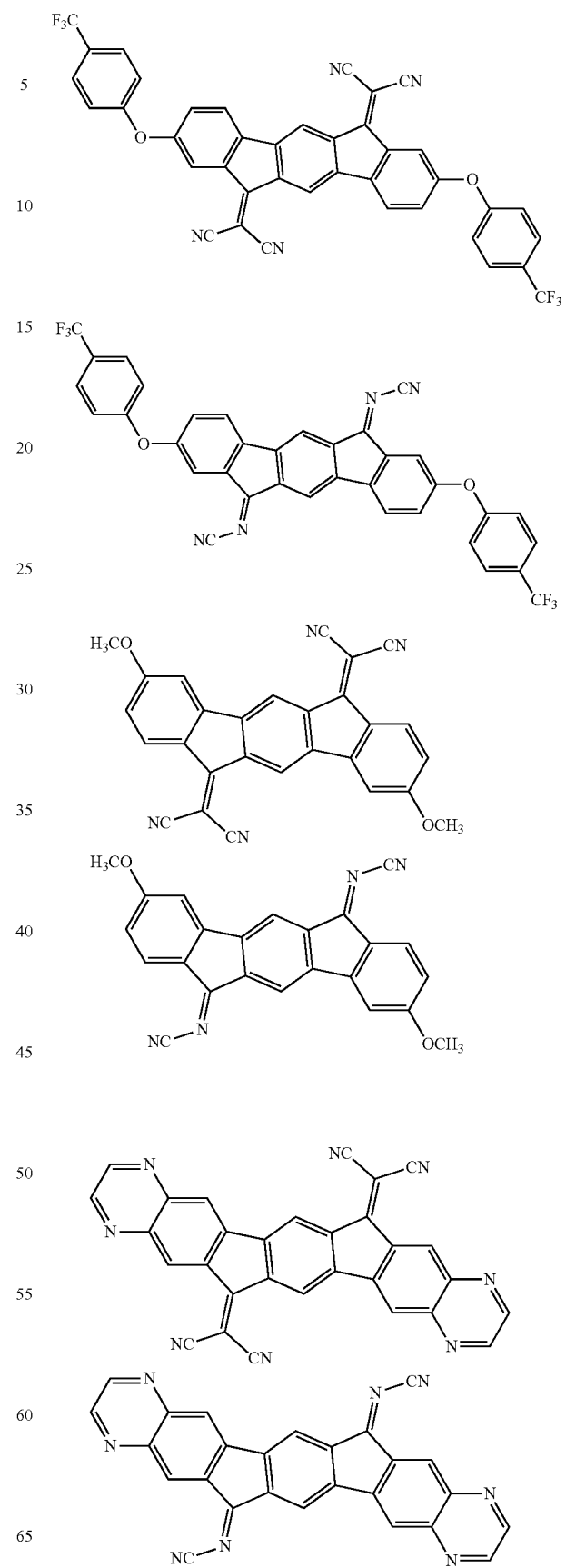

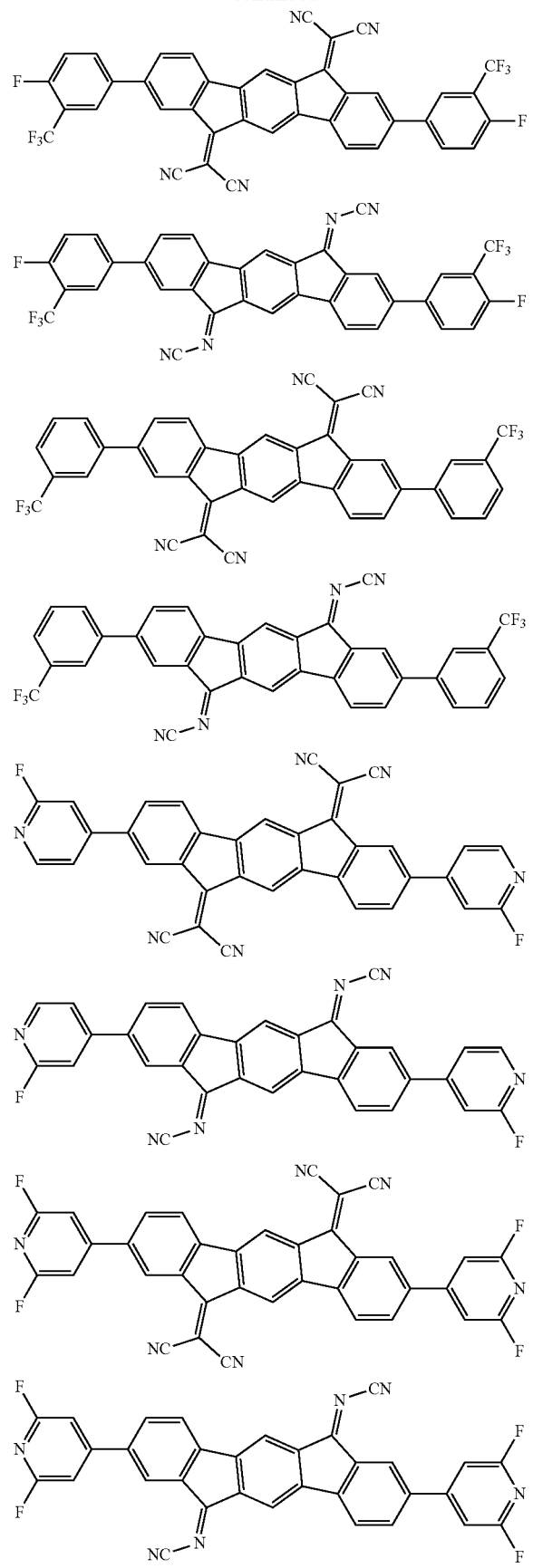
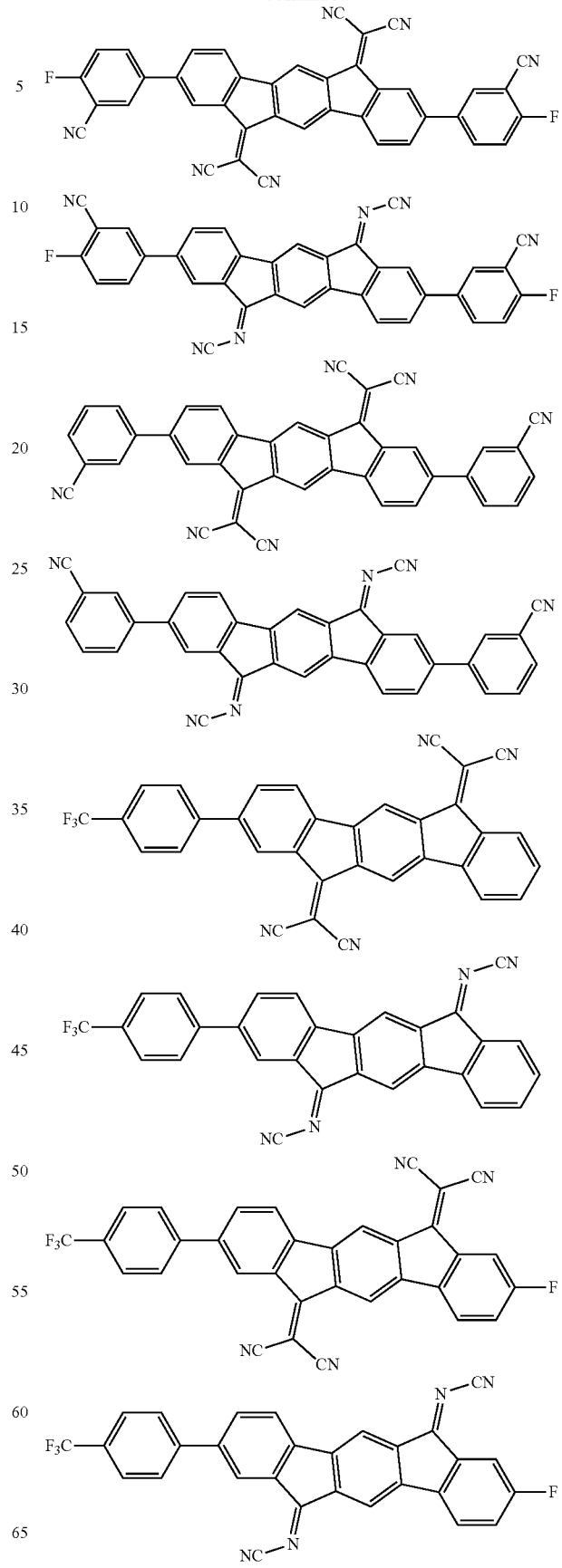

71
-continued
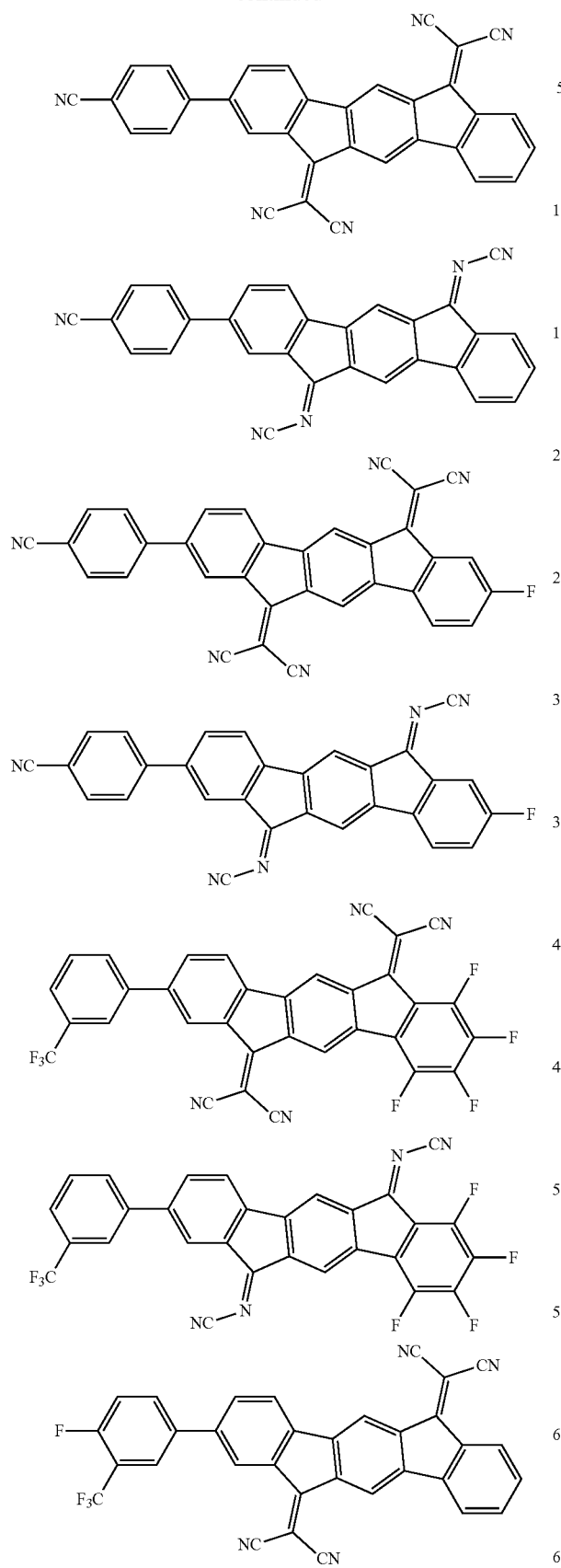
72
-continued
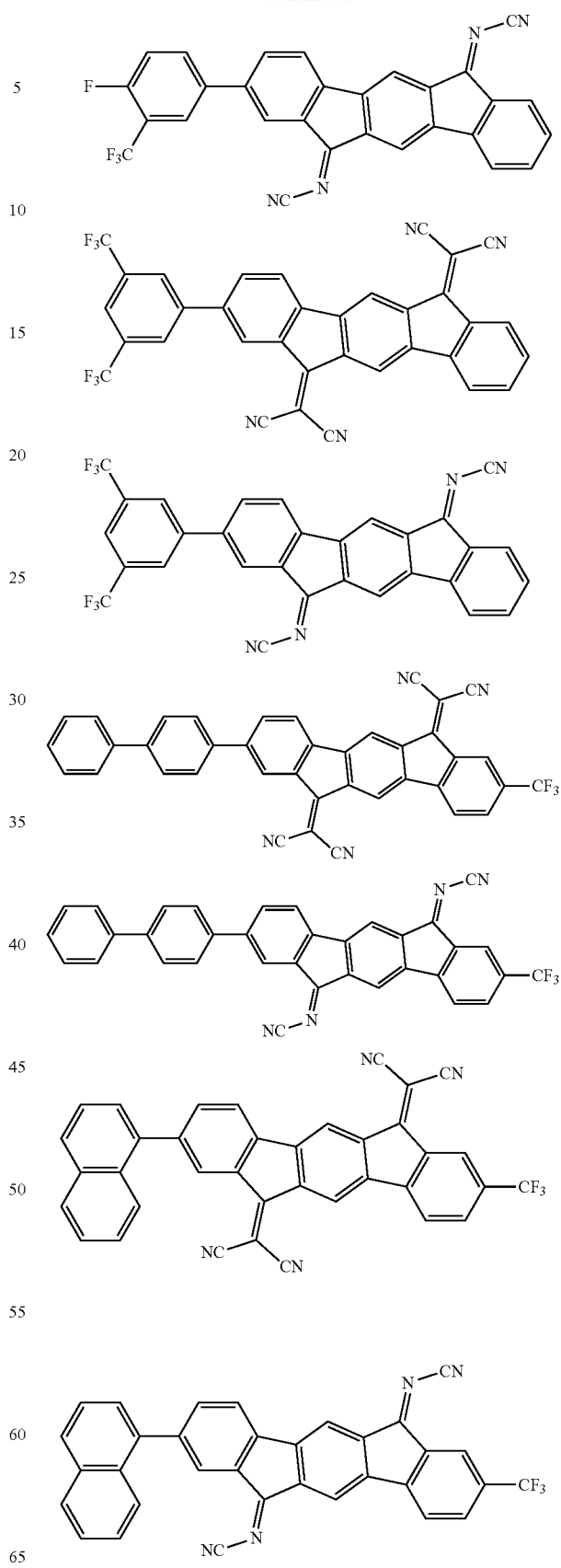

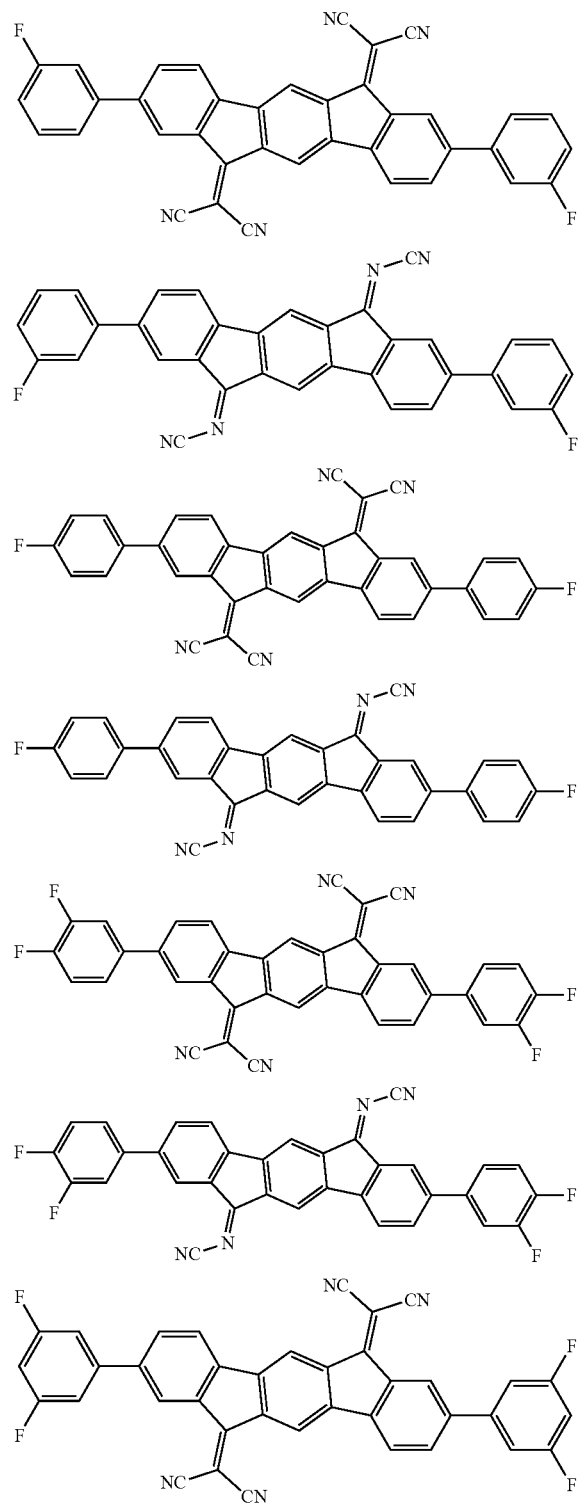
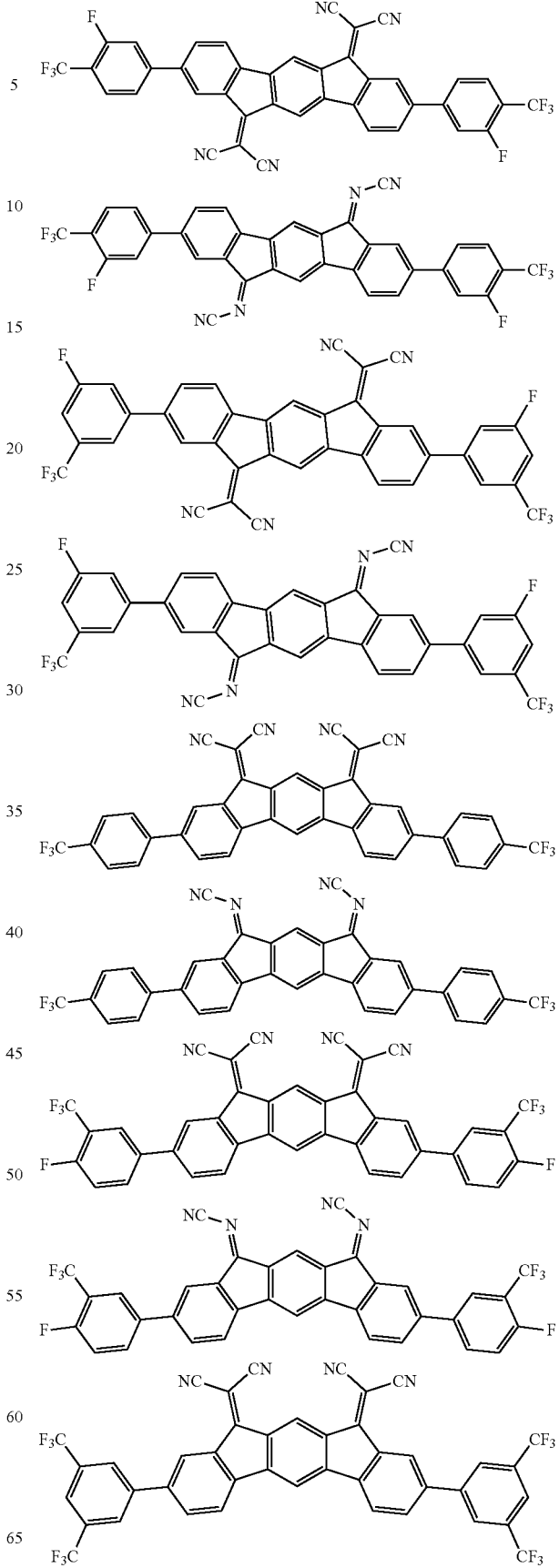

-continued
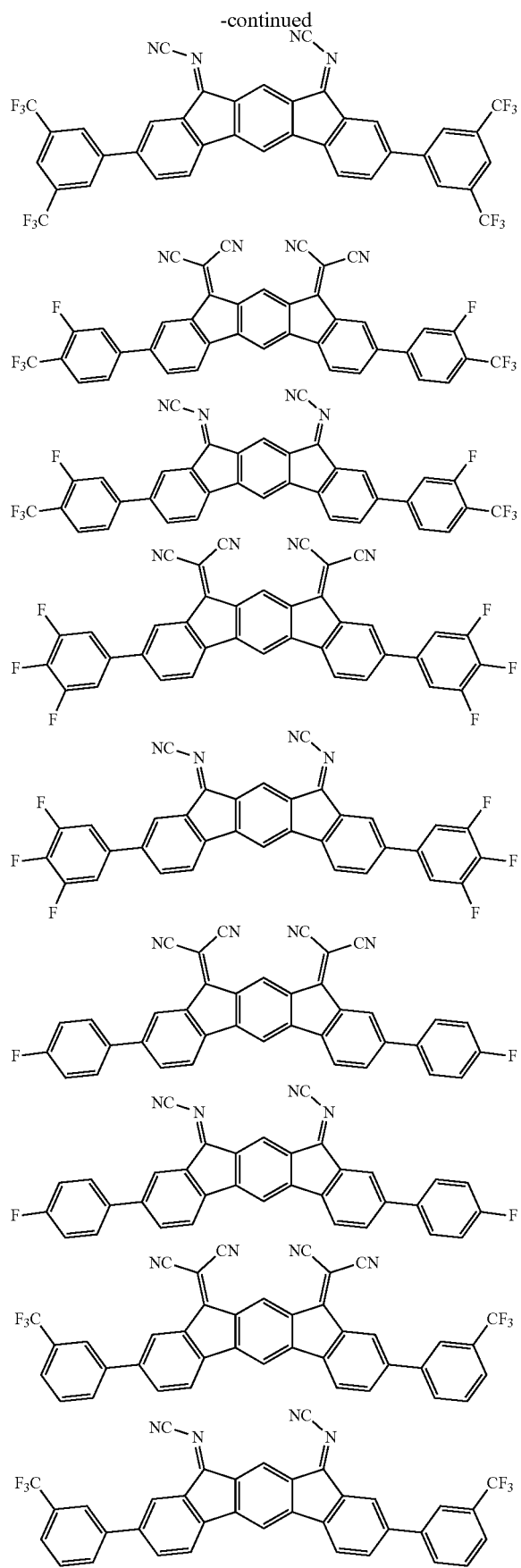
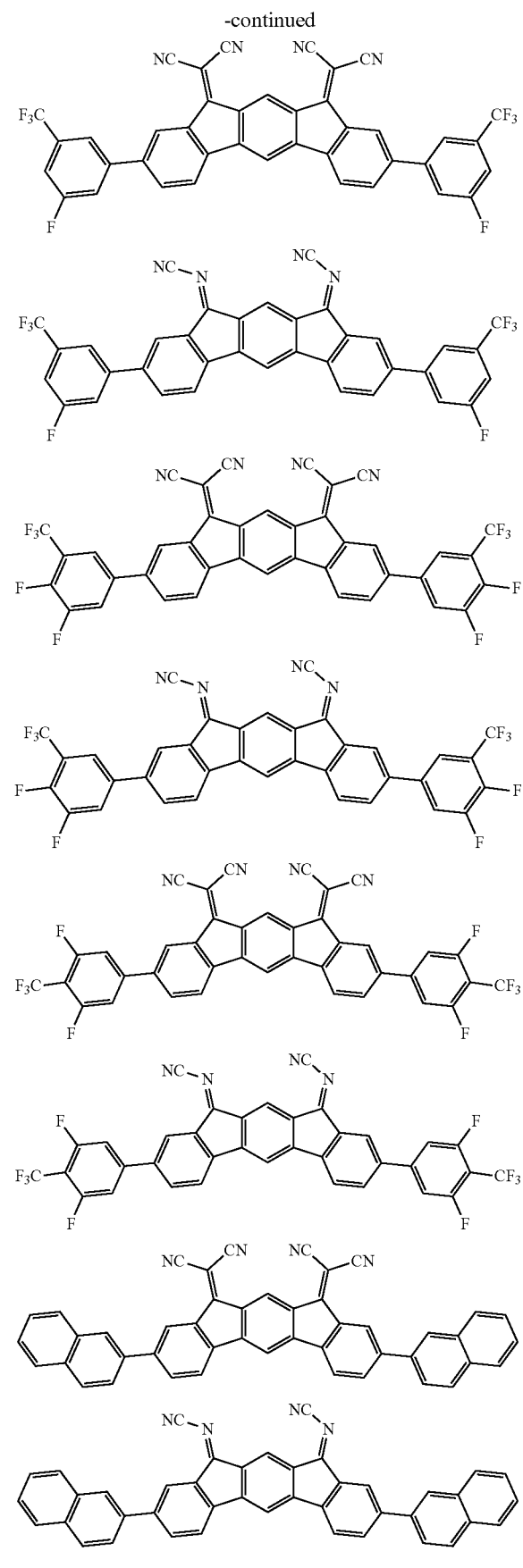

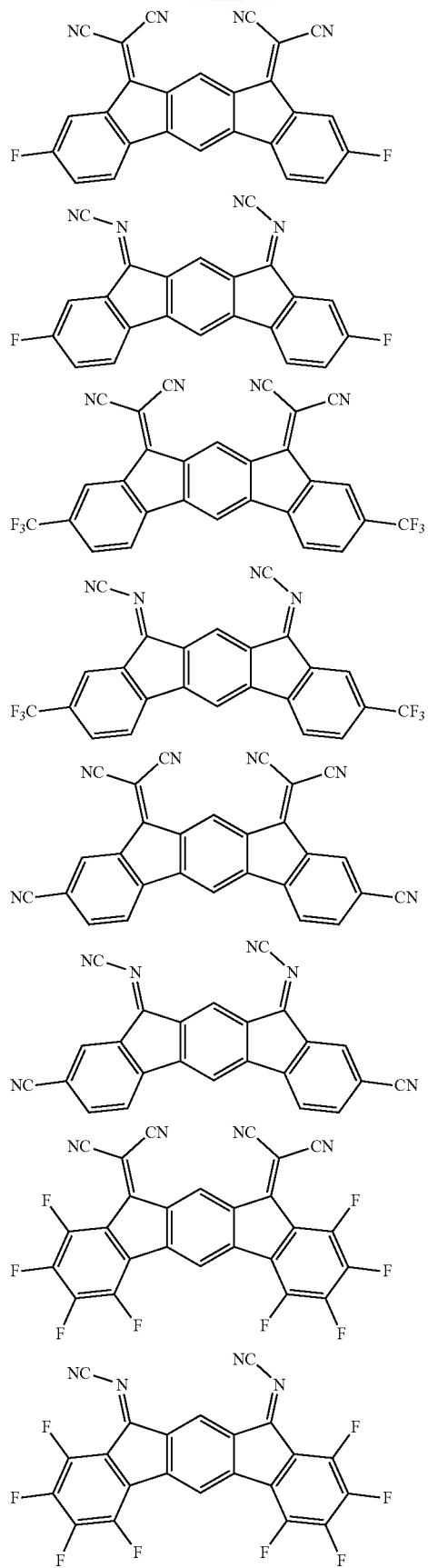
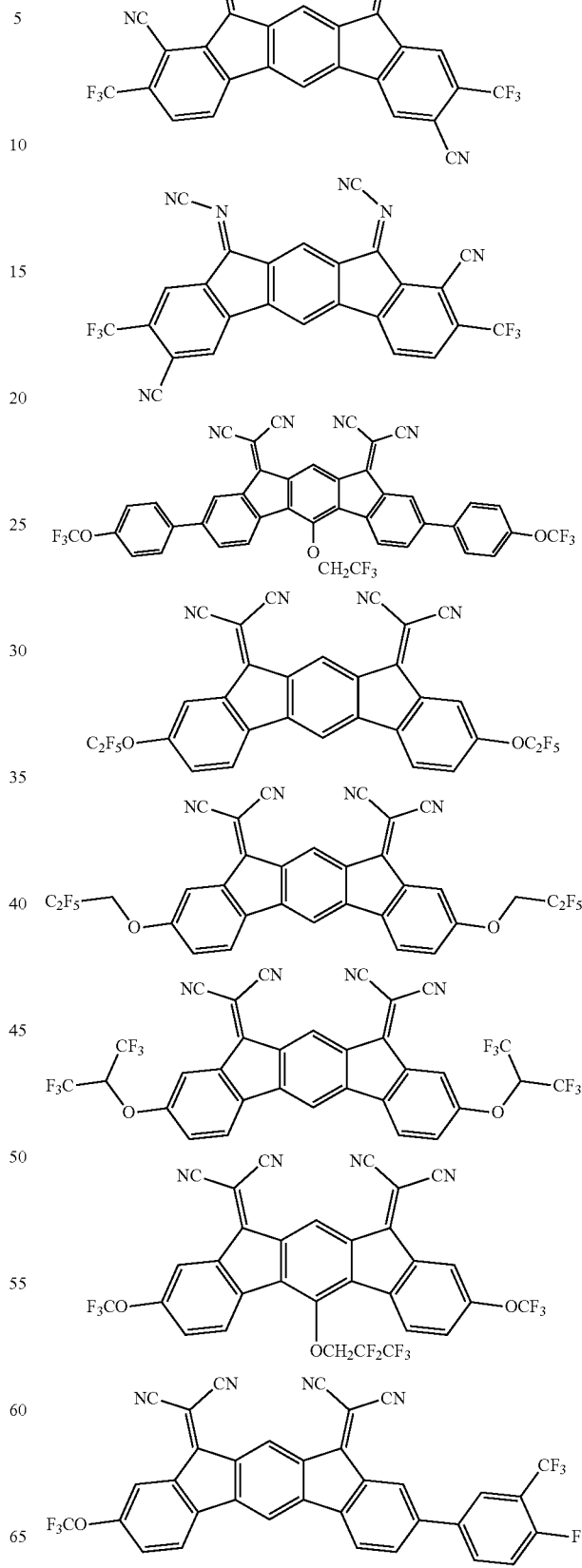

-continued

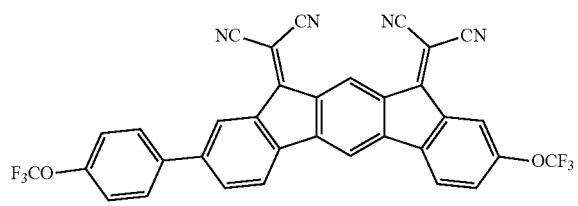

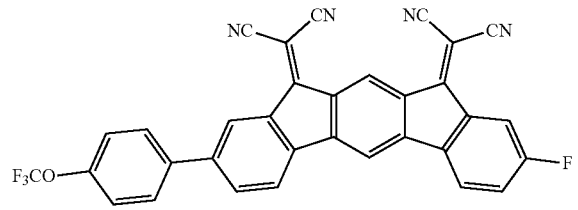

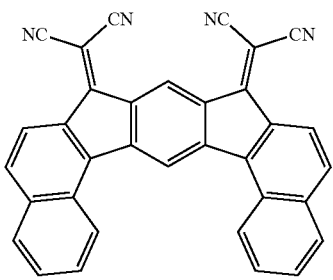

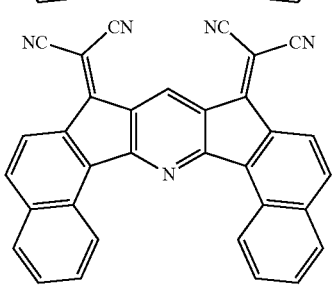

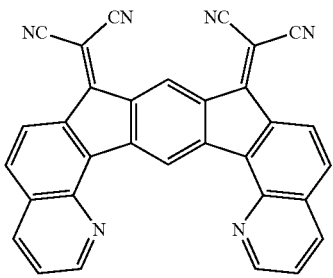

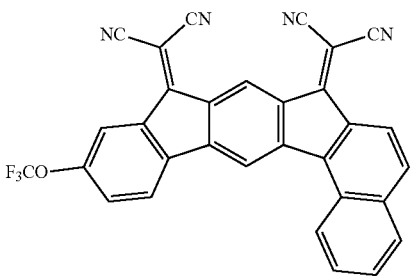

-continued

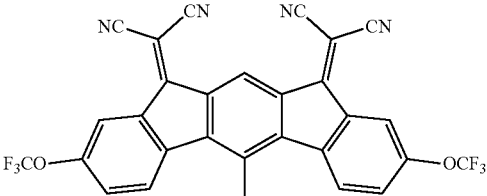

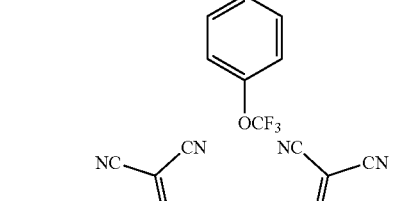

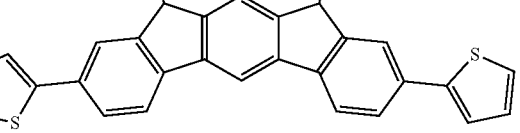

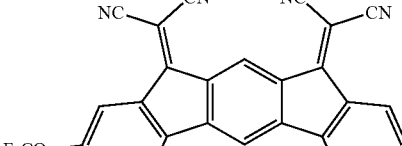

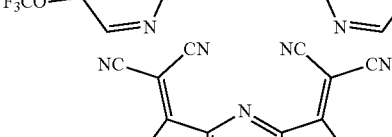

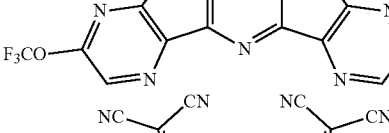

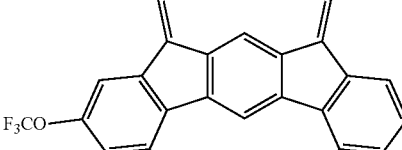

(Second Compound)

In one embodiment, the second compound is a monoamine compound having an ionization potential of 5.6 eV or more.

The ionization potential (Ip) was measured in air using a photoelectron spectrometer (manufactured by RIKEN KEIKI Co., Ltd., "AC-3"). Specifically, a material is irradiated with light, and the number of photoelectrons generated by the charge-separation is measured.

In one embodiment, the electron affinity of the first compound Af1 and the ionization potential of the second compound Ip2 satisfy the following formula (A1):

$$Af1-Ip2 \geq 0.3 \text{ (eV)} \qquad (A1)$$

The electron affinity (Af) was calculated by the following formula:

$$Af = -1.19 \times (Ere-Efc) - 4.78 \text{ eV}$$

wherein,
Ere: first reduction potential (DPV, Negative scan)
Efc: first oxidation potential of ferrocene (DPV, Positive scan), (ca. +0.55 V vs Ag/AgCl).

The redox potential was measured by a differential pulse voltammetry (DPV) method using an electrochemical analyzer (manufactured by ALS Co., Ltd.: CHI630B).
N,N-dimethylformamide (DMF) was used as a solvent, and the sample concentration was set to 1.0 mmol/L. Tetrabuthylammmonium hexafluorophosphate (TBHP) (100 mmol/L) was used as a support electrolyte. Glassy carbon and Pt were used as the working electrode and the counter electrode, respectively.
(Reference document) M. E. Thompson, et. al., Organic Electronics, 6 (2005), p. 11-20, Organic Electronics, 10 (2009), p. 515-520

In one embodiment, the electron affinity of the first compound Af1 and the ionization potential of the second compound Ip2 satisfy the following formula (A2):

$$Af1-Ip2 \geq 0.4 \text{ (eV)} \qquad (A2)$$

In one embodiment, the electron affinity of the first compound Af1 and the ionization potential of the second compound Ip2 satisfy the following formula (A3):

$$Af1-Ip2 \geq 0.5 \text{ (eV)} \qquad (A3)$$

In one embodiment, the second compound is a compound represented by the following formula (21):

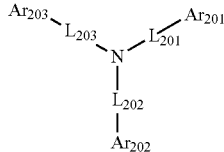

(21)

wherein in the formula (21),
$L_{201}$ to $L_{203}$ are independently
a single bond,
a substituted or unsubstituted arylene group including 6 to 18 ring carbon atoms, or
a substituted or unsubstituted divalent heterocyclic group including 5 to 13 ring atoms;
$Ar_{201}$ to $Ar_{203}$ are independently
a substituted or unsubstituted aryl group including 6 to 30 ring carbon atoms,
a substituted or unsubstituted monovalent heterocyclic group including 5 to 30 ring atoms, or
a group represented by $-Si(R'_{901})(R'_{902})(R'_{902})$;
$R'_{901}$ to $R'_{903}$ are independently a substituted or unsubstituted aryl group including 6 to 30 ring carbon atoms;
when two or more of each of $R'_{901}$ to $R'_{903}$ are present, the two or more of each of $R'_{901}$ to $R'_{903}$ may be the same as or different from each other;

the substituent R is selected from the group consisting of
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
$-Si(R_{901})(R_{902})(R_{903})$,
$-O-(R_{904})$,
$-S-(R_{905})$,
$-N(R_{906})(R_{907})$, wherein $R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms, when two or more of each of $R_{901}$ to $R_{907}$ are present, the two or more of each of $R_{901}$ to $R_{907}$ may be the same as or different from each other,
a halogen atom, a cyano group, a nitro group,
a substituted or unsubstituted aryl group including 6 to 50 ring carbon atoms, and
a substituted or unsubstituted monovalent heterocyclic group including 5 to 50 ring atoms; and
when two or more substituents R are present, the two or more substituents R may be the same as or different from each other.

In one embodiment, one or more of $Ar_{201}$ to $Ar_{203}$ are groups represented by the following formula (21A):

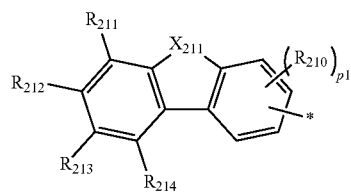

(21A)

wherein in the formula (21A), * represents a bonding site;
$X_{211}$ is $CR_{221}R_{222}$, $NR_{223}$, O, or S;
$R_{221}$ and $R_{222}$ form a substituted or unsubstituted, saturated or unsaturated ring by bonding with each other, or do not form a substituted or unsubstituted, saturated or unsaturated ring;
one or more sets of adjacent two or more of $R_{210}$ to $R_{214}$ are bonded to each other to form a substituted or unsubstituted, saturated or unsaturated ring, or do not form a substituted or unsubstituted, saturated or unsaturated ring;
$R_{223}$, and $R_{210}$ to $R_{214}$, $R_{221}$ and $R_{222}$ which do not form a substituted or unsubstituted, saturated or unsaturated ring are independently a hydrogen atom or a substituent R;
p1 is 3, and three $R_{210}$'s may be the same as or different from each other; and the substituent R is as defined in the formula (21).

In one embodiment, two or more of $Ar_{201}$ to $Ar_{203}$ are groups represented by the formula (21A).

In one embodiment, two or more of $Ar_{201}$ to $Ar_{203}$ are groups represented by the formula (21A), and the two or more of each of groups represented by the formula (21A) are different from each other.

In one embodiment, $Ar_{201}$ is a group represented by the formula (21A); and $L_{201}$ is a single bond.

In one embodiment, $Ar_{202}$ is a group represented by the formula (21A); and $L_{202}$ is a single bond.

In one embodiment, $Ar_{203}$ is a group represented by the formula (21A); $L_{203}$ is a single bond.

In one embodiment, the group represented by the formula (21A) is a group represented by the following formula (22A):

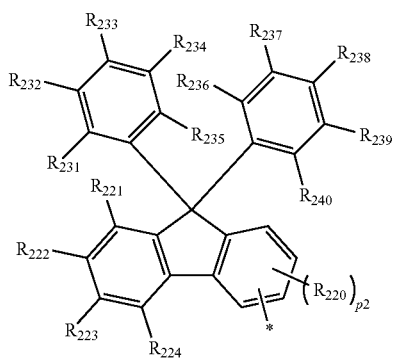

(22A)

wherein in the formula (22A), * represents a bonding site;

one or more sets of adjacent two or more of $R_{220}$ to $R_{224}$ and $R_{231}$ to $R_{240}$ form a substituted or unsubstituted, saturated or unsaturated ring by bonding with each other, or do not form a substituted or unsubstituted, saturated or unsaturated ring;

$R_{220}$ to $R_{224}$ and $R_{231}$ to $R_{240}$ which do not form a substituted or unsubstituted, saturated or unsaturated ring are independently a hydrogen atom or a substituent R;

p2 is 3, and three $R_{220}$'s may be the same as or different from each other; and the substituent R is as defined in the formula (21).

In one embodiment, the second compound is a compound represented by the following formula (31):

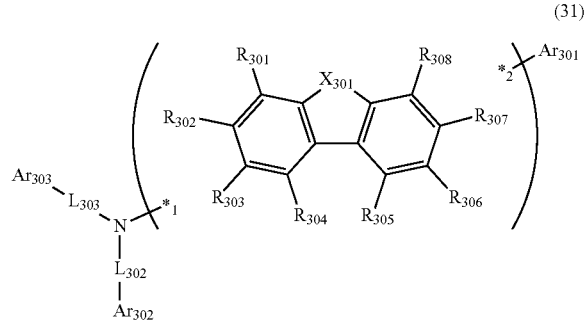

(31)

wherein in the formula (31), *1 and *2 represent bond sites;

$X_{301}$ is $CR_{311}R_{312}$, $NR_{313}$, O, or S;

two of $R_{301}$ to $R_{308}$ and $R_{311}$ to $R_{313}$ are respectively single bonds bonding with an N atom and $Ar_{301}$;

$R_{301}$ to $R_{308}$ and $R_{311}$ to $R_{313}$ which are not single bonds bonded with an N atom and $Ar_{301}$ are independently a hydrogen atom or a substituent R;

$L_{302}$ and $L_{303}$ are independently a single bond, a substituted or unsubstituted arylene group including 6 to 18 ring carbon atoms, or a substituted or unsubstituted divalent heterocyclic group including 5 to 13 ring atoms;

$Ar_{301}$ to $Ar_{303}$ are independently a substituted or unsubstituted aryl group including 6 to 30 ring carbon atoms, a substituted or unsubstituted monovalent heterocyclic group including 5 to 30 ring atoms, or a group represented by $-Si(R'_{901})(R'_{902})(R'_{902})$;

$R'_{901}$ to $R'_{903}$ are independently a substituted or unsubstituted aryl group including 6 to 30 ring carbon atoms;

when two or more of each of $R'_{901}$ to $R'_{903}$ are present, the two or more of each of $R'_{901}$ to $R'_{903}$ may be the same as or different from each other;

provided that at least one of $Ar_{301}$ to $Ar_{303}$ is a substituted or unsubstituted fused aryl group including 10 to 30 ring carbon atoms, or a substituted or unsubstituted monovalent fused heterocyclic group including 10 to 50 ring atoms;

the substituent R is selected from the group consisting of a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, wherein $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms, when two or more of each of $R_{901}$ to $R_{907}$ are present, the two or more of each of $R_{901}$ to $R_{907}$ may be the same as or different from each other, a halogen atom, a cyano group, a nitro group, a substituted or unsubstituted aryl group including 6 to 50 ring carbon atoms, and a substituted or unsubstituted monovalent heterocyclic group including 5 to 50 ring atoms; and when two or more substituents R are present, the two or more substituents R may be the same as or different from each other;

The second compound can be synthesized by using known alternative reactions or raw materials tailored to the target compound.

Specific examples of the second compound will be described below, but these are merely examples, and the second compound is not limited to the following specific examples.

85
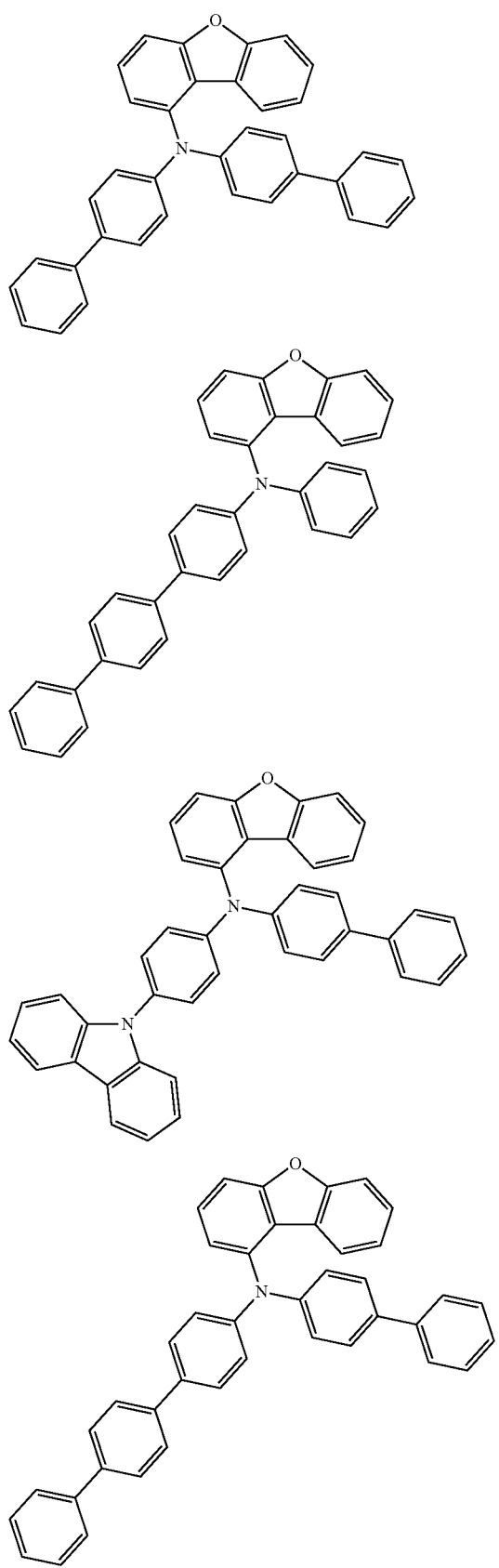
86
-continued
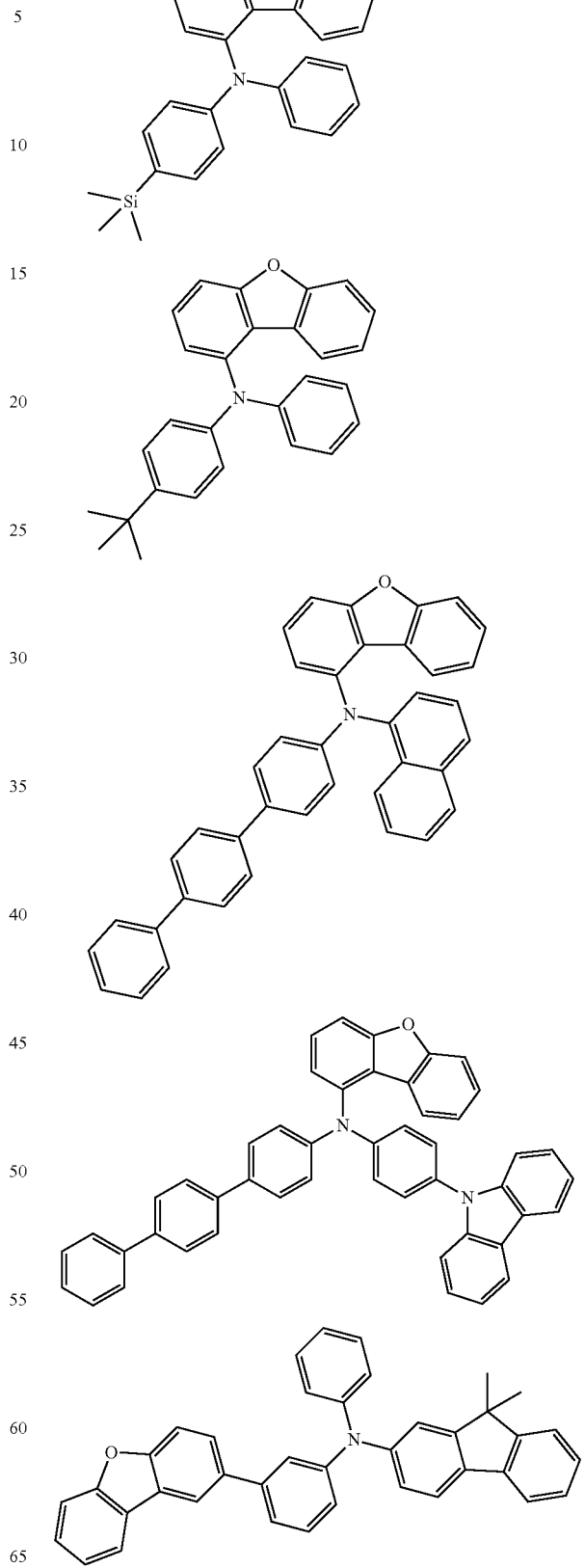

87
-continued
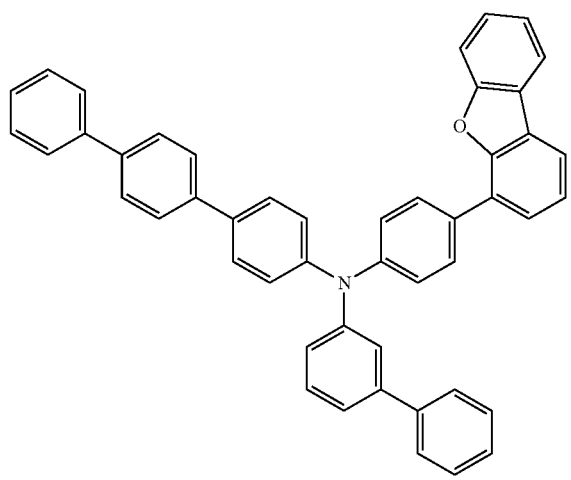
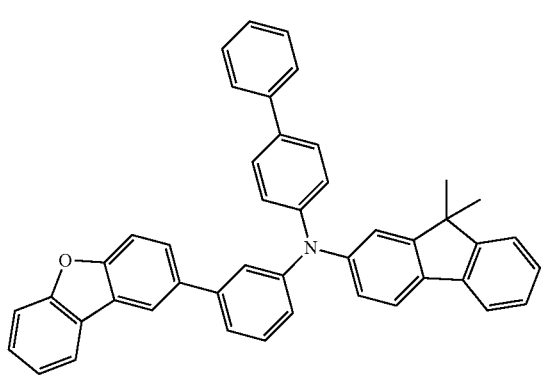
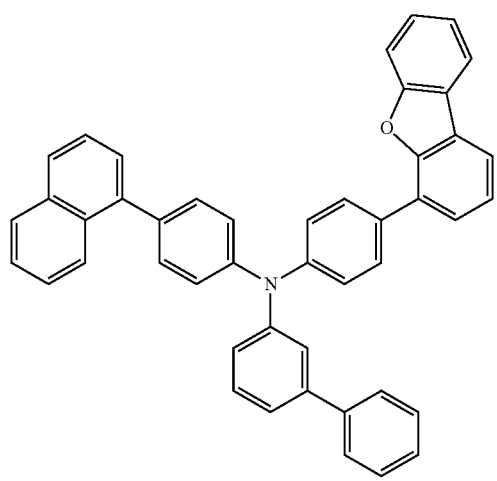
88
-continued
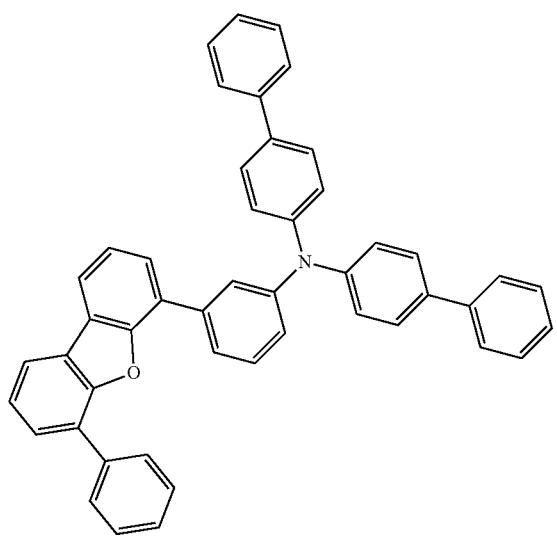
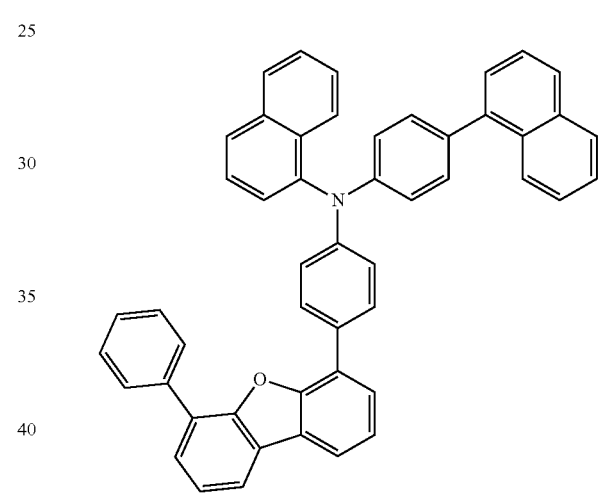
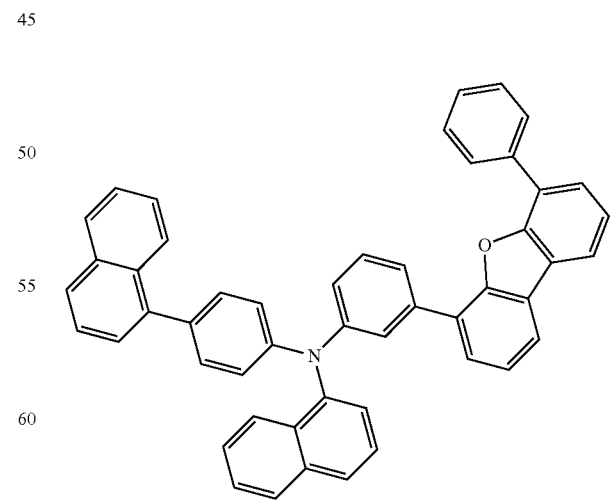

89
-continued
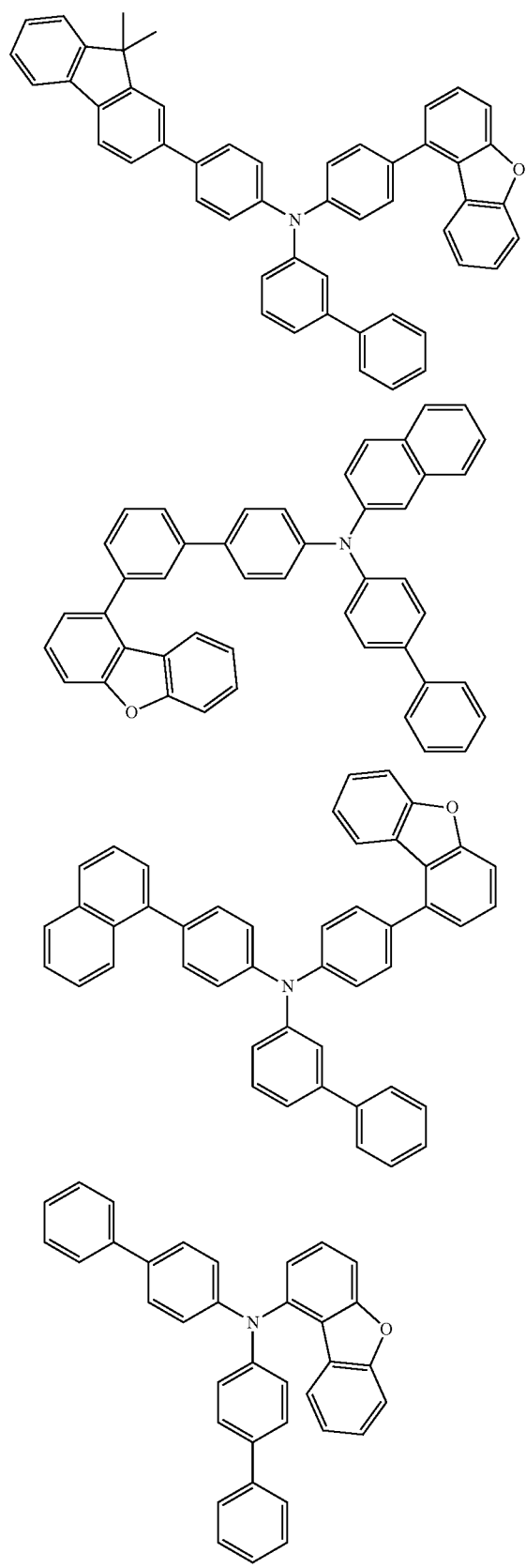
90
-continued
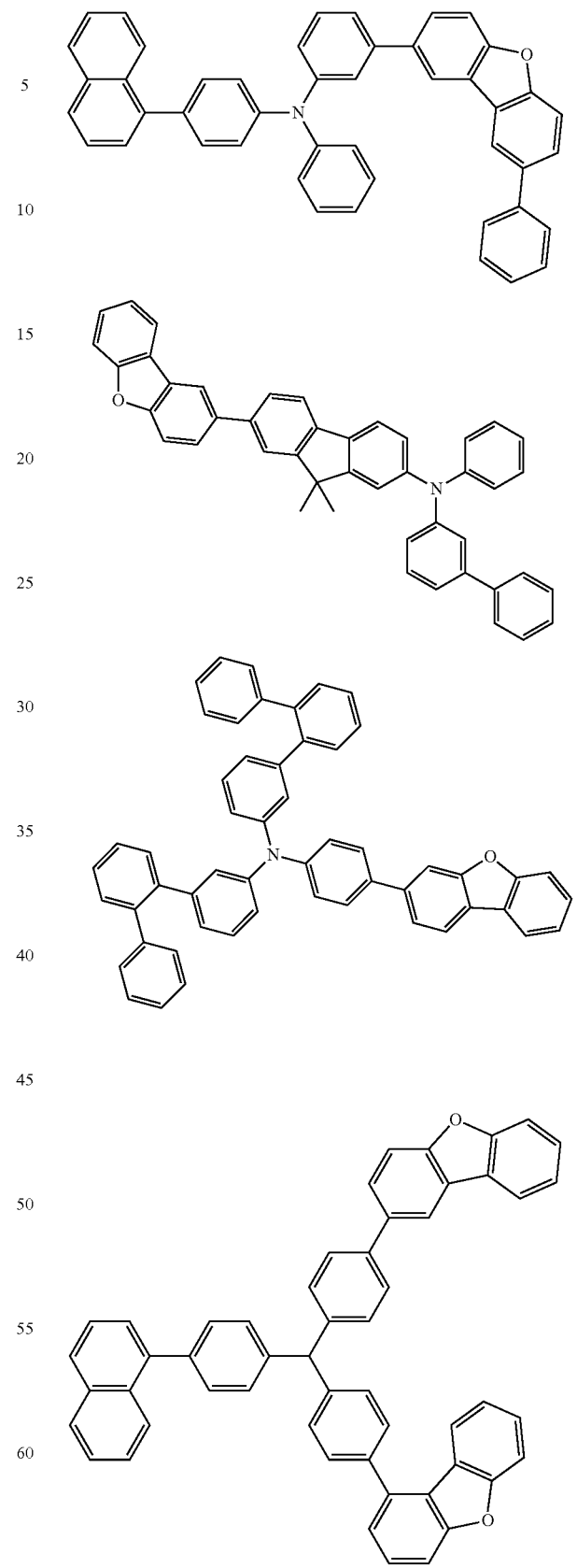

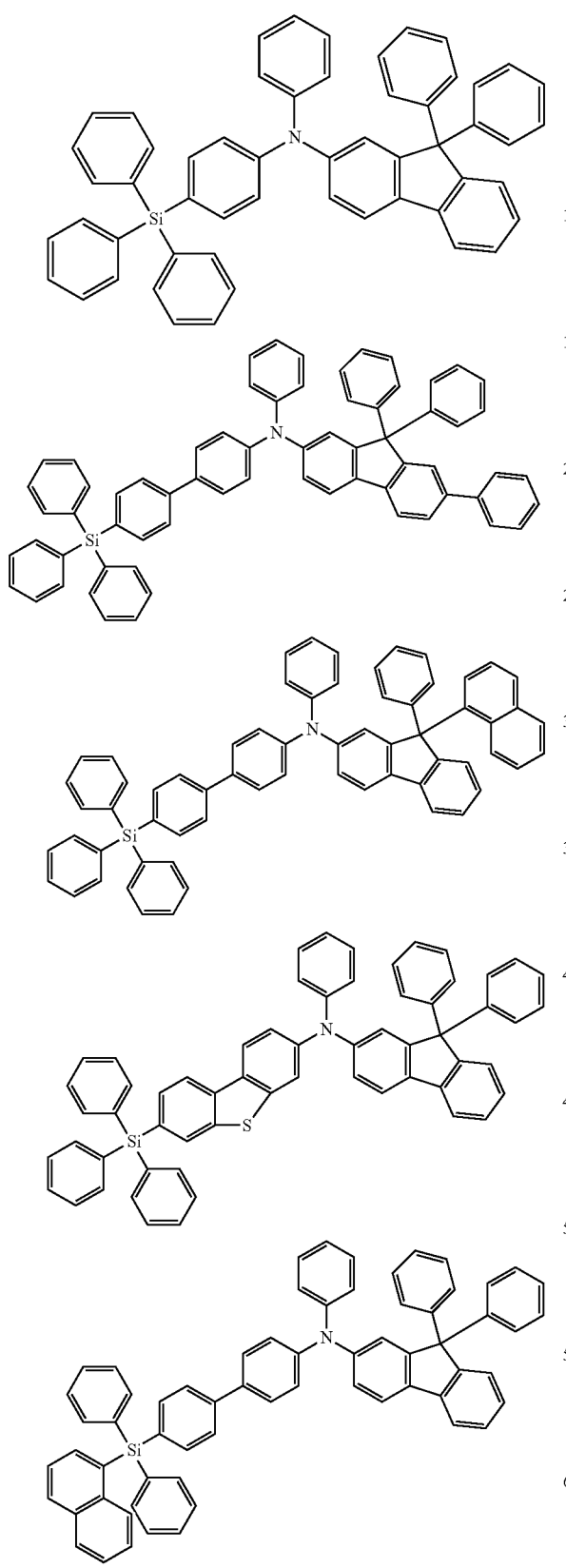
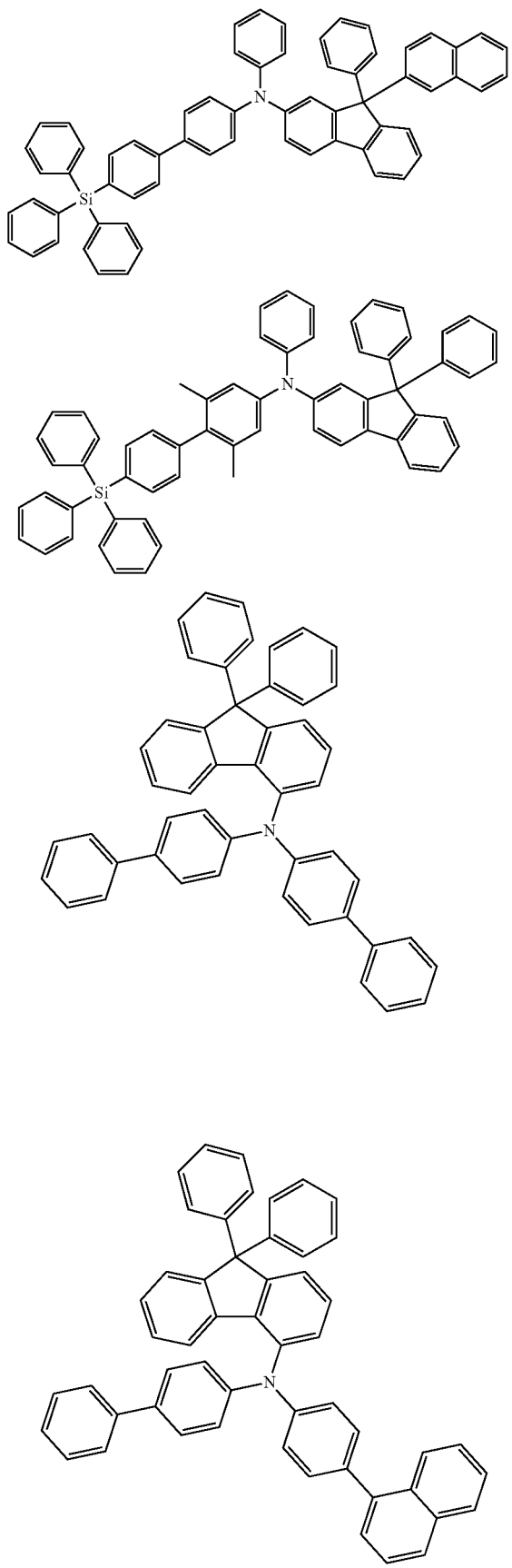

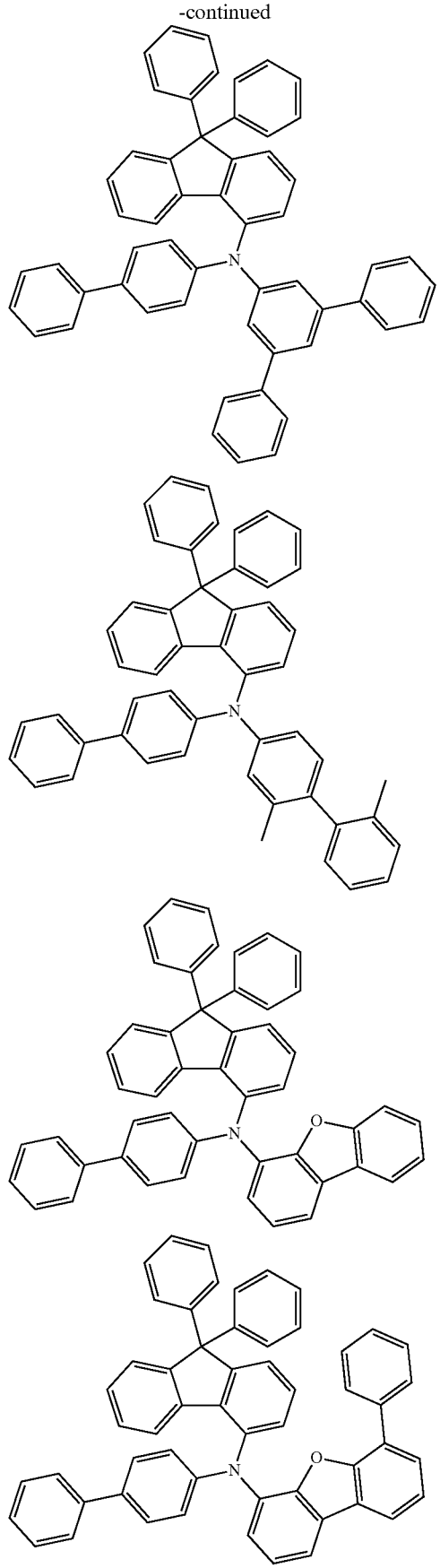
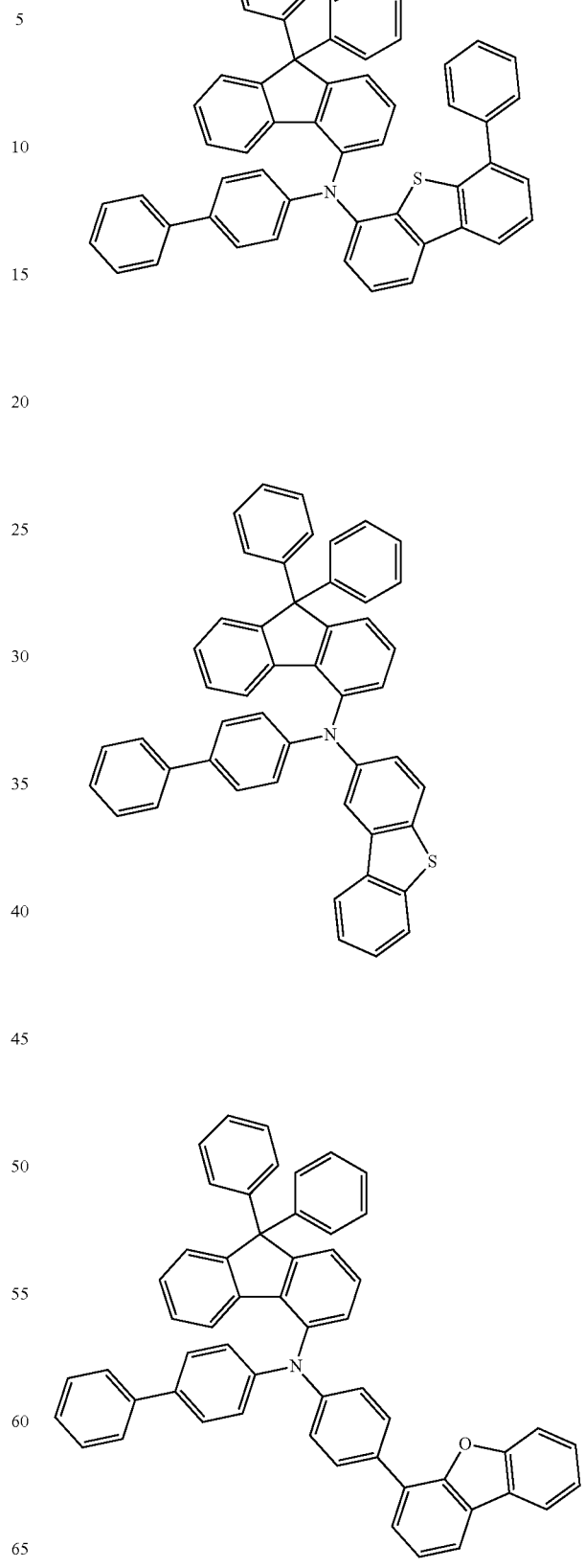

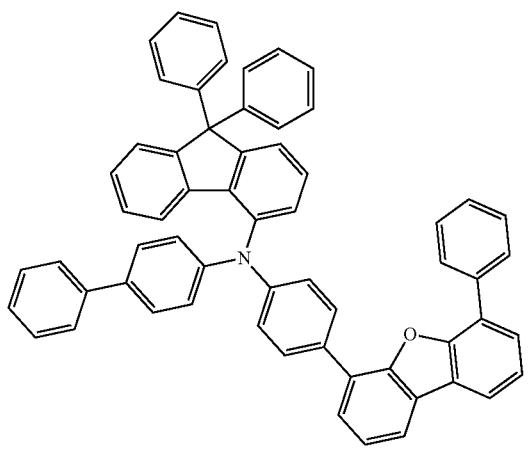
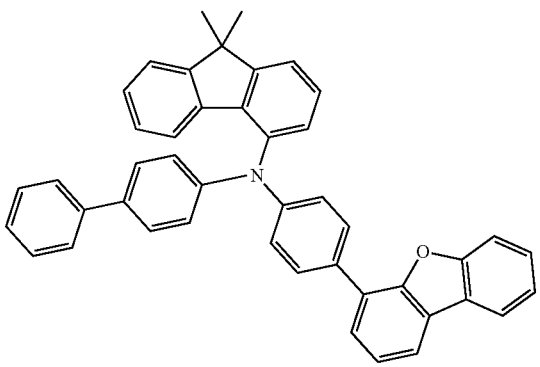
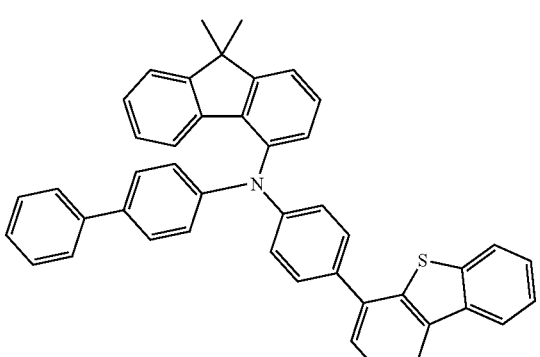
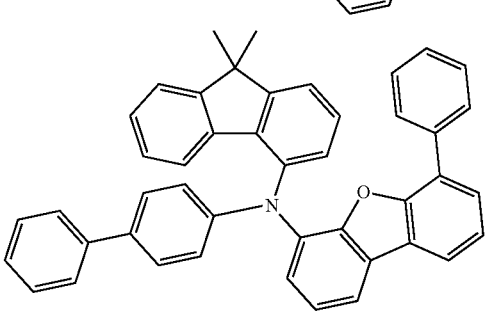
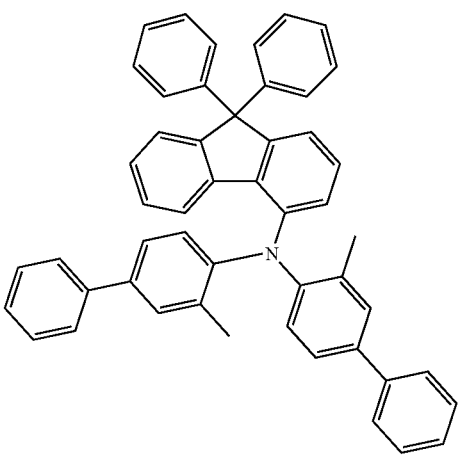

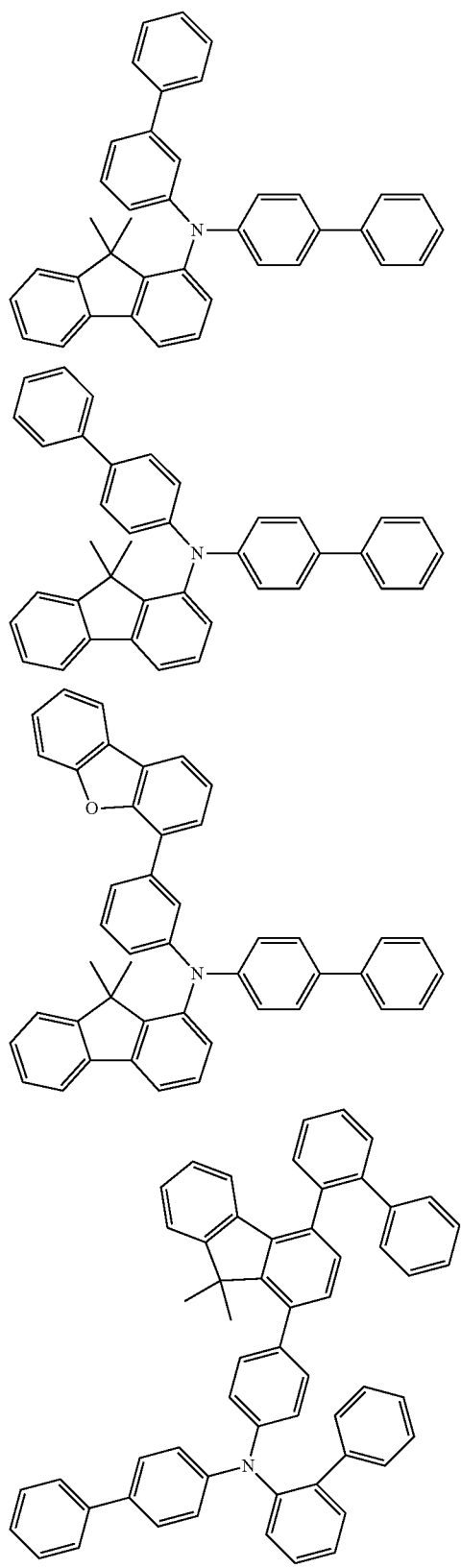
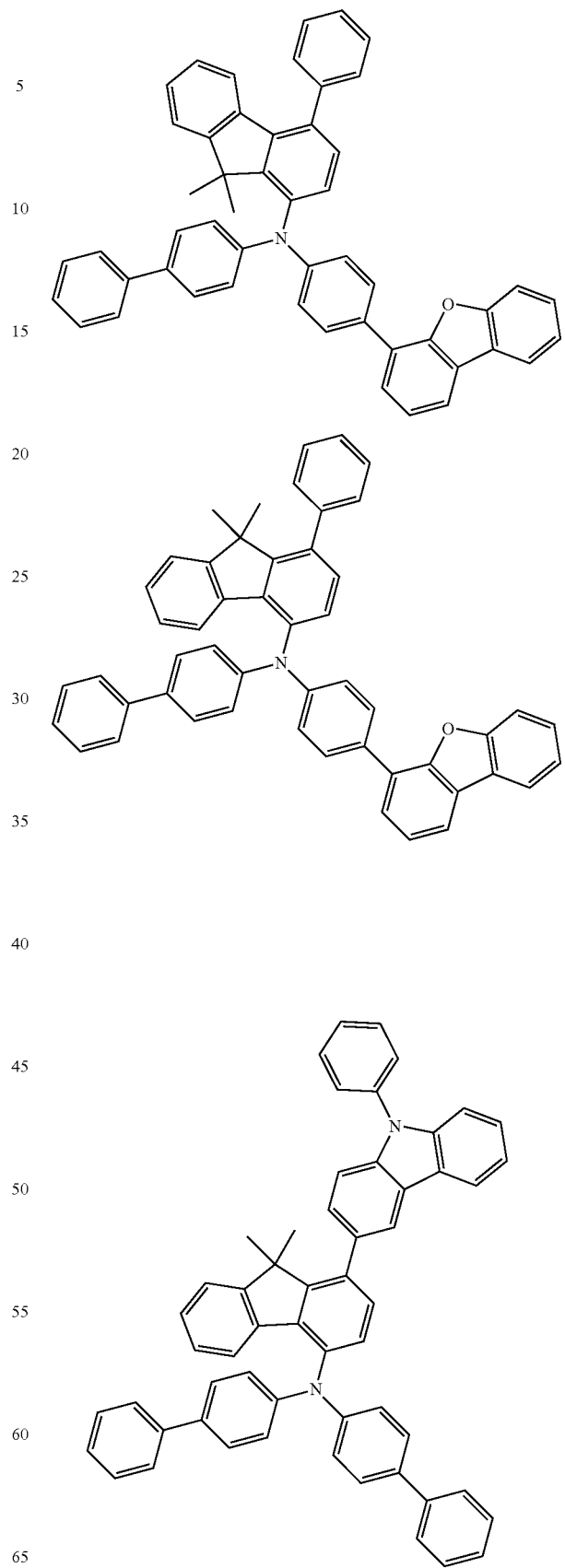

99
-continued
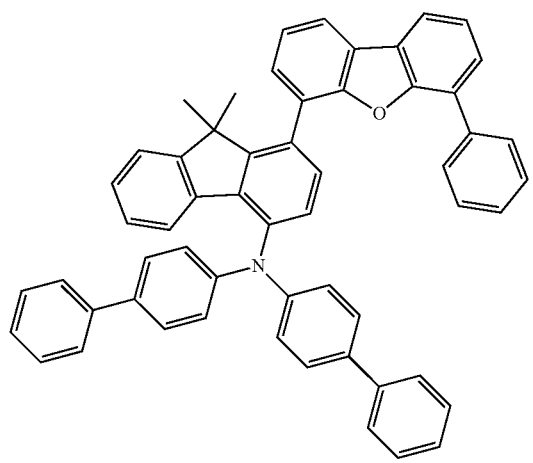
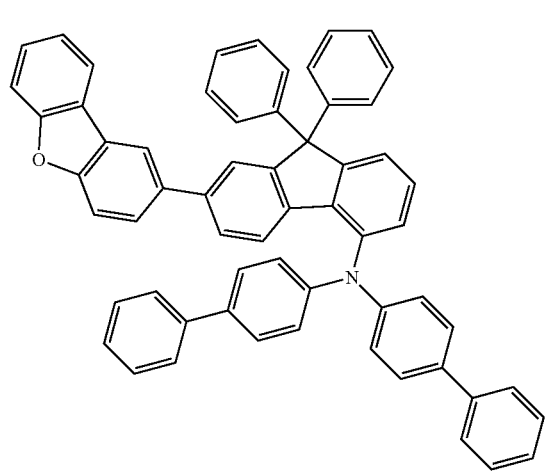
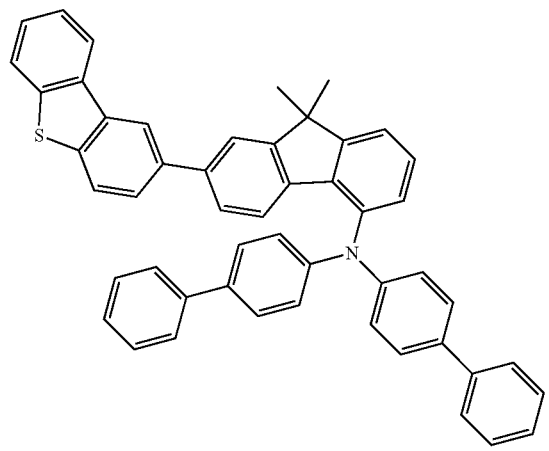
100
-continued
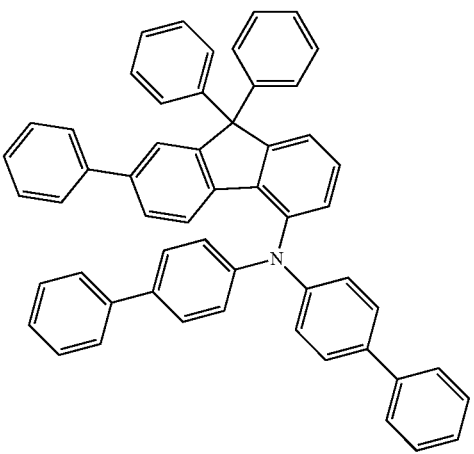
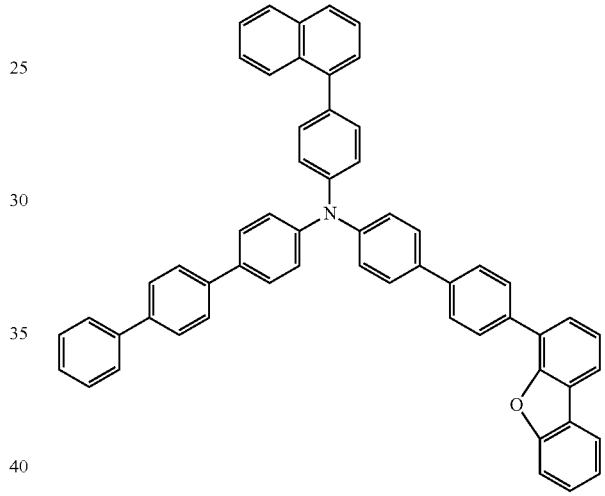
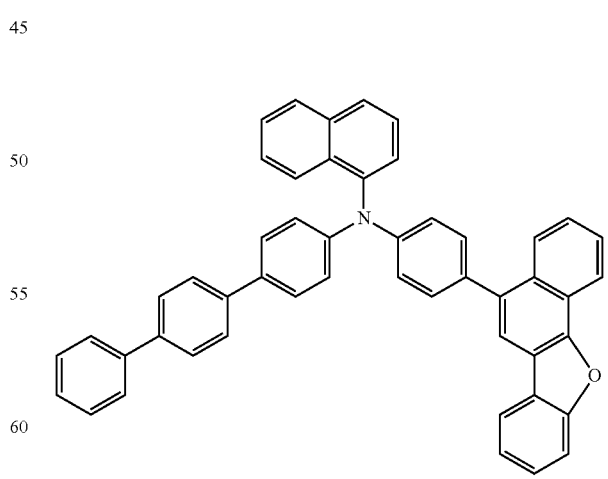

101
-continued
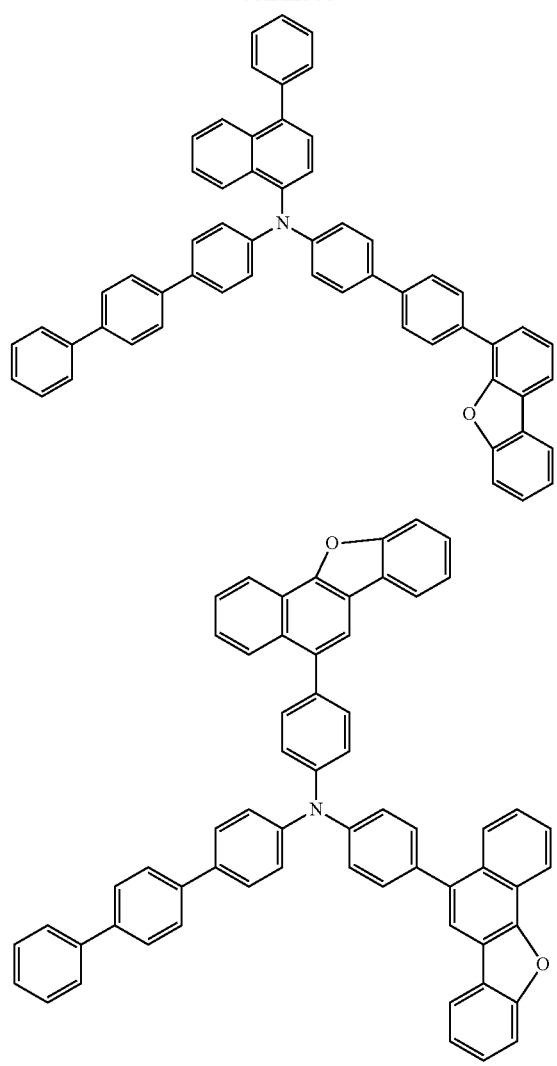
102
-continued
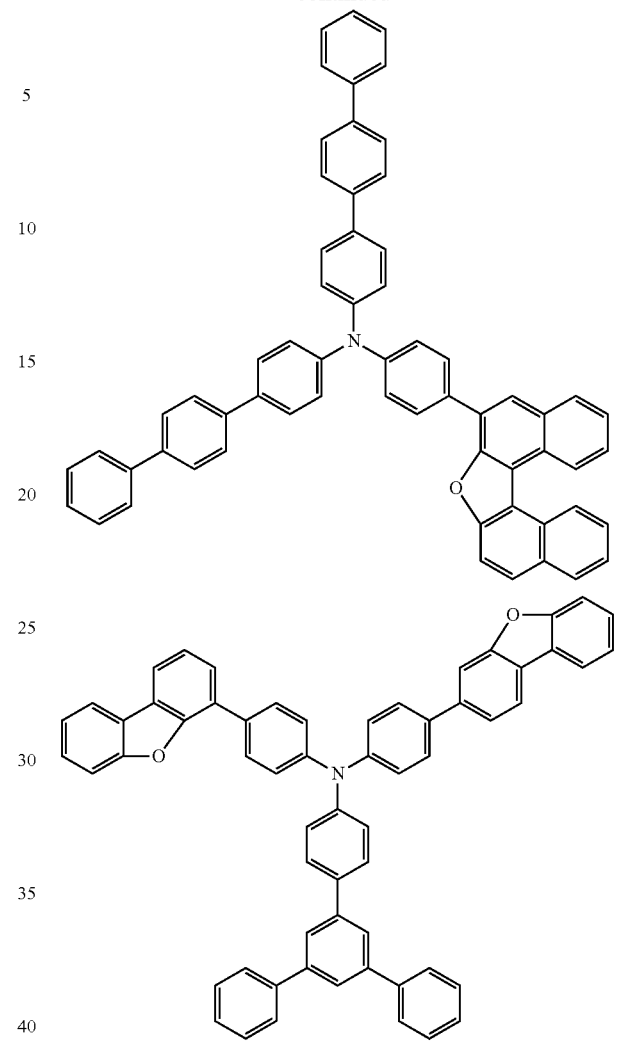
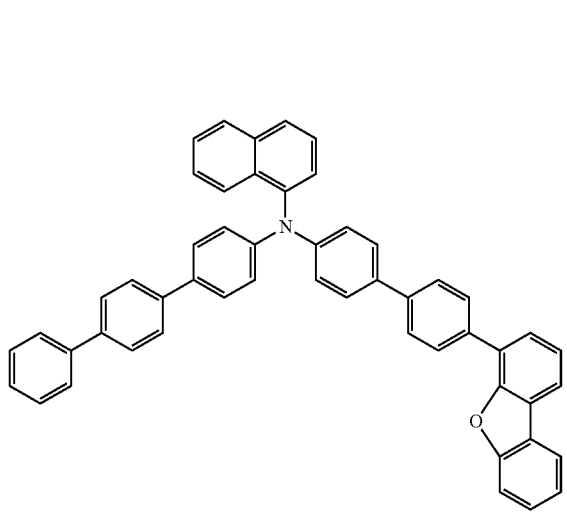
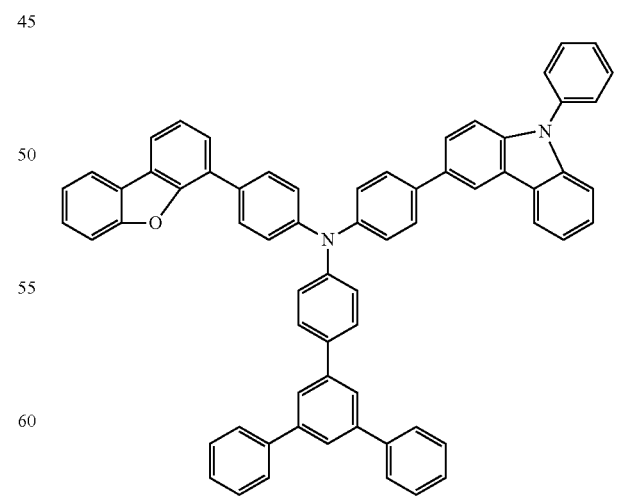

103
-continued
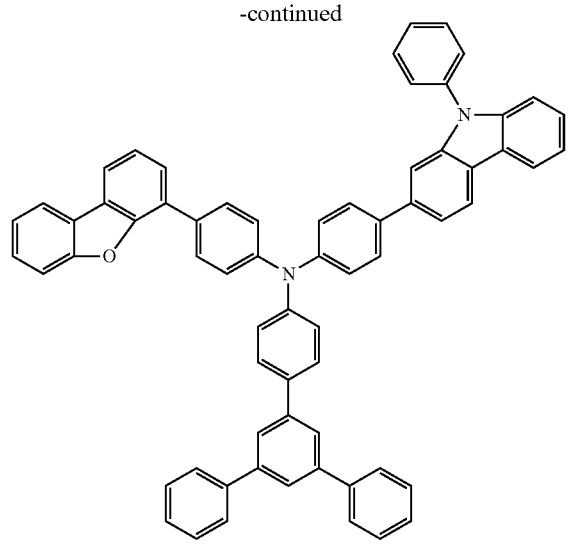
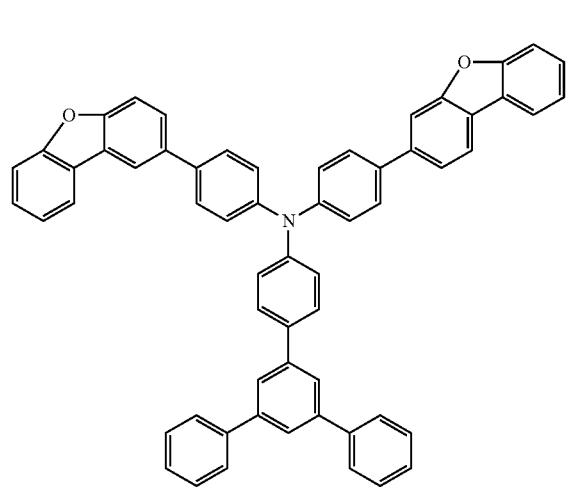
104
-continued
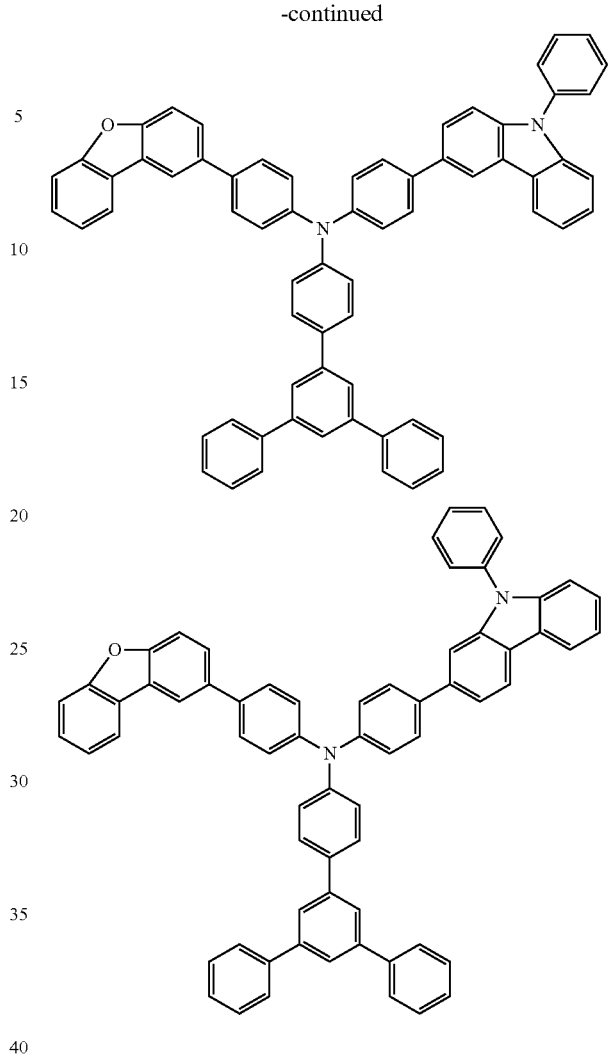
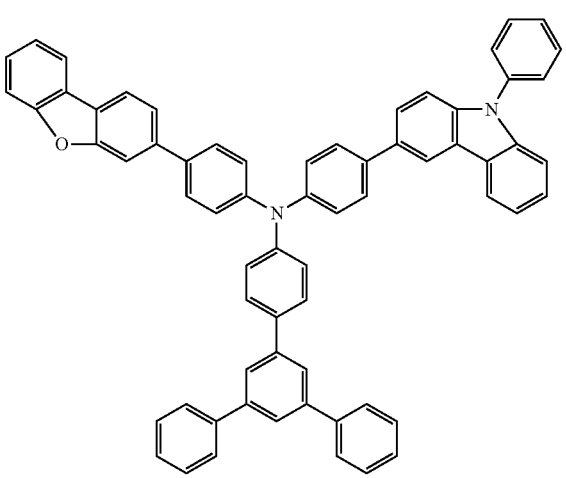

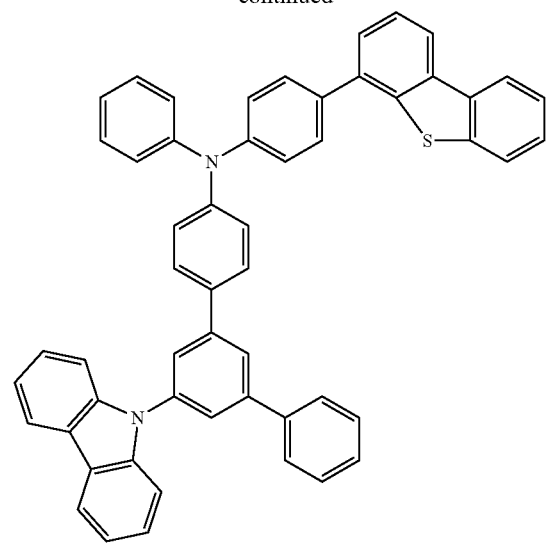
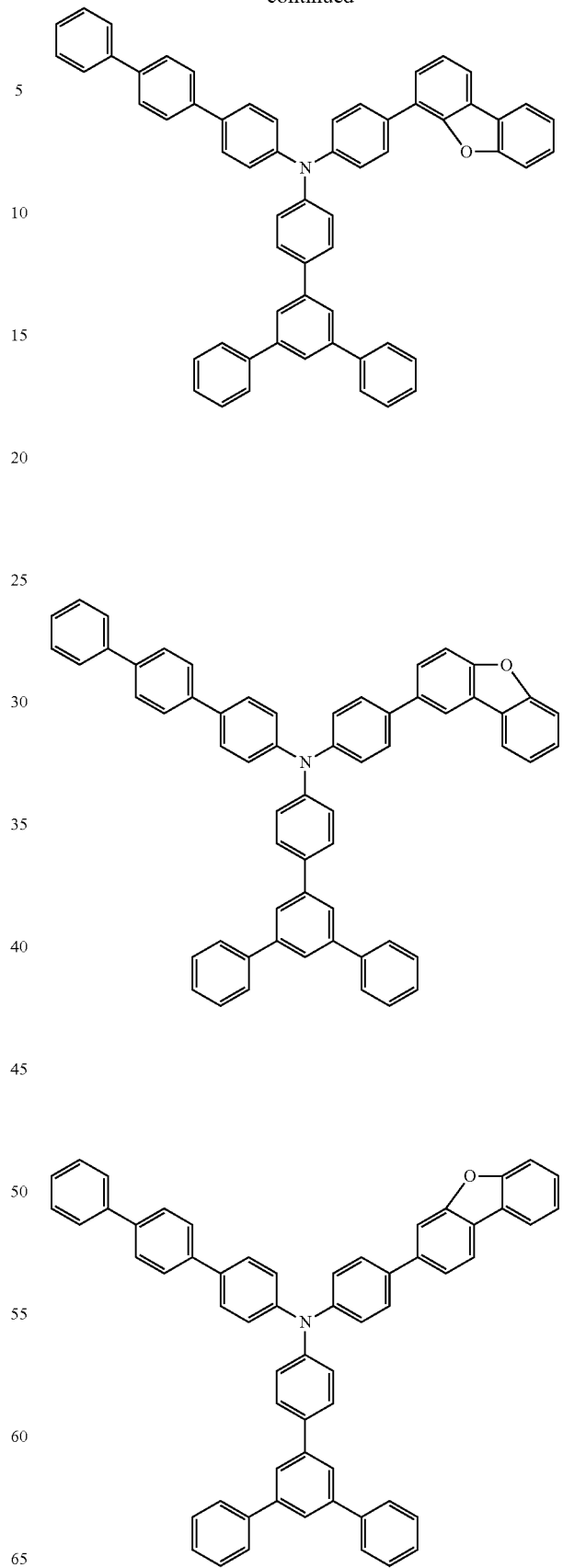

107
-continued
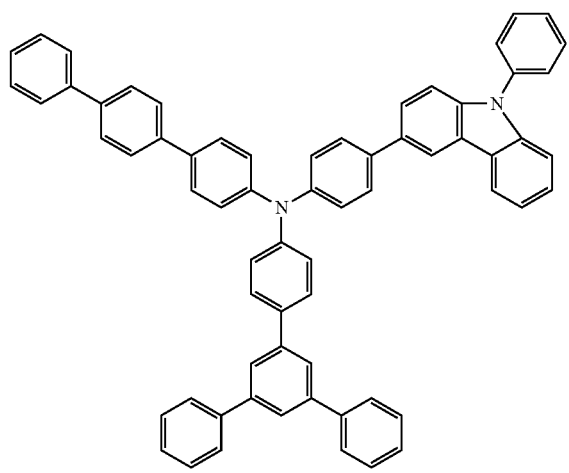
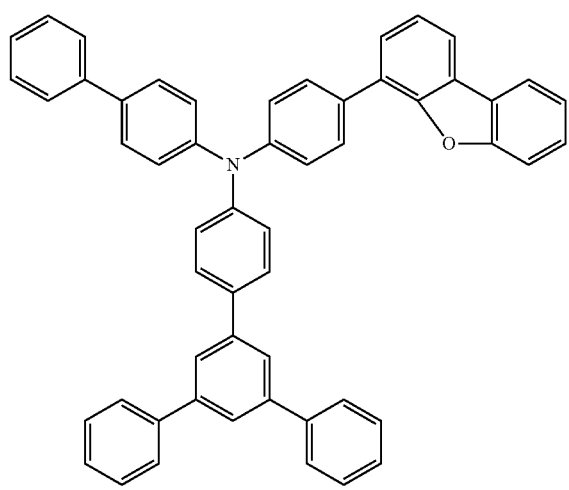
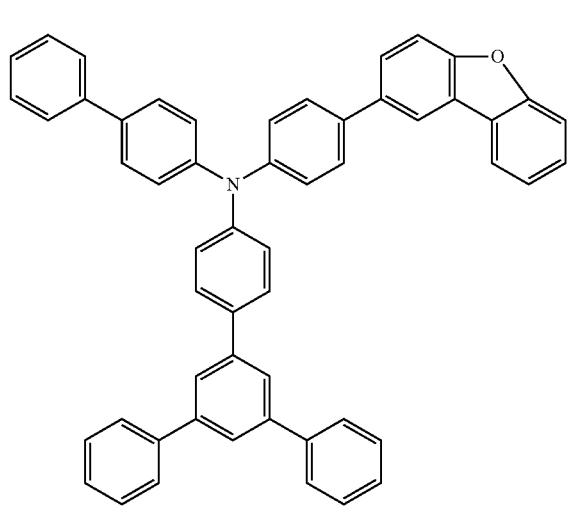
108
-continued
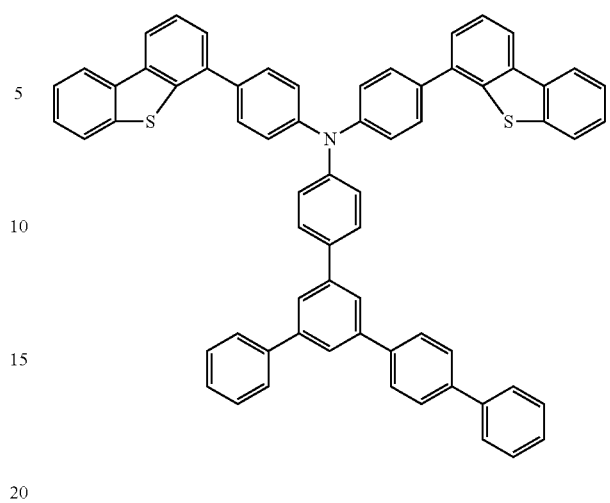
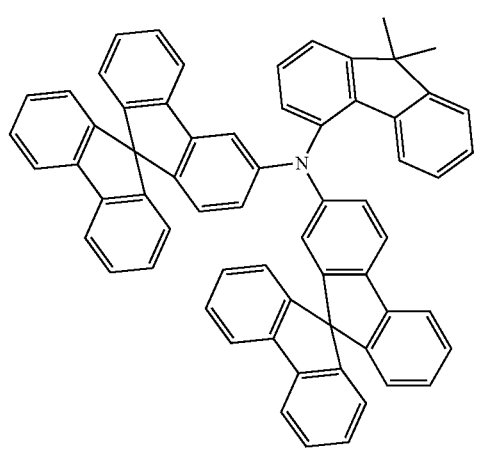
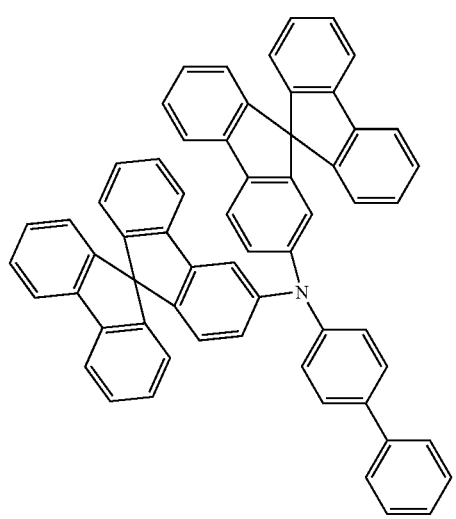

109
-continued
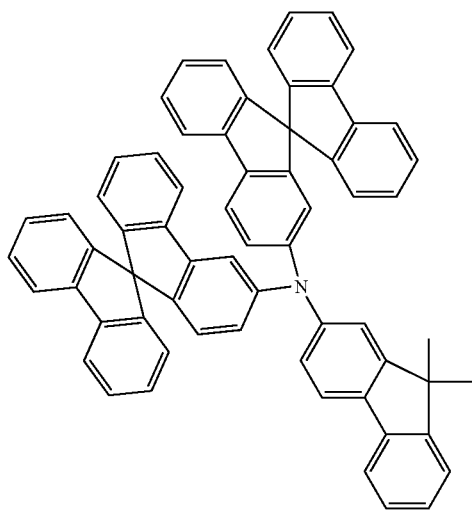
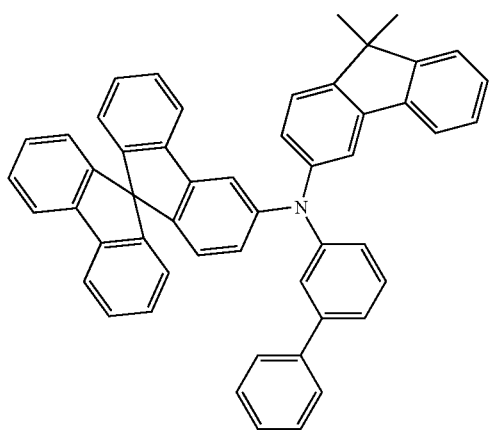
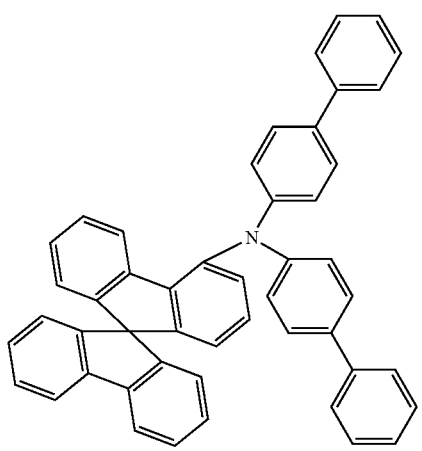
110
-continued
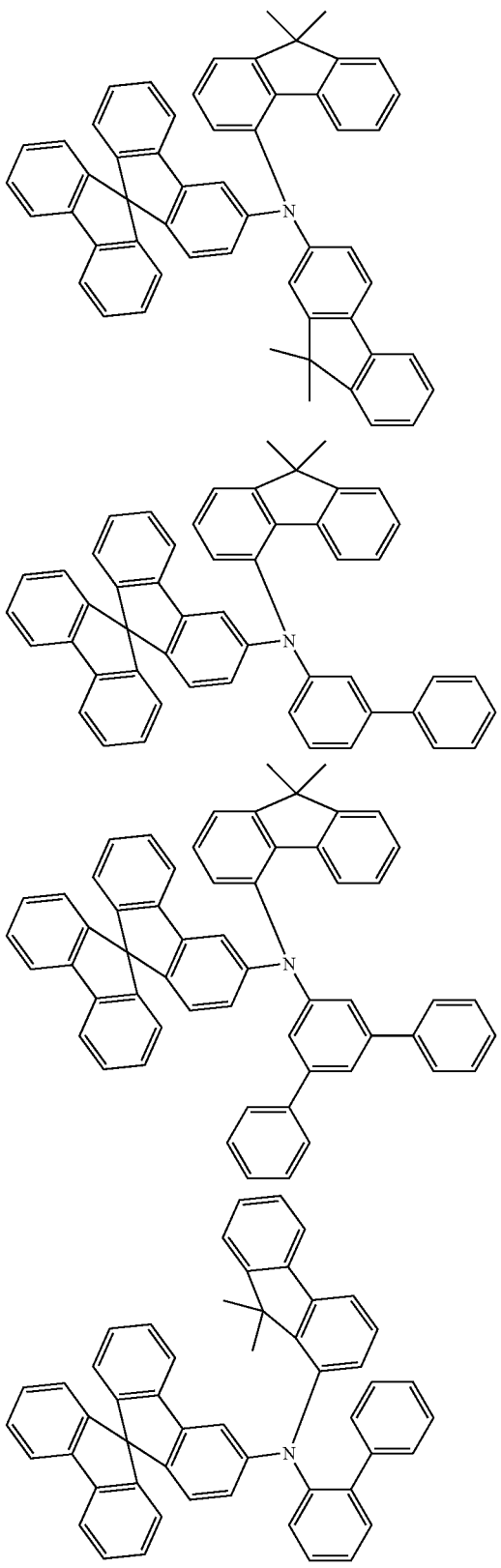

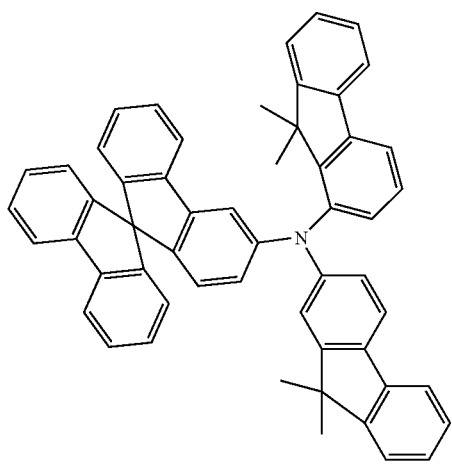
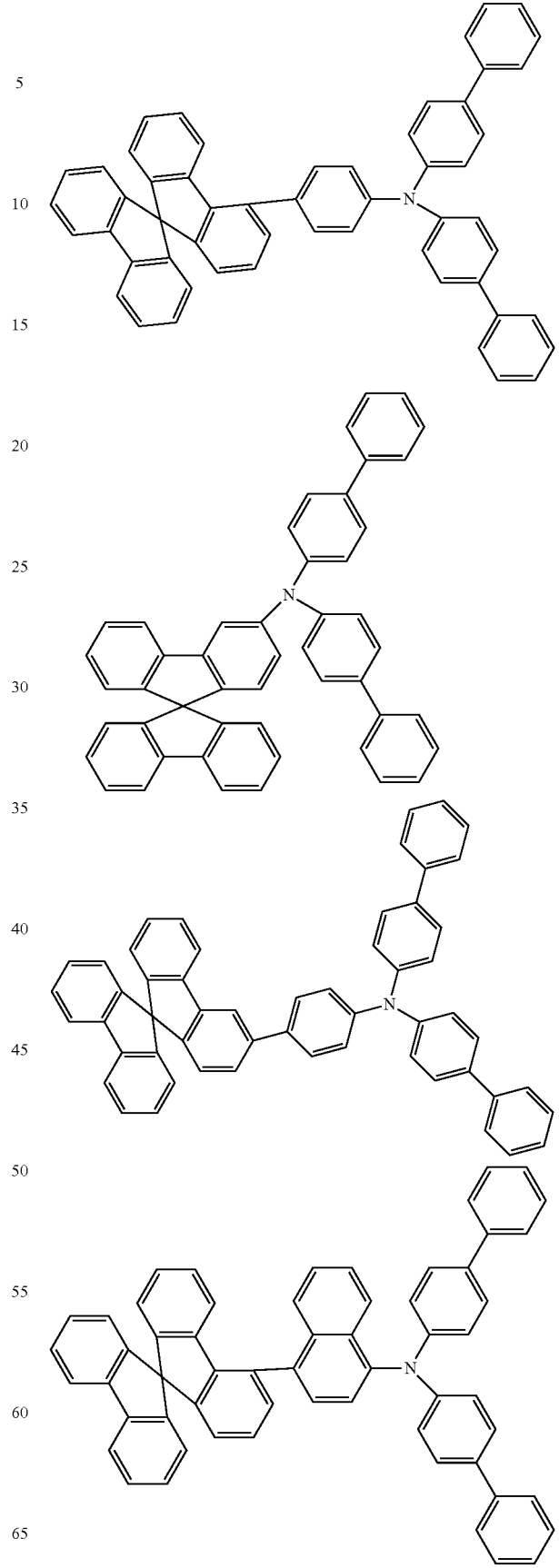

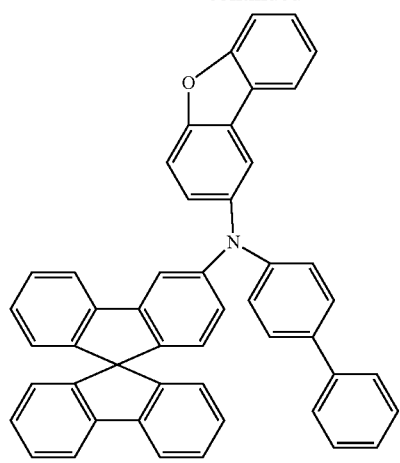
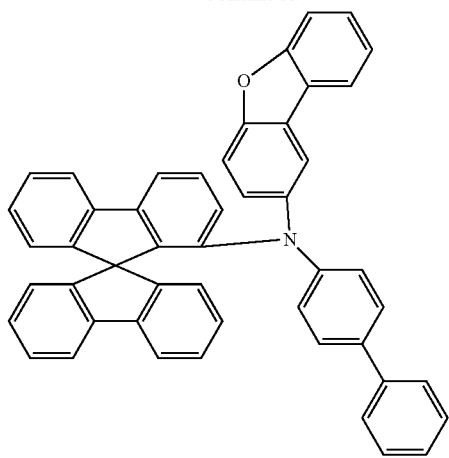
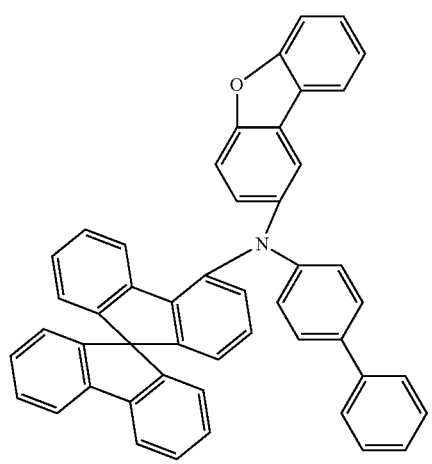
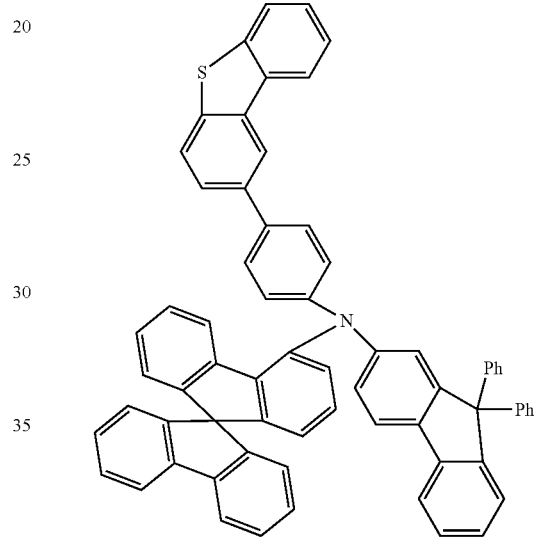
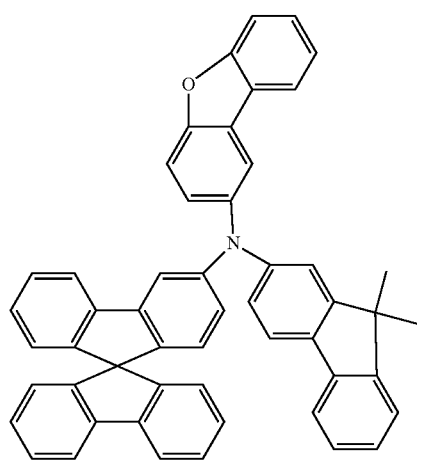
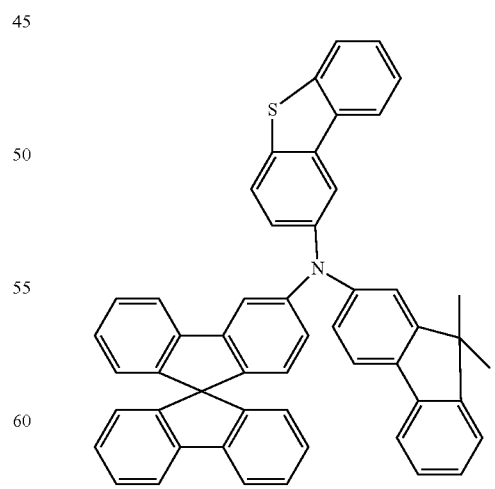

-continued
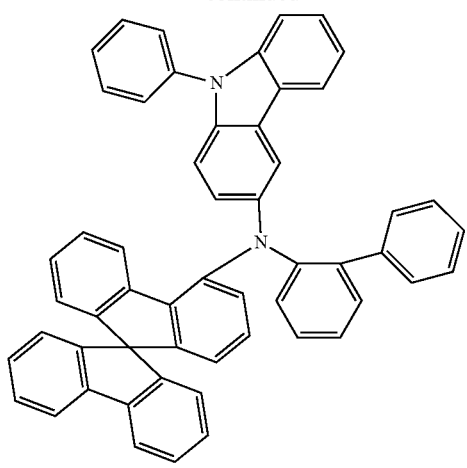
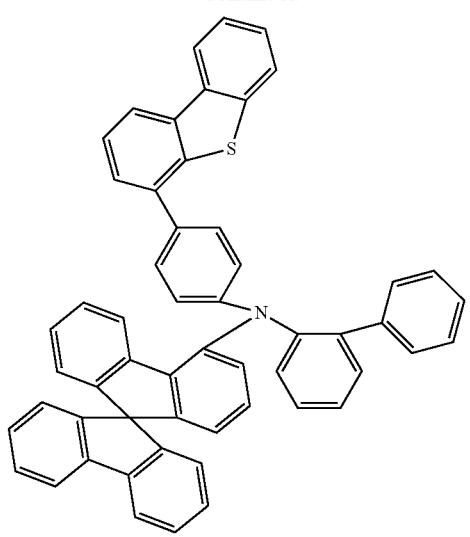
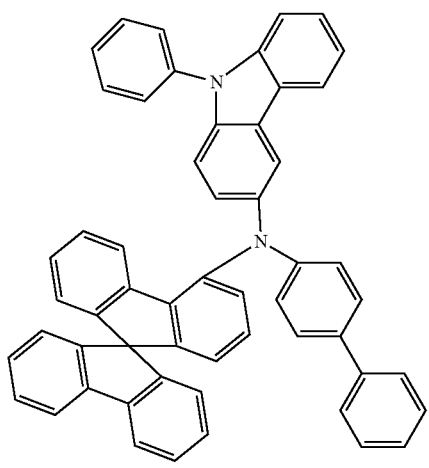
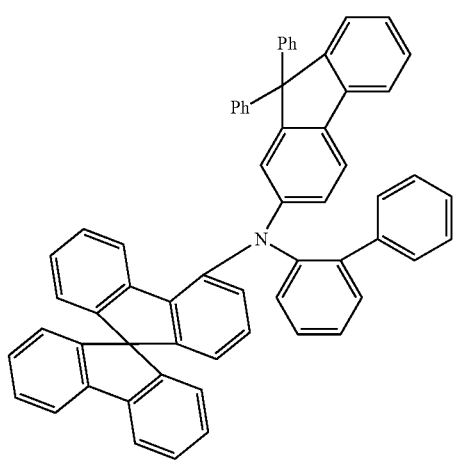
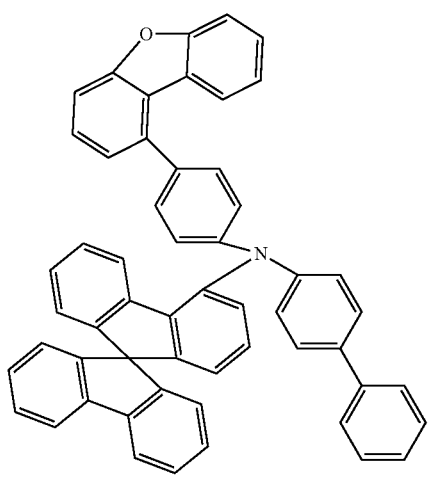
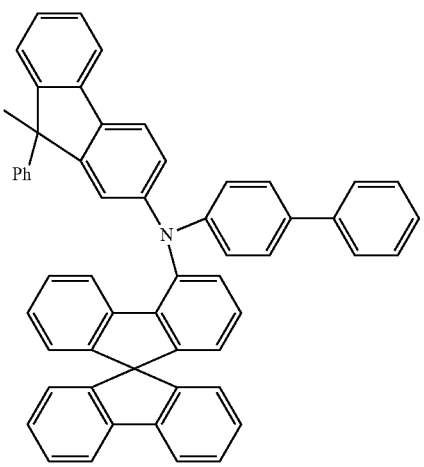

117
-continued
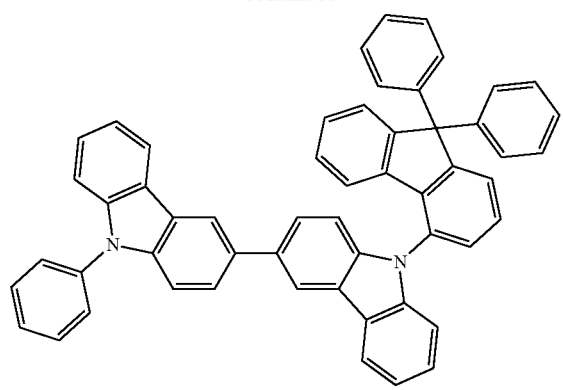
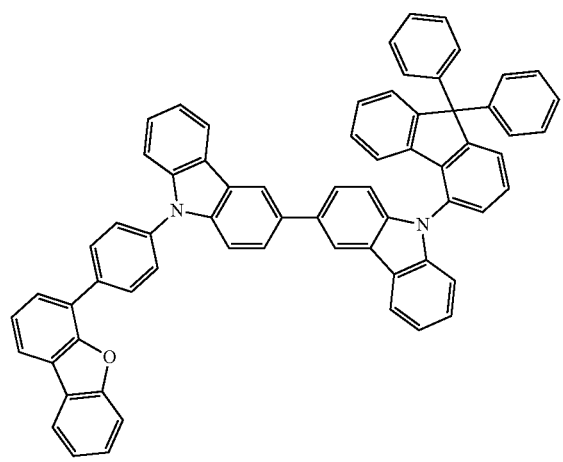
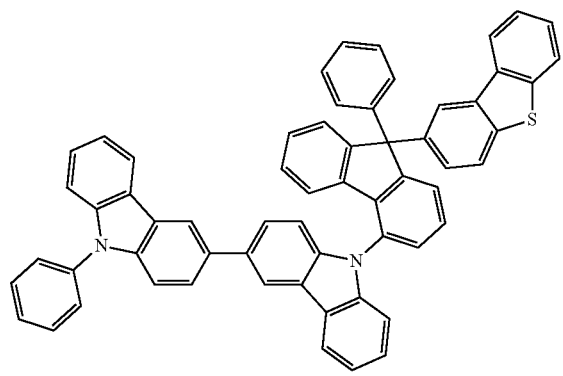
118
-continued
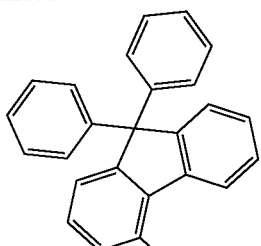
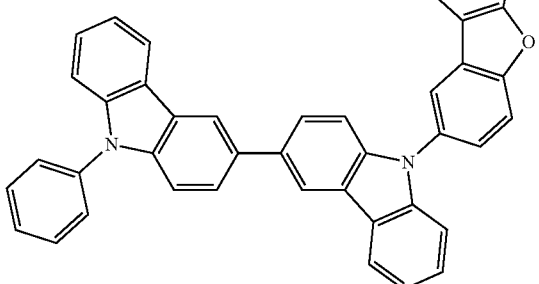
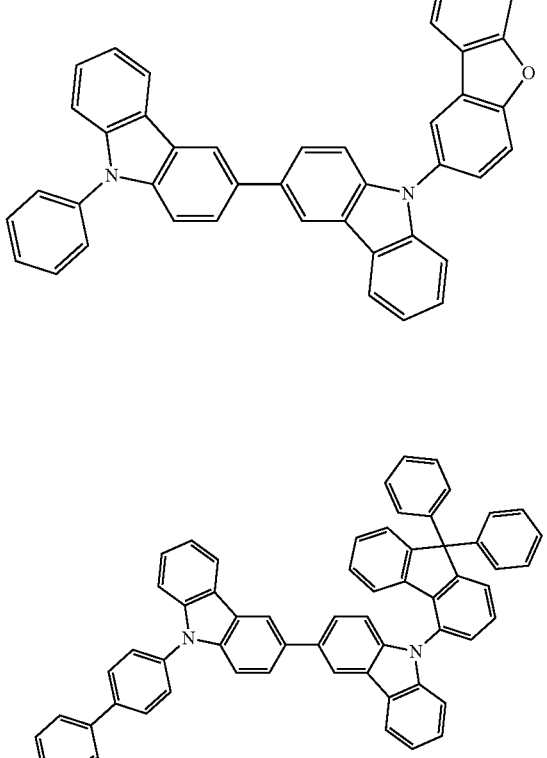
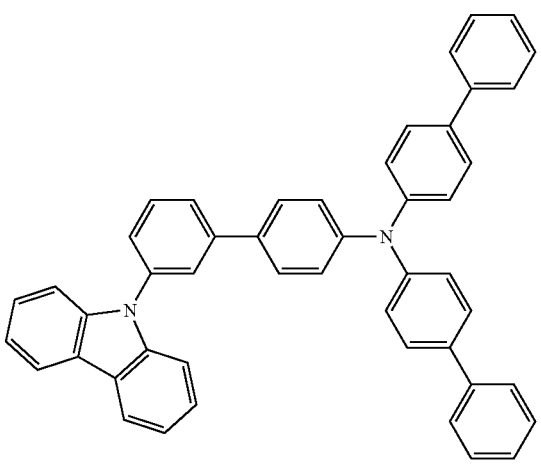

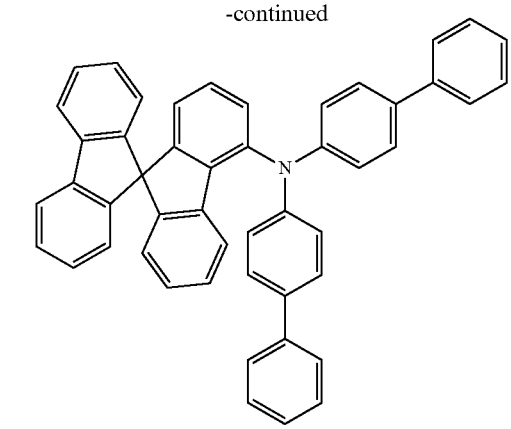
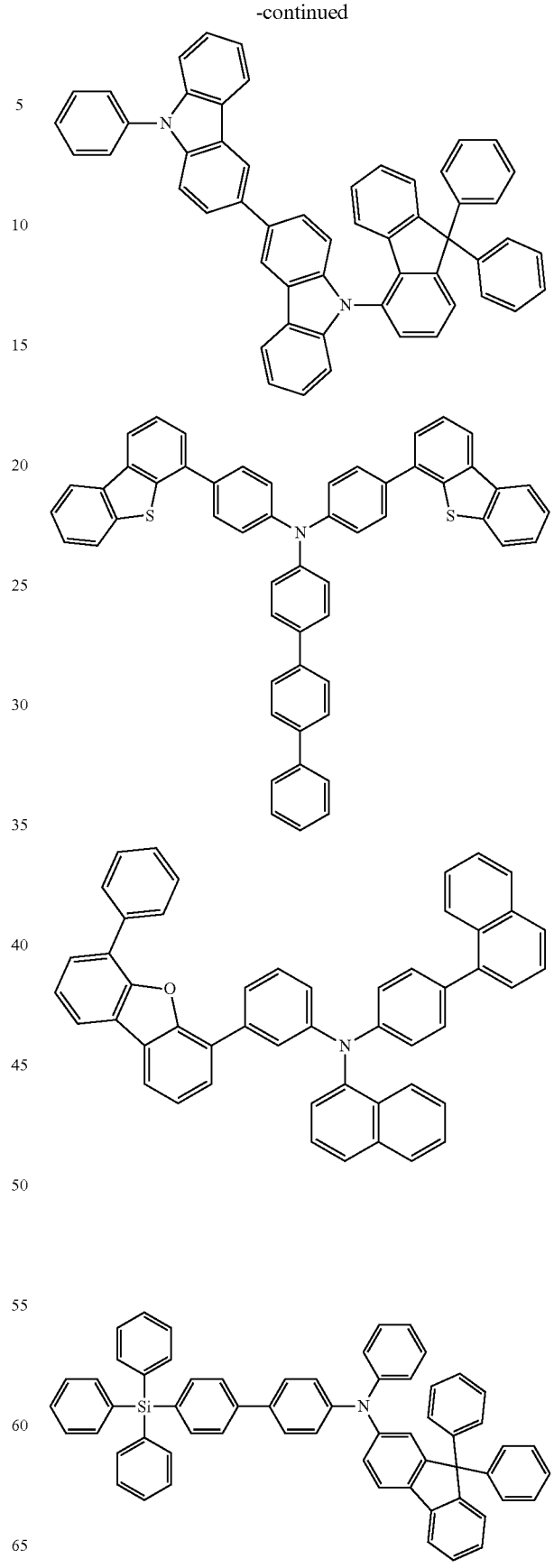

121
-continued

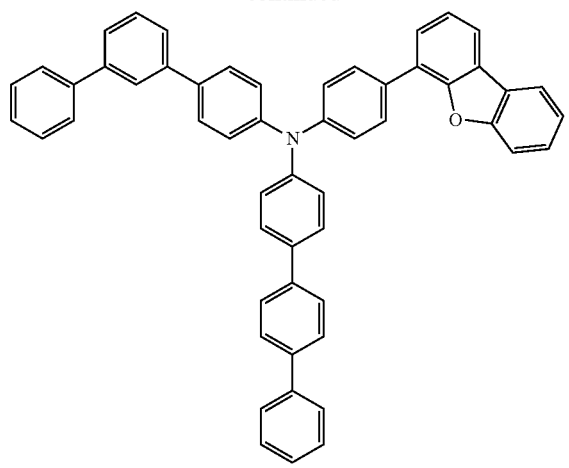

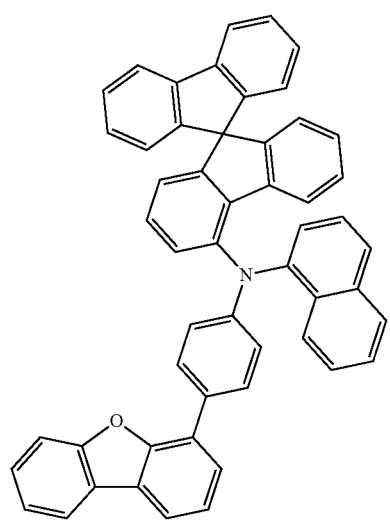

122
-continued

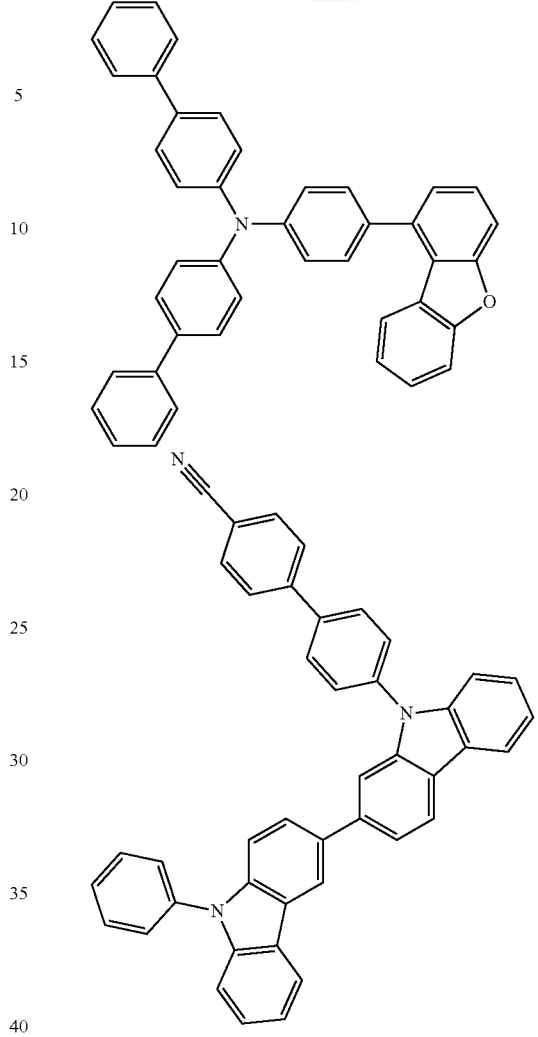

(Other Configurations of Hole-Transporting Zone)

A case in which a third layer (electron-blocking layer) is provided in the hole-transporting zone will be described. The electron-blocking layer has a function of preventing leakage of electrons from the emitting layer to the hole-transporting layer.

In one embodiment, the hole-transporting zone has a third layer between the emitting layer and the second layer,
  the third layer contains a third compound, and
  the ionization potential of the second compound Ip2 and the ionization potential of the third compound Ip3 satisfy the following formula (B1):

$$Ip2-Ip3 \leq 0.6 \text{ (eV)} \tag{B1}$$

In one embodiment, the ionization potential of the second compound Ip2 and the ionization potential of the third compound Ip3 satisfy the following formula (B2):

$$Ip2-Ip3 \leq 0.4 \text{ (eV)} \tag{B2}$$

In one embodiment, the ionization potential of the second compound Ip2 and the ionization potential of the third compound Ip3 satisfy the following formula (B3):

$$Ip2-Ip3 \leq 0.2 \text{ (eV)} \tag{B3}$$

As the third compound, compounds listed as specific examples of the second compound can be used, but a compound having a deeper ionization potential than a compound contained in the second layer as the second compound is used for preventing leakage of electrons from the emitting layer to the hole-transporting layer.

As a material which can be used for the hole-transporting zone other than the above, an aromatic amine compound, a carbazole derivative, an anthracene derivative, or the like can be used, particularly as a hole-transporting layer. A polymer compound such as poly(N-vinylcarbazole) (abbreviation: PVK) and poly(4-vinyltriphenylamine) (abbreviation: PVTPA) can also be used. However, a substance other than the above-described substances may be used as long as the substance has a higher hole-transporting property in comparison with an electron-transporting property. It should be noted that the layer containing the substance having high hole-transporting property may be not only a single layer, but also a layer in which two or more layers formed of the above-described substances are stacked.

(Other Configurations of Organic EL Device)

Known materials and device configurations may be applied to the organic EL device according to an aspect of the invention, as long as the hole-transporting zone satisfies the above-described conditions and the effect of the invention is not impaired.

Hereinafter, a device configuration, a material constituting each layer, and the like of the organic EL device according to an aspect of the invention will be described.

As a typical device configuration of the organic EL device, a configuration in which the following structure is stacked on a substrate is exemplified.

(1) anode/hole-transporting zone/emitting layer/cathode
(2) anode/hole-transporting zone/emitting layer/electron-transporting zone/cathode/indicates that the layers are stacked directly adjacent to each other.

The electron-transporting zone is normally composed of one or more layers selected from an electron-injecting layer and an electron-transporting layer. Hereinafter, each layer of the organic EL device will be described.

(Substrate)

A substrate is used as a support of an emitting device. As the substrate, glass, quartz, plastic or the like can be used, for example. Further, a flexible substrate may be used. The "flexible substrate" means a bendable (flexible) substrate, and specific examples thereof include a plastic substrate formed of polycarbonate, polyvinyl chloride, or the like.

(Anode)

For the anode formed on the substrate, metals, alloys, electrically conductive compounds, mixtures thereof, and the like, which have a large work function (specifically 4.0 eV or more) are preferably used. Specific examples include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, specific examples thereof include gold (Au), platinum (Pt), a nitride of a metallic material (for example, titanium nitride), and the like.

(Guest (Dopant) Material for Emitting Layer)

The emitting layer is a layer containing a substance having a high emitting property, and various materials can be used for forming it. For example, as the substance having a high emitting property, a fluorescent compound which emits fluorescence or a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, pyrene derivatives, styrylamine derivatives, chrysene derivatives, fluoranthene derivatives, fluorene derivatives, diamine derivatives, triarylamine derivatives, and the like can be used. As a green fluorescent emitting material which can be used for an emitting layer, aromatic amine derivatives and the like can be used. As a red fluorescent emitting material which can be used for an emitting layer, tetracene derivatives, diamine derivatives and the like can be used.

As a blue phosphorescent emitting material which can be used for an emitting layer, metal complexes such as iridium complexes, osmium complexes, platinum complexes and the like are used. As a green phosphorescent emitting material which can be used for an emitting layer, iridium complexes and the like are used. As a red phosphorescent emitting material which can be used for an emitting layer, metal complexes such as iridium complexes, platinum complexes, terbium complexes, europium complexes and the like are used.

(Host Material for Emitting Layer)

The emitting layer may have a constitution in which the substance having a high emitting property (guest material) is dispersed in another substance (host material). As a substance for dispersing the substance having a high emitting property, a variety of substances can be used, and it is preferable to use a substance having a higher lowest unoccupied orbital level (LUMO level) and a lower highest occupied orbital level (HOMO level) than the substance having a high emitting property.

As a substance for dispersing a substance having a high emitting property (host material), 1) a metal complex such as an aluminum complex, a beryllium complex, or a zinc complex, 2) a heterocyclic compound such as an oxadiazole derivative, a benzimidazole derivative, or a phenanthroline derivative, 3) a fused aromatic compound such as a carbazole derivative, an anthracene derivative, a phenanthrene derivative, a pyrene derivative, or a chrysene derivative, and 4) an aromatic amine compound such as a triarylamine derivative or a fused polycyclic aromatic amine derivative are used.

A compound having delayed fluorescence (thermally activated delayed fluorescence) can also be used as the host material. It is also preferable that the emitting layer contain a material used in the invention described above and a host compound having delayed fluorescence.

(Hole-Blocking Layer, Exciton-Blocking Layer)

A hole-blocking layer, an exciton (triplet)-blocking layer, and the like may be provided adjacent to the emitting layer. The hole-blocking layer has a function of preventing leakage of holes from the emitting layer to the electron-transporting layer. The exciton-blocking layer has a function of preventing diffusion of excitons generated in the emitting layer to the adjacent layers to confine the excitons within the emitting layer.

(Electron-Transporting Layer)

An electron-transporting layer is a layer that comprises a substance having a high electron-transporting property. For the electron-transporting layer, 1) metal complexes such as aluminum complexes, beryllium complexes, zinc complexes, or the like; 2) heteroaromatic complexes such as imidazole derivatives, benzimidazole derivatives, azine derivatives, carbazole derivatives, phenanthroline derivatives, or the like; and 3) polymer compounds can be used.

(Electron-Injecting Layer)

An electron-injecting layer is a layer which contains a substance having a high electron-injecting property. For the electron-injecting layer, lithium (Li), ytterbium (Yb), lithium fluoride (LiF), cesium fluoride (CsF), calcium fluoride (CaF$_2$), metal complex compounds such as 8-hydroxyquinolinolato-lithium (Liq), alkali metals such as lithium oxide (LiO$_x$); alkaline earth metals or compounds thereof can be used.

(Cathode)

For the cathode, metals, alloys, electrically conductive compounds, mixtures thereof, and the like having a small work function (specifically, 3.8 eV or lower) are preferably used. Specific examples of such a cathode material include elements belonging to Group 1 or Group 2 of the Periodic Table of the Elements, i.e., alkali metals such as lithium (Li) and cesium (Cs), alkaline earth metals such as magnesium (Mg), calcium (Ca) and strontium (Sr), and alloys containing these metals (e.g., MgAg and AlLi); rare earth metals such as europium (Eu) and ytterbium (Yb), and alloys containing these metals.

In the organic EL device according to an aspect of the invention, the thickness of each layer is not particularly limited, but is generally preferable that the thickness be in the range of several nm to 1 μm in order to suppress defects such as pinholes, to suppress applied voltages to be low, and to improve luminous efficiency.

In the organic EL device according to an aspect of the invention, the methods for forming the respective layers are not particularly limited. A conventionally-known method for forming each layer according to a vacuum deposition process, a spin coating process or the like can be used. Each layer such as the emitting layer can be formed by a known method such as a vacuum deposition process, a molecular beam deposition process (MBE process), or an application process such as a dipping process, a spin coating process, a casting process, a bar coating process, or a roll coating process, using a solution prepared by dissolving the material in a solvent.

[Electronic Apparatus]

In an electronic apparatus according to a first aspect of the invention, the organic EL device according to the first aspect of the invention is equipped with.

In an electronic apparatus according to a second aspect of the invention, the organic EL device according to the second aspect of the invention is equipped with.

An electronic apparatus according to an aspect of the invention has two or more of the organic electroluminescence devices adjacent to each other on a surface thereof, and the first layer and the second layer are common layers traversing between the organic electroluminescence devices.

Even when the common layer is formed traversing the organic electroluminescence devices, by using the first layer and the second layer, lateral leakage between two or more organic electroluminescence devices adjacent to each other on the surface can be suppressed.

Specific examples of the electronic apparatus include display components such as an organic EL panel module, and the like; display devices for a television, a cellular phone, a personal computer, and the like; and emitting devices such as a light, a vehicular lamp, and the like.

EXAMPLES

Hereinafter, Examples according to the invention will be described. The invention is not limited in any way by these Examples.

<Compounds>

Compounds represented by the formula (1) (or the first compound) used for fabricating organic EL devices of Examples 1 to 7 and Comparative Examples 1 to 8 and devices for measuring sheet resistance of Examples 8 to 11 and Comparative Examples 9 to 11 are shown below.

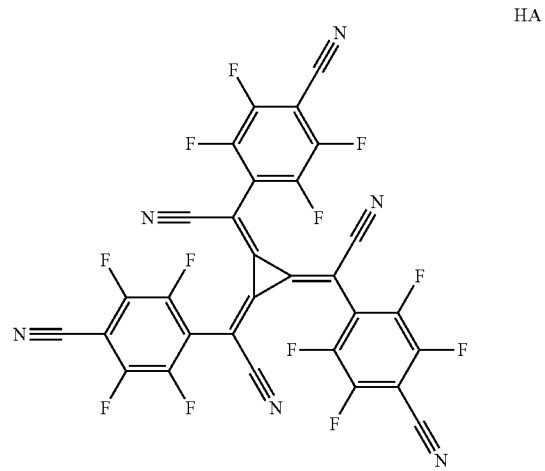

HA

Structures of the other compounds used for fabricating organic EL devices of Examples 1 to 7 and Comparative Examples 1 to 8 and devices for measuring sheet resistance of Examples 8 to 11 and Comparative Examples 9 to 11 are shown below.

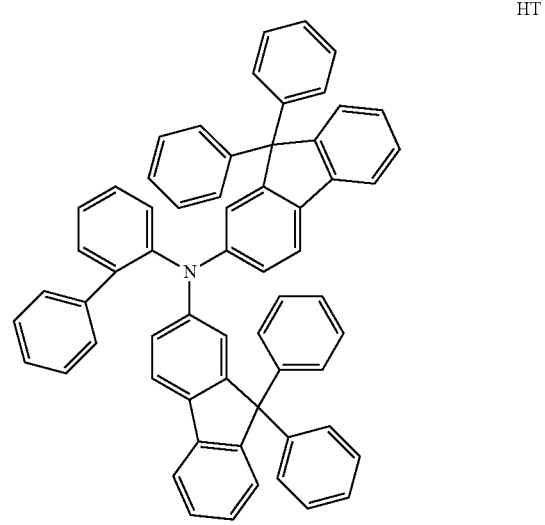

HT

EBL-1

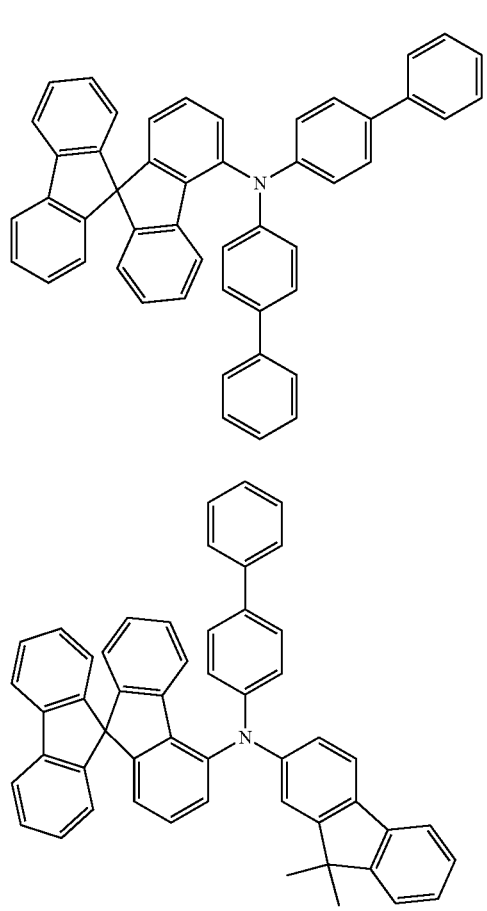

EBL-2

BH

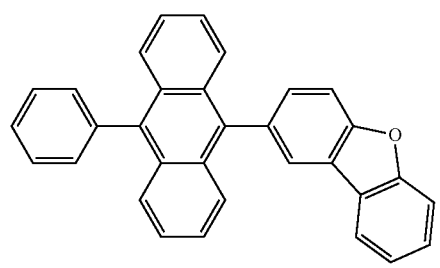

BD

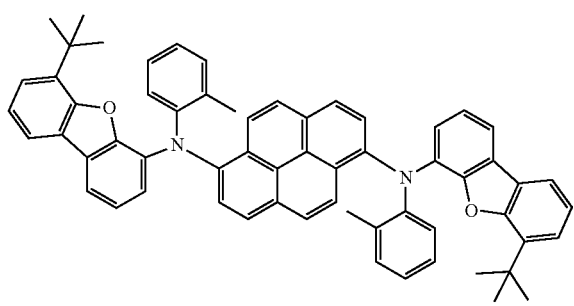

HBL

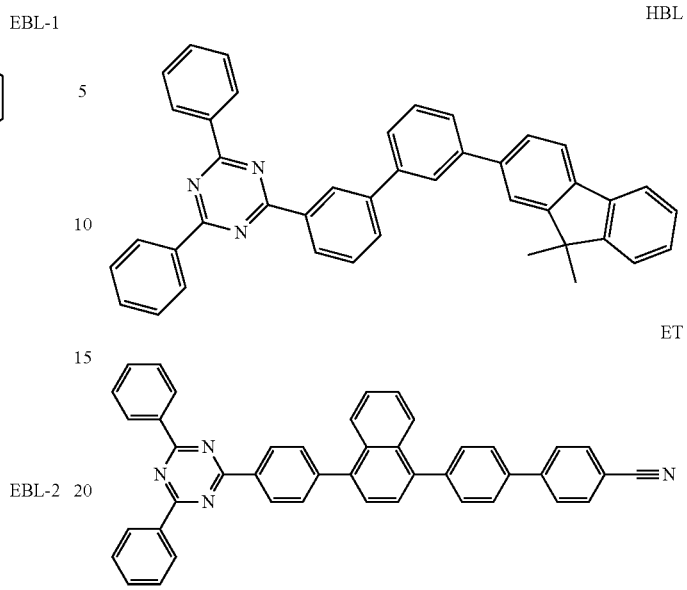

ET

<Fabrication of Organic EL Device>
Organic EL devices were fabricated as follows:

Example 1

A 25 mm×75 mm×1.1 mm-thick glass substrate with an ITO transparent electrode (anode) (manufactured by GEO-MATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, Compound HA was deposited on a surface on the side on which the transparent electrode was formed so as to cover the transparent electrode to form a hole-injecting layer having a thickness of 1 nm.

On the hole-injecting layer, Compound HT was deposited to form a first hole-transporting layer having a film thickness of 80 nm.

On the first hole-transporting layer, Compound EBL-1 was deposited to form a second hole-transporting layer having a film thickness of 10 nm.

Compound BH (host material) and Compound BD (dopant material) were co-deposited on the second hole-transporting layer to be 4% by mass in a proportion of Compound BD to form an emitting layer having a film thickness of 25 nm.

On the emitting layer, Compound HBL was deposited to form a first electron-transporting layer having a film thickness of 5 nm.

On the first electron-transporting layer, Compound ET and 8-hydroxyquinolinolato-lithium (Liq) were co-deposited to be 50% by mass in a proportion of Liq to form a second electron-transporting layer having a film thickness of 20 nm.

On the second electron-transporting layer, lithium fluoride (LiF) was deposited to form an electron-injecting layer having a film thickness of 1 nm.

Then, on this electron-injecting layer, metal aluminum (Al) was deposited to form a cathode having a film thickness of 50 nm.

The schematic layer configuration of the organic EL device of Example 1 is as follows. ITO(130)/HA(1)/HT(80)/EBL(10)/BH:BD(25:4%)/HBL(5)/ET:Liq(20:50%)/LiF(1)/Al(50)

The numerical values in parentheses indicate the film thickness (unit: nm). In parentheses, the numerical values in percentage indicate the proportion (% by mass) of the latter material in the layer.

Comparative Example 1

An organic EL device was fabricated in the same manner as in Example 1, except that, in the formation of the hole-injecting layer, Compound HT and Compound HA were co-deposited to be 3% by mass in a proportion of Compound HA to form a hole-injecting layer having a film thickness of 10 nm.

The schematic layer configuration of the organic EL device of Comparative Example 1 is as follows.

ITO(130)/HT:HA(10:3%)/HT(80)/EBL(10)/BH:BD(25:4%)/HBL(5)/ET:Liq(20:50%)/LiF(1)/Al(50)

The numerical values in parentheses indicate the film thickness (unit: nm). In parentheses, the numerical values in percentage indicate the proportion (% by mass) of the latter material in the layer.

<Evaluation of Organic EL Devices>

The following evaluation was performed on fabricated organic EL devices. Evaluation results are shown in Table 1.

Drive Voltage

Initial characteristics of organic EL devices were measured by DC-constant current 10 mA/cm$^2$ of DC (direct current) at room temperature.

External Quantum Efficiency

Voltage was applied to the organic EL device to be 10 mA/cm$^2$ in current density, thereby measuring an EL emission spectrum by using Spectroradiometer CS-2000 (manufactured by Konica Minolta, Inc.). External quantum efficiency (EQE) (%) was calculated from the obtained spectral radiance spectrum.

Device Lifetime

For the resulting organic EL device, at room temperature, voltage was applied to the organic EL device to be 50 mA/cm$^2$ in current density at room temperature, and the time (LT95 (units: h)) until the luminance became 95% of the initial luminance was measured.

Voltage Rise

For the obtained organic EL device, voltage was applied to the organic EL device to be 50 mA/cm$^2$ in current density at room temperature, and a change in the voltage required for passing a constant current (50 mA/cm$^2$) was recorded. After current application, the voltage rise until the luminance becomes 97% of the initial luminance (unit: V/h) was calculated.

TABLE 1

|  | Composition of hole-injecting layer | Voltage [V] | EQE [%] | LT95 [h] | Voltage rise [V/h] |
|---|---|---|---|---|---|
| Example 1 | HA (1) | 3.90 | 8.6 | 132 | $3.2 \times 10^{-4}$ |
| Comp. Ex. 1 | HT:HA (10:3%) | 3.77 | 8.3 | 121 | $1.03 \times 10^{-3}$ |

In Table 1, the numerical values in parentheses indicate the film thickness (unit: nm). In parentheses, the numerical values in percentage indicate the proportion (% by mass) of the latter material in the layer.

Example 2

An organic EL device was fabricated and evaluated in the same manner as in Example 1, except that Compound EBL-1 of Example 1 was replaced with EBL-2 in forming the first hole-transporting layer. The results are shown in Table 2.

Comparative Example 2

An organic EL device was fabricated and evaluated in the same manner as in Comparative Example 1, except that Compound EBL-1 of Comparative Example 1 was replaced with EBL-2 in forming the first hole-transporting layer. The results are shown in Table 2.

TABLE 2

|  | Composition of hole-injecting layer | Voltage [V] | EQE [%] | LT95 [h] | Voltage rise [V/h] |
|---|---|---|---|---|---|
| Example 2 | HA (1) | 3.61 | 8.0 | 127 | $3.97 \times 10^{-4}$ |
| Comp. Ex. 2 | HT:HA (10:3%) | 3.70 | 7.8 | 123 | $1.12 \times 10^{-3}$ |

In Table 2, the numerical values in parentheses indicate the film thickness (unit: nm). In parentheses, the numerical values in percentage indicate the proportion (% by mass) of the latter material in the layer.

<Fabrication of Organic EL Devices>

Organic EL devices were fabricated as follows:

Example 3

An organic EL device was fabricated in the same manner as in Example 1, except that a hole-injecting layer having a film thickness of 3 nm was formed in forming the first hole-transporting layer.

Example 4

An organic EL device was fabricated in the same manner as in Example 1.

Example 5

An organic EL device was fabricated in the same manner as in Example 1, except that a hole-injecting layer having a film thickness of 0.75 nm was formed in forming the first hole-transporting layer.

Example 6

An organic EL device was fabricated in the same manner as in Example 1, except that a hole-injecting layer having a film thickness of 0.50 nm was formed in forming the first hole-transporting layer.

Example 7

An organic EL device was fabricated in the same manner as in Example 1, except that a hole-injecting layer having a film thickness of 0.30 nm was formed in forming the first hole-transporting layer.

Comparative Example 3

An organic EL device was fabricated in the same manner as in Example 1, except that the first hole-transporting layer was not formed.

Comparative Example 4

An organic EL device was fabricated by the same manner as in Comparative Example 1.

<Evaluation of Organic EL Devices>

The following evaluation was performed on the fabricated organic EL devices. Evaluation results are shown in Table 3.

Drive Voltage

Initial characteristics of organic EL devices were measured by DC-constant current 10 mA/cm$^2$ of DC (direct current) at room temperature.

External Quantum Efficiency

Voltage was applied to the organic EL device to be 10 mA/cm$^2$ in current density, thereby measuring an EL emission spectrum by using Spectroradiometer CS-2000 (manufactured by Konica Minolta, Inc.). External quantum efficiency (EQE) (%) was calculated from the obtained spectral radiance spectrum.

Device Lifetime

For the resulting organic EL device, at room temperature, voltage was applied to the organic EL device to be 50 mA/cm$^2$ in current density at room temperature, and the time (LT95 (units: h)) until the luminance became 95% of the initial luminance was measured.

TABLE 3

| | Composition of hole-injecting layer | Voltage [V] | EQE [%] | LT95 [h] |
|---|---|---|---|---|
| Example 3 | HA (1) | 3.90 | 8.6 | 132 |
| Example 4 | HA (3) | 3.78 | 8.2 | 136 |
| Example 5 | HA (0.75) | 3.82 | 8.7 | 118 |
| Example 6 | HA (0.50) | 3.85 | 8.6 | 132 |
| Example 7 | HA (0.30) | 3.91 | 8.6 | 139 |
| Comp. Ex. 3 | not formed | 13.78 | 0.1 | 0 |
| Comp. Ex. 4 | HT:HA (10:3%) | 3.77 | 8.3 | 121 |

In Table 3, the numerical values in parentheses indicate the film thickness (unit: nm). In parentheses, the numerical values in percentage indicate the proportion (% by mass) of the latter material in the layer.

Comparative Example 7

An organic EL device was fabricated by the same manner as in Comparative Example 1.

Comparative Example 8

An organic EL device was fabricated in the same manner as in Comparative Example 1, except that, in the formation of the hole-injecting layer, Compound HT and Compound HA were co-deposited to be 1% by mass in a proportion of Compound HA.

<Evaluation of Organic EL Devices>

The following evaluation was performed on the fabricated organic EL devices. Evaluation results are shown in Table 4.

Drive Voltage

Initial characteristics of organic EL devices were measured by DC-constant current 10 mA/cm$^2$ of DC (direct current) at room temperature.

TABLE 4

| | Composition of hole-injecting layer | Voltage [V] |
|---|---|---|
| Comp. Ex. 7 | HT:HA (10:3%) | 4.10 |
| Comp. Ex. 8 | HT:HA (10:1%) | 4.92 |

From the results shown in Table 4, it can be seen that when Compound HA is doped into Compound HT in forming the hole-injecting layer, the driving voltage increases when the doping amount is reduced.

<Fabrication of Devices for Measuring Sheet Resistance>

Devices for measuring sheet resistance were fabricated as follows.

Example 8

Compound HA was vacuum-deposited on comb-tooth electrodes with inter-electrode distances of 10, 20, 40, and 80 μm, respectively, to form a hole-injecting layer having a film thickness of 0.1 nm.

On the hole-injecting layer, Compound HT was vacuum-deposited to form a hole-transporting layer having a film thickness of 90 nm.

Example 9

A device for measuring sheet resistance was fabricated in the same manner as in Example 8, except that a hole-injecting layer having a film thickness of 0.3 nm was formed in forming the hole-injecting layer.

Example 10

A device for measuring sheet resistance was fabricated in the same manner as in Example 8, except that a hole-injecting layer having a film thickness of 0.4 nm was formed in forming the hole-injecting layer.

Example 11

A device for measuring sheet resistance was fabricated in the same manner as in Example 8, except that a hole-injecting layer having a film thickness of 0.5 nm was formed in forming the hole-injecting layer.

Comparative Example 9

A device for measuring sheet resistance was fabricated in the same manner as in Example 8, except that a hole-injecting layer having a film thickness of 5 nm was formed in forming the hole-injecting layer.

Comparative Example 10

A device for measuring sheet resistance was fabricated in the same manner as in Example 8, except that a hole-injecting layer having a film thickness of 10 nm was formed in forming the hole-injecting layer.

Comparative Example 11

A device for measuring sheet resistance was fabricated in the same manner as in Example 8, except that, in the formation of the hole-injecting layer, Compound HT and Compound HA were co-deposited to be 3% by mass in a proportion of Compound HA to form a hole-injecting layer having a film thickness of 10 nm.

<Evaluation of Sheet Resistance>

Evaluation of the sheet resistance was carried out on the fabricated devices.

Voltage of 100 V was applied between the electrodes, and a current value flowing between the electrodes and a resistance value were measured by Model 6430 Sub-Femtoamp Remote SourceMeter (manufactured by Keithley Instruments). The inter-electrode distance and the resistance value corresponding to each inter-electrode distance were plotted, Rslope ($\Omega/\mu m$) as the slope thereof was calculated, and the sheet resistance Rs ($\Omega/sq$) was calculated by multiplying Rslope value by the electrode width (37640 μm). The results are shown in Table 5.

TABLE 5

| | Composition of hole-injecting layer | Rs [$\Omega$/sq] |
|---|---|---|
| Example 8 | HA (0.1) | $1.2 \times 10^{12}$ |
| Example 9 | HA (0.3) | $1.6 \times 10^{12}$ |
| Example 10 | HA (0.4) | $4.3 \times 10^{11}$ |
| Example 11 | HA (0.5) | $1.6 \times 10^{11}$ |
| Comp. Ex. 9 | HA (5) | $3.2 \times 10^{10}$ |
| Comp. Ex. 10 | HA (10) | $3.8 \times 10^{10}$ |
| Comp. Ex. 11 | HT:HA (10:3%) | $4.7 \times 10^{11}$ |

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. An organic electroluminescence device comprising:
a cathode,
an anode,
an emitting layer disposed between the cathode and the anode, and
a hole-transporting zone disposed between the anode and the emitting layer, wherein
the hole-transporting zone comprises a first layer and a second layer in this order from the anode side, the first layer being a hole injecting layer and the second layer being a hole transporting layer;
the first layer consists of a compound represented by the following formula (1),
the first layer has a thickness of 0.10 to 3.00 nm:

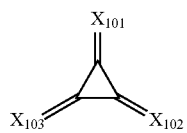
(1)

wherein in the formula (1),
$X_{101}$ to $X_{103}$ are independently a divalent group represented by the following formula (1A):

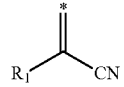
(1A)

wherein in the formula (1A), * represents a bonding site;
$R_1$ is
a substituted or unsubstituted aryl group including 6 to 50 ring carbon atoms, or
a substituted or unsubstituted monovalent heterocyclic group including 5 to 50 ring atoms; and
when two or more $R_1$'s are present, the two or more $R_1$'s may be the same as or different from each other.

2. The organic electroluminescence device according to claim 1, wherein the second layer comprises a second compound.

3. The organic electroluminescence device according to claim 1, wherein the thickness of the first layer is 0.10 to 1.50 nm.

4. The organic electroluminescence device according to claim 2, wherein the electron affinity of the first compound Af1 and the ionization potential of the second compound Ip2 satisfy the following formula (A1):

$$Af1-Ip2 \geq 0.3 \text{ (eV)} \quad (A1).$$

5. The organic electroluminescence device according to claim 2, wherein the electron affinity of the first compound Af1 and the ionization potential of the second compound Ip2 satisfy the following formula (A2):

$$Af1-Ip2 \geq 0.4 \text{ (eV)} \quad (A2).$$

6. The organic electroluminescence device according to claim 2, wherein the electron affinity of the first compound Af1 and the ionization potential of the second compound Ip2 satisfy the following formula (A3):

$$Af1-Ip2 \geq 0.5 \text{ (eV)} \quad (A3).$$

7. The organic electroluminescence device according to claim 2, wherein the second compound is a compound represented by the following formula (21):

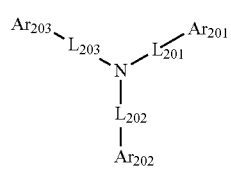
(21)

wherein in the formula (21),
$L_{201}$ to $L_{203}$ are independently
a single bond,
a substituted or unsubstituted arylene group including 6 to 18 ring carbon atoms, or
a substituted or unsubstituted divalent heterocyclic group including 5 to 13 ring atoms;
$Ar_{201}$ to $Ar_{203}$ are independently
a substituted or unsubstituted aryl group including 6 to 30 ring carbon atoms,
a substituted or unsubstituted monovalent heterocyclic group including 5 to 30 ring atoms, or
a group represented by —Si($R'_{901}$)($R'_{902}$)($R'_{903}$);
$R'_{901}$ to $R'_{903}$ are independently a substituted or unsubstituted aryl group including 6 to 30 ring carbon atoms;

when two or more of each of $R'_{901}$ to $R'_{903}$ are present, the two or more of each of $R'_{901}$ to $R'_{903}$ may be the same as or different from each other;

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$) ($R_{902}$) ($R_{903}$),

—O—($R_{904}$),

—S—($R_{905}$),

—N($R_{906}$) ($R_{907}$), wherein $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms, when two or more of each of $R_{901}$ to $R_{907}$ are present, the two or more of each of $R_{901}$ to $R_{907}$ may be the same as or different from each other, a halogen atom, a cyano group, a nitro group, a substituted or unsubstituted aryl group including 6 to 50 ring carbon atoms, and a substituted or unsubstituted monovalent heterocyclic group including 5 to 50 ring atoms; and when two or more substituents R are present, the two or more substituents R may be the same as or different from each other.

8. The organic electroluminescence device according to claim 7, wherein one or more of $Ar_{201}$ to $Ar_{203}$ are groups represented by the following formula (21A):

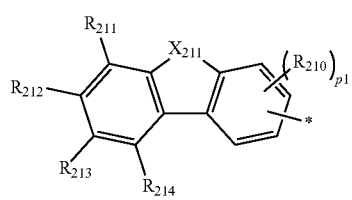

(21A)

wherein in the formula (21A), * represents a bonding site;

$X_{211}$ is $CR_{221}R_{222}$, $NR_{223}$, O, or S, $R_{221}$ and $R_{222}$ form a substituted or unsubstituted, saturated or unsaturated ring by bonding with each other, or do not form a substituted or unsubstituted, saturated or unsaturated ring;

one or more sets of adjacent two or more of $R_{210}$ to $R_{214}$ are bonded to each other to form a substituted or unsubstituted, saturated or unsaturated ring, or do not form a substituted or unsubstituted, saturated or unsaturated ring;

$R_{223}$, and $R_{210}$ to $R_{214}$, $R_{221}$ and $R_{222}$ which do not form a substituted or unsubstituted, saturated or unsaturated ring are independently a hydrogen atom or a substituent R;

p1 is 3, and three $R_{210}$'s may be the same as or different from each other; and the substituent R is as defined in the formula (21).

9. The organic electroluminescence device according to claim 8, wherein two or more of $Ar_{201}$ to $Ar_{203}$ are groups represented by the formula (21A).

10. The organic electroluminescence device according to claim 8, wherein two or more of $Ar_{201}$ to $Ar_{203}$ are groups represented by the formula (21A), and each of the two or more groups represented by the formula (21A) are different from each other.

11. The organic electroluminescence device according to claim 8, wherein $Ar_{201}$ is the group represented by the formula (21A); and $L_{201}$ is a single bond.

12. The organic electroluminescence device according to claim 8, wherein $Ar_{202}$ is a group represented by the formula (21A); and $L_{202}$ is a single bond.

13. The organic electroluminescence device according to claim 8, wherein $Ar_{203}$ is a group represented by the formula (21A); and $L_{203}$ is a single bond.

14. The organic electroluminescence device according to claim 8, wherein the group represented by the formula (21A) is a group represented by the following formula (22A):

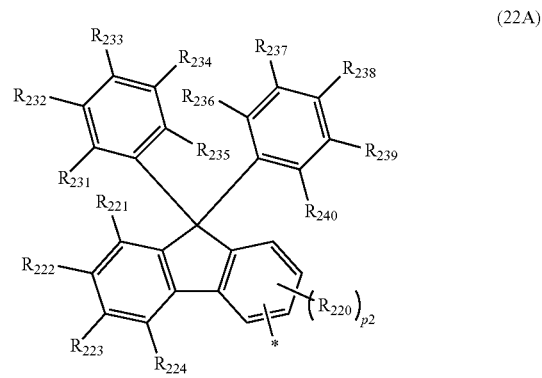

(22A)

wherein in the formula (22A), * represents a bonding site;

one or more sets of adjacent two or more of $R_{220}$ to $R_{224}$ and $R_{231}$ to $R_{240}$ form a substituted or unsubstituted, saturated or unsaturated ring by bonding with each other, or do not form a substituted or unsubstituted, saturated or unsaturated ring;

$R_{220}$ to $R_{224}$ and $R_{231}$ to $R_{240}$ which do not form a substituted or unsubstituted, saturated or unsaturated ring are independently a hydrogen atom or a substituent R;

p2 is 3, and three $R_{220}$'s may be the same as or different from each other; and the substituent R is as defined in the formula (21).

15. The organic electroluminescence device according to claim 2, wherein the second compound is a compound represented by the following formula (31):

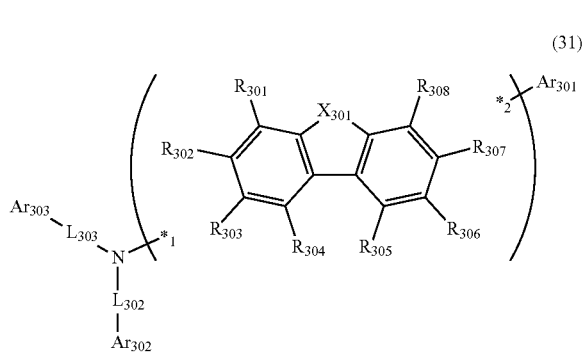

(31)

wherein in the formula (31), *1 and *2 represent bond sites;

$X_{301}$ is $CR_{311}R_{312}$, $NR_{313}$, O, or S;

two of $R_{301}$ to $R_{308}$ and $R_{311}$ to $R_{313}$ are respectively single bonds bonding with an N atom and $Ar_{301}$;

$R_{301}$ to $R_{308}$ and $R_{311}$ to $R_{313}$ which are not single bonds bonded with an N atom and $Ar_{301}$ are independently a hydrogen atom or a substituent R;

$L_{302}$ and $L_{303}$ are independently
a single bond,
a substituted or unsubstituted arylene group including 6 to 18 ring carbon atoms, or
a substituted or unsubstituted divalent heterocyclic group including 5 to 13 ring atoms;

$Ar_{301}$ to $Ar_{303}$ are independently
a substituted or unsubstituted aryl group including 6 to 30 ring carbon atoms,
a substituted or unsubstituted monovalent heterocyclic group including 5 to 30 ring atoms, or
a group represented by $-Si(R'_{901})(R'_{902})(R'_{903})$;
$R'_{901}$ to $R'_{903}$ are independently a substituted or unsubstituted aryl group including 6 to 30 ring carbon atoms;
when two or more of each of $R'_{901}$ to $R'_{903}$ are present, the two or more of each of $R'_{901}$ to $R'_{903}$ may be the same as or different from each other;
provided that at least one of $Ar_{301}$ to $Ar_{303}$ is
a substituted or unsubstituted fused aryl group including 10 to 30 ring carbon atoms, or
a substituted or unsubstituted monovalent fused heterocyclic group including 10 to 50 ring atoms;

the substituent R is selected from the group consisting of
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
$-Si(R_{901})(R_{902})(R_{903})$,
$-O-(R_{904})$,
$-S-(R_{905})$,
$-N(R_{906})(R_{907})$, wherein $R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms, when two or more of each of $R_{901}$ to $R_{907}$ are present, the two or more of each of $R_{901}$ to $R_{907}$ may be the same as or different from each other,
a halogen atom, a cyano group, a nitro group,
a substituted or unsubstituted aryl group including 6 to 50 ring carbon atoms, and
a substituted or unsubstituted monovalent heterocyclic group including 5 to 50 ring atoms; and
when two or more substituents R are present, the two or more substituents R may be the same as or different from each other.

16. The organic electroluminescence device according to claim 2, wherein the hole-transporting zone has a third layer between the emitting layer and the second layer,
the third layer comprises a third compound, and
the ionization potential of the second compound Ip2 and the ionization potential of the third compound Ip3 satisfy the following formula (B1):

$$Ip2-Ip3 \leq 0.6 \text{ (eV)} \tag{B1}$$

17. The organic electroluminescence device according to claim 16, wherein the ionization potential of the second compound Ip2 and the ionization potential of the third compound Ip3 satisfy the following formula (B2):

$$Ip2-Ip3 \leq 0.4 \text{ (eV)} \tag{B2}$$

18. The organic electroluminescence device according to claim 16, wherein the ionization potential of the second compound Ip2 and the ionization potential of the third compound Ip3 satisfy the following formula (B3):

$$Ip2-Ip3 \leq 0.2 \text{ (eV)} \tag{B3}$$

19. An electronic apparatus, equipped with the organic electroluminescence device according to claim 1.

20. The electronic apparatus according to claim 19, having two or more of the organic electroluminescence devices adjacent to each other on a surface thereof, and
the first layer and the second layer are common layers traversing between the organic electroluminescence devices.

21. The organic electroluminescence device according to claim 1, wherein the thickness of the first layer is 0.10 to 0.90 nm.

* * * * *